(12) United States Patent
Liu et al.

(10) Patent No.: US 12,416,985 B2
(45) Date of Patent: Sep. 16, 2025

(54) TERMINAL DEVICE AND DISPLAY SCREEN THEREOF, AND PREPARATION METHOD FOR DISPLAY SCREEN

(71) Applicant: NINGBO SUNNY OPOTECH CO., LTD., Zhejiang (CN)

(72) Inventors: Siyuan Liu, Zhejiang (CN); Liao Jing, Zhejiang (CN); Xudong Wu, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 511 days.

(21) Appl. No.: 17/599,268

(22) PCT Filed: Mar. 12, 2020

(86) PCT No.: PCT/CN2020/078952
§ 371 (c)(1),
(2) Date: Sep. 28, 2021

(87) PCT Pub. No.: WO2020/192436
PCT Pub. Date: Oct. 1, 2020

(65) Prior Publication Data
US 2022/0190294 A1    Jun. 16, 2022

(30) Foreign Application Priority Data

Mar. 28, 2019 (CN) .......................... 201910243137.2
Mar. 28, 2019 (CN) .......................... 201920412018.0

(51) Int. Cl.
*G06F 3/041* (2006.01)
*H01L 25/18* (2023.01)
(Continued)

(52) U.S. Cl.
CPC ......... *G06F 3/0412* (2013.01); *H10K 50/844* (2023.02); *H10K 59/65* (2023.02);
(Continued)

(58) Field of Classification Search
CPC ...... H10K 50/844; H10K 71/00; H10K 59/12; H10K 59/17; H10K 59/65; H10K 59/879;
(Continued)

(56) References Cited

U.S. PATENT DOCUMENTS 9,887,359 B2 * 2/2018 Ciou .................... H10K 71/621
10,872,222 B2 12/2020 Gao et al.
(Continued)

FOREIGN PATENT DOCUMENTS

CN        107346152    11/2017
CN        107515435    12/2017
(Continued)

OTHER PUBLICATIONS

English translation of CN 198893146 (Year: 2018).*
(Continued)

Primary Examiner — William B Partridge
Assistant Examiner — David Paul Sedorook
(74) Attorney, Agent, or Firm — Wenderoth, Lind & Ponack, L.L.P.

(57) ABSTRACT

The present application relates to a terminal device and a display screen thereof, and a preparation method for the display screen, wherein the display screen includes a cover plate layer, a touch layer, a polarizing layer, an encapsulation layer, a pixel layer and a circuit driving layer from top to bottom. In particular, the display screen further includes a microlens layer formed above the pixel layer, wherein the microlens layer corresponds to each gap between pixels in the pixel layer, and is used to converge light to each of the gaps before the light passes through the pixel layer via the gaps so as to increase the light transmittance of the display screen.

20 Claims, 31 Drawing Sheets

(51) Int. Cl.
  *H04M 1/02*   (2006.01)
  *H10K 50/844*  (2023.01)
  *H10K 59/12*   (2023.01)
  *H10K 59/17*   (2023.01)
  *H10K 59/65*   (2023.01)
  *H10K 59/80*   (2023.01)
  *H10K 71/00*   (2023.01)

(52) U.S. Cl.
  CPC ....... *H10K 59/879* (2023.02); *H10K 59/8791* (2023.02); *H10K 71/00* (2023.02); *H01L 25/18* (2013.01); *H04M 1/0266* (2013.01); *H10K 59/12* (2023.02); *H10K 59/17* (2023.02); *H10K 59/873* (2023.02)

(58) Field of Classification Search
  CPC .......... H10K 59/8791; H10K 59/873; G06F 3/0412; G06F 2203/04103; H01L 25/18; H04M 1/0266
  See application file for complete search history.

(56) References Cited

U.S. PATENT DOCUMENTS

| | | | | |
|---|---|---|---|---|
| 2010/0301367 A1* | 12/2010 | Nakamura | ............ | H01L 33/507 |
| | | | | 257/E33.059 |
| 2014/0085865 A1 | 3/2014 | Yun et al. | | |
| 2015/0380466 A1 | 12/2015 | Koo et al. | | |
| 2017/0251137 A1 | 8/2017 | Evans, V et al. | | |
| 2018/0097204 A1* | 4/2018 | Ivan | ................... | H10K 59/8792 |
| 2019/0006626 A1 | 1/2019 | Kim et al. | | |
| 2019/0285950 A1* | 9/2019 | Liu | ..................... | H05K 3/3431 |
| 2019/0335553 A1* | 10/2019 | Ahmed | ................... | G09G 3/32 |

FOREIGN PATENT DOCUMENTS

| | | | | |
|---|---|---|---|---|
| CN | 108227978 | | 6/2018 | |
| CN | 108650443 | | 10/2018 | |
| CN | 108682295 | | 10/2018 | |
| CN | 108732801 | | 11/2018 | |
| CN | 108803146 | | 11/2018 | |
| CN | 108803146 A | * | 11/2018 | ....... G02F 1/133528 |
| CN | 209928406 | | 1/2020 | |
| EP | 3 016 166 | | 5/2016 | |
| EP | 3 333 682 | | 6/2022 | |
| JP | 2014-063163 | | 4/2014 | |
| KR | 10-2016-0001260 | | 1/2016 | |
| KR | 10-2019-0003216 | | 1/2019 | |
| WO | 2007/138543 | | 12/2007 | |

OTHER PUBLICATIONS

International Search Report issued Jun. 11, 2020, in International (PCT) Application No. PCT/CN2020/078952, with English translation.

Extended European Search Report issued May 16, 2022 in European Patent Application No. 20776741.9.

Office Action issued Mar. 28, 2022 in Indian Patent Application No. 202117048220.

Abrahamson, Joel T. et al., "Optically Clear Adhesives for OLED", Selection of our books indexed in the Book Citation Index in Web of Science™ Core Collection (BKCI), Aug. 23, 2019, pp. 1-27, XP055918160.

* cited by examiner

TERMINAL DEVICE AND DISPLAY SCREEN THEREOF, AND PREPARATION METHOD FOR DISPLAY SCREEN

FIELD OF THE INVENTION

The present application relates to a terminal device, and in particular, to a terminal device having a full screen and a display screen thereof, and a preparation method of the display screen.

BACKGROUND OF THE INVENTION

In recent years, full-screen terminal devices (for example, full-screen mobile phones) have gradually become popular among users. The existing full-screen terminal device refers to an ultra-large-screen terminal device of which a screen exceeds a preset percentage (for example, 90%) of a front face of the device, and does not truly achieve a 100% screen-to-body ratio.

At present, in the technical solutions of increasing the screen-to-body ratio, a camera module on the same side of the terminal device together with the screen is the biggest obstacle. However, a camera function is often an indispensable functional requirement for the terminal device. Therefore, it is necessary to optimize a structural configuration of the screen and the camera module so as to increase the screen-to-body ratio of the terminal device.

SUMMARY OF THE INVENTION

The present application is mainly directed to provide a terminal device and a display screen thereof, and a preparation method of the display screen, wherein the display screen has relatively high light transmittance, so that on one hand, a camera module provided below the display screen can collect sufficient amount of imaging light, and on the other hand, a screen-to-body ratio of the terminal device can be increased.

The present application is further directed to provide a terminal device and a display screen thereof, and a preparation method of the display screen, wherein a camera module is configured as an under-screen camera module, which, together with the display screen, is mounted at different height positions of the terminal device, and thus, the camera module is free from being an obstacle to increasing a screen-to-body ratio.

The present application is further directed to provide a terminal device and a display screen thereof, and a preparation method of the display screen, wherein the display screen includes a microlens layer provided above a pixel layer, so that light entering the display screen is converged to gaps between various pixels in the pixel layer through the microlens layer, and by this way, the light transmittance of the display screen is improved.

The present application is further directed to provide a terminal device and a display screen thereof, and a preparation method of the display screen, wherein the display screen of the present application does not require a sharp adjustment to the existing structure of the existing display screen, and only one microlens layer corresponding to gaps between various pixels of a pixel layer needs to be additionally provided above the pixel layer of the display screen.

The present application is further directed to provide a terminal device and a display screen thereof, and a preparation method of the display screen, wherein a refractive index of a material for forming a microlens layer is higher than that of a material for forming an encapsulation layer, thereby improving the light transmittance of the display screen.

Other advantages and features of the present application will become obvious through the following description, and can be implemented by means and combinations particularly pointed out in the claims.

To realize at least one of the above objectives or advantages, the present application provides a display screen, including: a cover plate layer, a touch layer, a polarizing layer, an encapsulation layer, a pixel layer, and a circuit driving layer from top to bottom, wherein the circuit driving layer is formed on a bottom side of the pixel layer, and is electrically connected to the pixel layer to drive the pixel layer to operate; the encapsulation layer is formed on a top side of the pixel layer to encapsulate the pixel layer; and the pixel layer includes pixels distributed in an array, gaps are reserved between various pixels to allow light passing through the cover plate layer, the touch layer, the polarizing layer and the encapsulation layer in sequence to pass through the pixel layer via the gaps; wherein, the display screen further includes a microlens layer provided above the pixel layer, and the microlens layer corresponds to each gap between the pixels, and is used to converge the light to each gap before the light passes through the pixel layer via the gaps so as to increase the light transmittance of the display screen.

In an embodiment of the present application, the microlens layer includes microlens units distributed in an array, wherein each microlens unit respectively corresponds to each gap.

In an embodiment of the present application, the microlens layer is integrally formed in each gap between the pixels in the pixel layer, and the encapsulation layer is integrally formed on the microlens layer and the pixel layer to encapsulate the pixel layer and the microlens layer.

In an embodiment of the present application, the microlens layer is integrally formed on a top surface of the encapsulation layer.

In an embodiment of the present application, the microlens layer is integrally formed on the top surface of the encapsulation layer in a recessed manner.

In an embodiment of the present application, a height size of the microlens unit is smaller than or equal to that of the encapsulation layer.

In an embodiment of the present application, a horizontal size of the microlens unit is larger than a size of the gap.

In an embodiment of the present application, a longitudinal size of the microlens unit is larger than or equal to a size of a gap between adjacent pixels.

In an embodiment of the present application, the material for forming the encapsulation layer is a light-transmissive rigid material.

In an embodiment of the present application, the material for forming the encapsulation layer is a light-transmissive flexible material.

In an embodiment of the present application, the display screen further includes a back plate layer having an opening hole, and the opening hole corresponds to the gaps between adjacent pixels in the pixel layer.

According to another aspect of the present application, the present application further provides a preparation method of a display screen, including:

forming a microlens layer on a pixel layer of the display screen, wherein the microlens layer corresponds to gaps between various pixels in the pixel layer, and a circuit driving layer is provided on a bottom side of the pixel layer, and the circuit driving layer is electrically connected to the pixel layer to drive the pixel layer to operate; and forming an encapsulation layer on the microlens layer and the pixel layer to encapsulate the microlens layer and the pixel layer by the encapsulation layer, and the encapsulation layer is further provided thereon with a polarizing layer, a touch layer and a cover plate layer in sequence.

In an embodiment of the present application, the microlens layer is integrally formed in the gaps between various pixels in the pixel layer.

In an embodiment of the present application, the encapsulation layer is integrally formed on the microlens layer and the pixel layer by a deposition process.

In an embodiment of the present application, a refractive index of a material for forming the microlens layer is higher than that of a material for forming the encapsulation layer.

According to yet another aspect of the present application, the present application provides a preparation method of a display screen, including:

integrally forming a microlens layer on an encapsulation layer;

providing the encapsulation layer above a pixel layer, wherein the microlens layer corresponds to gaps between various pixels in the pixel layer, and a circuit driving layer is provided on a bottom side of the pixel layer, and the circuit driving layer is electrically connected to the pixel layer to drive the pixel layer to operate; and providing a polarizing layer, a touch layer and a cover plate layer in sequence on the encapsulation layer.

In an embodiment of the present application, the microlens layer is integrally formed on a top surface of the encapsulation layer.

In an embodiment of the present application, the microlens layer is integrally formed on the top surface of the encapsulation layer in a recessed manner.

According to another aspect of the present application, the present application further provides a terminal device, including: a terminal main body, a camera module, and the above display screen, wherein the display screen is mounted on the terminal main body, and the camera module is provided on a bottom side of the display screen, so that the camera module can receive imaging light that passes through the cover plate layer, the touch layer, the polarizing layer, the encapsulation layer, the microlens layer, the gaps of the pixel layer, and the circuit driving layer of the display screen in sequence.

In an embodiment of the present application, the camera module is mounted in the opening hole of the back plate layer located at the bottom of the display screen.

The further objectives and advantages of the present application will become more fully apparent from the understanding of the following description and the accompanying drawings.

These and other objectives, characteristics, and advantages of the present application will become more fully apparent from the following detailed description, the accompanying drawings and the claims.

DETAILED DESCRIPTION OF THE INVENTION

Figure 1:
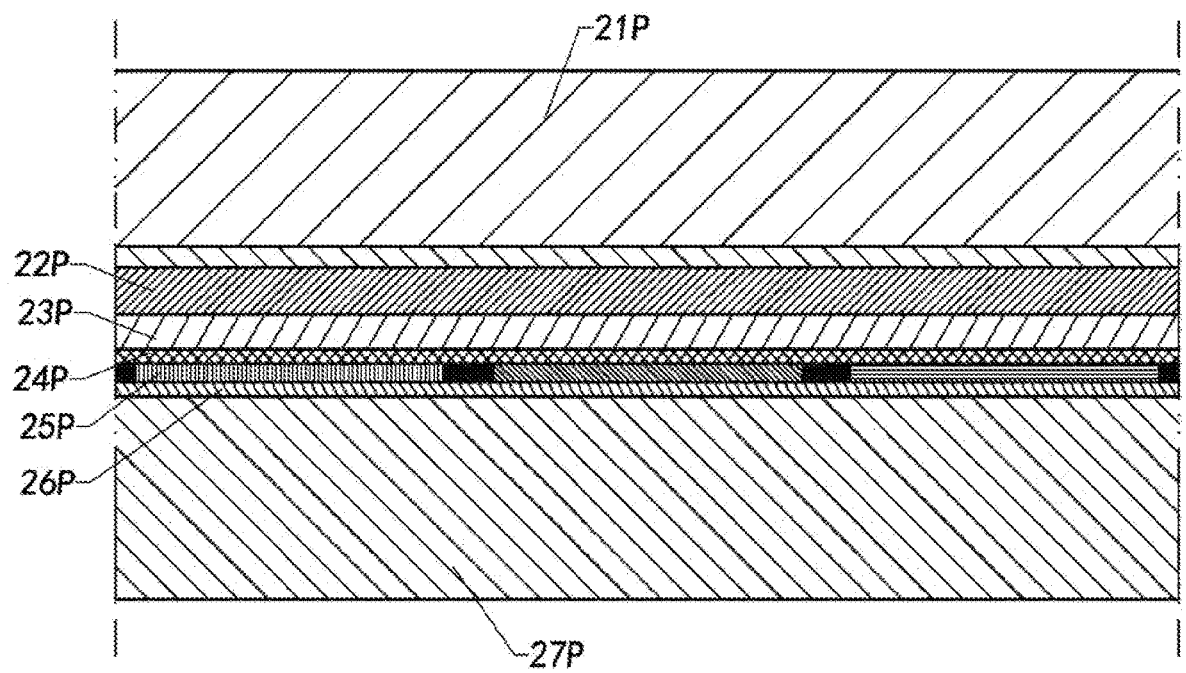
FIG. 1 is a schematic structural diagram of a display screen used in an existing terminal device.

The following description is used to disclose the present application to enable those skilled in the art to implement the present application. The preferred embodiments in the following description are by way of examples only, and other obvious variations will occur to those skilled in the art. The basic principles of the present application as defined in the following description can be applied to other embodiments, variations, improvements, equivalents, and other technical solutions without departing from the spirit and scope of the present application.

It should be understood by those skilled in the art that in the disclosure of the present application, the orientation or positional relationship indicated by terms "longitudinal", "transverse", "upper", "lower", "front", "back", "left", "right", "vertical", "horizontal", "top", "bottom", "inside", "outside", etc. is based on the orientation or positional relationship shown in the drawings, which is merely for the convenience of describing the present application and for the simplification of the description, and not to indicate or imply that the apparatus or element referred to must have a specific orientation, or be constructed and operated in a specific orientation. Therefore, the above terms shall not be construed as a limitation of the present application.

It can be understood that the term "a" is understood to mean "at least one" or "one or more", that is, in an embodiment, the number of an element can be one, and in another embodiment, the number of the elements can be plural, and the term "a" cannot be construed as limiting the quantity.

Although ordinal numbers such as "first" and "second" will be used to describe various components, those components are not limited herein. These terms are only used to distinguish a component from another component. For example, a first component may be referred to as a second component, and similarly, the second component may also be referred to as the first component without departing from the teaching of the inventive concept. The term "and/or" as used herein includes any and all combinations of one or more of the associated items that are listed.

Terms used herein are merely for the purpose of describing various embodiments, rather than limitation. As used herein, the singular form is intended to also include the plural form, unless the context clearly indicates an exception. In addition, it will be understood that the terms "include" and/or "have" when used in the specification, specify the presence of the described features, numbers, steps, operations, components, elements, or combinations thereof, and do not exclude the presence or addition of one or more other features, number, steps, operations, components, elements, or combinations thereof.

The terms used herein, including technical and scientific terms, have the same meanings as those commonly understood by those skilled in the art, as long as the terms are not defined differently. It should be understood that terms defined in commonly used dictionaries have the same meanings as the meanings of the terms in the prior art.

The present invention will be further described below in detail with reference to the drawings and specific embodiments.

Application Overview

As described above, in the technical solutions of increasing a screen-to-body ratio, a camera module provided on the same side of a terminal device together with a screen is the biggest obstacle. To truly realize a full screen and reduce the impact of the camera module on the screen-to-body ratio, an existing technical solution is to use a retractable camera module to hide and use the camera module. Specifically, when shooting is required, the camera module is extended out of a housing of the terminal device for shooting; and after the shooting is completed, the camera module is retracted into the housing of the terminal device.

However, the technical solution has many drawbacks in practical applications. Firstly, the camera module is vulnerable to damage caused by external impact in the process of continuously retracting into and/or extending out of the housing of the terminal device. Secondly, once damaged, the camera module and a retractable mechanism are difficult to replace.

In recent years, a technical idea of an under-screen camera module has been proposed, that is, the camera module is provided below the display screen. However, since the camera module is provided below the display screen, it cannot collect sufficient amount of imaging light from the outside, which makes imaging function of the camera module difficult to achieve.

In detail, FIG. 1 is a schematic structural diagram of a display screen used in an existing terminal device. As shown in FIG. 1, the display screen is an OLED display screen, which includes a cover plate layer 21P, a touch layer 22P, a polarizing layer 23P, an encapsulation layer 24P, a pixel layer 25P, a circuit driving layer 26P, and a back plate layer 27P from top to bottom. Herein, the cover plate layer 21P is bound to a top side of the touch layer 22P by an adhesive; the polarizing layer 23P is provided on a bottom side of the touch layer 22P; the encapsulation layer 24P is provided on a bottom side of the polarizing layer 23P to encapsulate the pixel layer 25P, so that the pixel layer 25P is in a sealed environment, thereby protecting an organic material in the pixel layer 25P from being polluted by the outside or volatilizing; the circuit driving layer 26P is provided on a bottom side of the pixel layer 25P to drive the pixel layer 25P to operate, so that the display screen can display images; and moreover, the back plate layer 27P is provided on a bottom side of the circuit driving layer 26P to enhance the structural strength of the display screen.

In other words, when the camera module is provided below the display screen, imaging light from the outside needs to pass through the cover plate layer 21P, the touch layer 22P, the polarizing layer 23P, the encapsulation layer 24P, the pixel layer 25P, the circuit driving layer 26P, and the back plate layer 27P of the display screen in sequence, and thus can be sensed by the camera module provided below the display screen. Those skilled in the art should know that the light transmittance of the existing display screen is usually low, and the main reason is that the pixel layer 25P has a relatively high light resistance rate, and most of imaging light passes through the pixel layer 25P via gaps between pixels.

Theoretically, in order to improve the light transmittance of the existing display screen, a size proportion of the gaps between various pixels in the pixel layer can be increased, for example, a size of a unit pixel can be reduced or a size of the gap between the pixels can be increased. However, reducing the size of a unit pixel will reduce a luminous intensity of the pixel and thus lead to shortening of the service life of the pixel, and enlarging the gaps between the pixels will directly reduce the screen resolution. In other words, the technical solution of increasing the size proportion of the gaps between the pixels will cause damage to the performance of the display screen, which is not advantageous for the development of the display technology.

In view of the above technical problems, the basic idea of the present application is to provide a microlens layer on the pixel layer of the display screen so as to converge the imaging light that passes through the cover layer, the touch layer, the polarizing layer and the encapsulation layer in sequence to the gaps between various pixels in the pixel layer by the microlens layer. By this way, the light transmittance of the display screen is increase, so that the camera module provided below the display screen can collect sufficient amount of imaging light for imaging.

In view of this, the present application proposes a terminal device, including: a terminal main body, a camera module, and a display screen, wherein the display screen is mounted on the terminal main body, and the camera module is provided on a bottom side of the display screen, and the display screen includes a cover plate layer, a touch layer, a polarizing layer, an encapsulation layer, a pixel layer, and a circuit driving layer from top to bottom. Wherein, the circuit driving layer is formed on a bottom side of the pixel layer, and is electrically connected to the pixel layer to drive the pixel layer to operate; the encapsulation layer is formed on a top side of the pixel layer to encapsulate the pixel layer; and the pixel layer includes pixels distributed in an array, gaps are reserved between various pixels to allow light passing through the cover plate layer, the touch layer, the polarizing layer and the encapsulation layer in sequence to pass through the pixel layer via the gaps. The display screen further includes a microlens layer, wherein the microlens layer is formed inside the encapsulation layer, and the microlens layer corresponds to the gaps between various pixels, and is used to converge light to the gaps before the light passes through the pixel layer via the gaps, so that larger amount of light can pass through the pixel layer via the gaps between various pixels in the pixel layer, and pass through the circuit driving layer to reach the camera module. In other words, by providing the microlens layer in the display screen, the light transmittance of the display screen is improved, so that when the camera module is provided below the display screen, the camera module can still collect sufficient amount of imaging light for imaging. That is, by the optimized display screen, the technical solution of the under-screen camera module can be implemented so as to truly realize the full-screen design of a terminal device.

After introducing the basic principles of the present application, various non-limiting embodiments of the present application will be described in detail below with reference to the accompanying drawings.

Exemplary Display Screen

Figure 2:
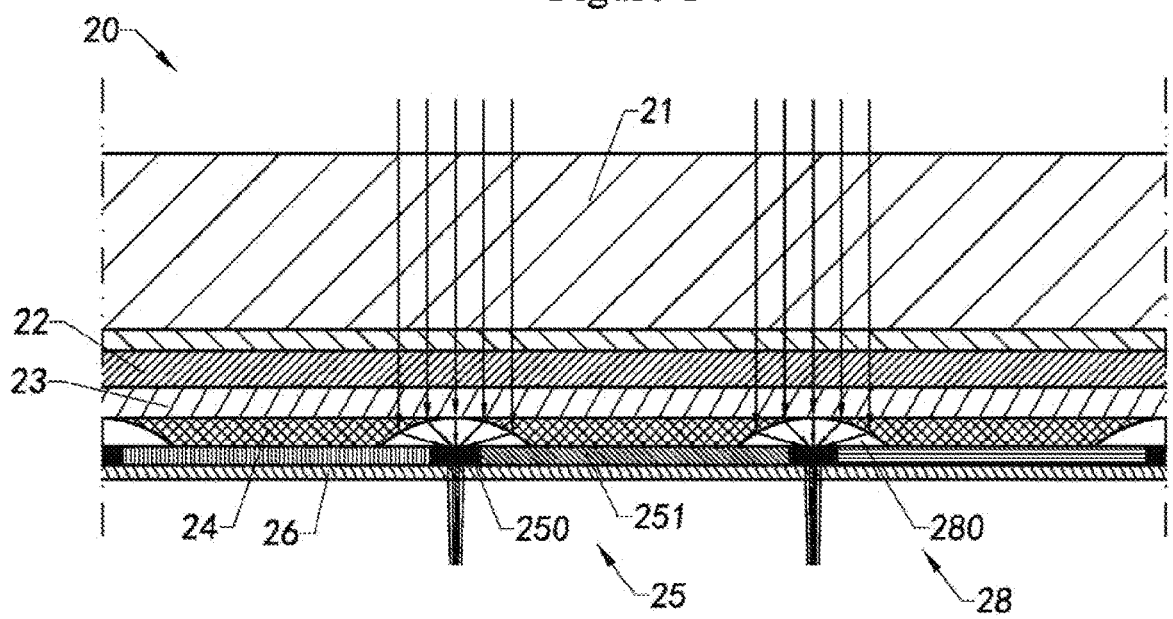
FIG. 2 is a schematic structural diagram of a display screen according to an embodiment of the present application.

FIG. 2 is a schematic structural diagram of a display screen according to an embodiment of the present application. As shown in FIG. 2, the display screen 20 used for realizing a full-screen configuration of a terminal device (for example, a smart phone) according to the embodiment of the present application includes a cover plate layer 21, a touch layer 22, a polarizing layer 23, an encapsulation layer 24, a pixel layer 25, and a circuit driving layer 26 which are provided from top to bottom. Wherein, the circuit driving layer 26 is formed on a bottom side of the pixel layer 25, and is electrically connected to the pixel layer 25 to drive the pixel layer 25 to operate; the encapsulation layer 24 is formed on a top side of the pixel layer 25 to encapsulate the pixel layer 25; and the pixel layer 25 includes pixels 251 distributed in an array, gaps 250 are reserved between various pixels 251 to allow light passing through the cover plate layer 21, the touch layer 22, the polarizing layer 23 and the encapsulation layer 24 in sequence to pass through the pixel layer 25 via the gaps 250.

Particularly, the display screen 20 further includes a microlens layer 28 provided above the pixel layer 25, wherein the microlens layer 28 corresponds to each gap 250 between the pixels 251 in the pixel layer 25, and is used to converge light to each gap 250 before the light passes through the pixel layer 25 via the gaps 250. By this way, the overall light transmittance of the display screen 20 can be efficiently increased.

As shown in FIG. 2, in the embodiment of the present application, the display screen 20 is implemented as an OLED (Organic Light-emitting Diode) display screen 20. Those skilled in the art should know that the OLED display screen 20 has the advantages of self-luminescence, wide viewing angle, high contrast, low power consumption, high response speed, full color, etc. However, the light transmittance of the existing OLED display screen 20 is generally not high.

A "layer-by-layer" analysis of the existing OLED display screen 20 will be made below to explain the reasons for the low light transmittance of the existing OLED display screen. As previously described, the existing OLED display screen 20 includes a cover plate layer 21P, a touch layer 22P, a polarizing layer 23P, an encapsulation layer 24P, a pixel layer 25P, a circuit driving layer 26P, and a back plate layer 27P from top to bottom.

Firstly, the cover plate layer 21P is usually implemented as a glass layer, and it is the topmost layer of the display screen, and is used to protect layer structures located below the cover plate layer 21P. It should be understood that the glass layer is made of a glass material which is a material with high light transmittance. That is, the cover plate layer 21P does not adversely affect the light transmittance of the display screen.

A layer structure located below the cover plate layer 21P is the touch layer 22P, and usually they are bound together by an adhesive. Those skilled in the art should know that the touch layer 22P is an indispensable configuration for realizing a touch function of the display screen. In other words, the influence of the touch layer 22P on the light transmittance of the display screen is almost inevitable.

A layer structure located below the touch layer 22P is the polarizing layer 23P, which is usually implemented as a circular polarizer or the like. It should be understood that the polarizing layer 23P such as a circular polarizer is an optical element, and has relatively high light transmittance. Therefore, the polarizing layer 23P does not greatly affect the light transmittance of the display screen.

A layer structure located below the polarizing layer 23P is the encapsulation layer 24P, which is used to encapsulate the pixel layer 25P located below the encapsulation layer 24P, so that the pixel layer 25P is in a sealed environment, thereby protecting an organic material in the pixel layer 25P from being polluted by the outside or volatilizing. Specifically, the encapsulation layer 24P has two types, wherein when the display screen is a rigid screen, the encapsulation layer 24P is made of a light-transmissive rigid material such as glass and plastic; and when the display screen is a flexible screen, the encapsulation layer 24P is made of a light-transmissive flexible material such as a PI film (Polyimide Film). It should be observed that regardless of a rigid screen or a flexible screen, the encapsulation layer 24P is made of a light-transmissive material, and thus it does not greatly affect the overall light transmittance of the display screen.

A layer structure covered by the encapsulation layer 24P and located below the encapsulation layer 24P is the pixel layer 25P. For the OLED display screen, pixel units in the pixel layer 25 are implemented as OLEDs (Organic Light-emitting Diodes). Those skilled in the art should know that the organic light-emitting diode has a high light resistance rate, that is, light passing through the cover plate layer 21P, the touch layer 22P, the polarizing layer 23P, and the encapsulation layer 24P and reaching the pixel layer 25 is difficult to pass through the organic light-emitting diode to reach the other side of the pixel layer 25. Accordingly, this part of light only can pass through the pixel layer 25P by means of gaps between various pixels. That is, the pixel 25P has a light transmitting area and a non-light transmitting area, wherein the light transmitting area is defined by the gaps between the pixels, and the non-light transmitting area is defined by the pixels. However, a ratio of the gaps between the pixels to the total area of the pixel layer 25P is relatively small, and therefore, a large amount of light is blocked by the pixel layer 25P, resulting in relatively low overall light transmittance of the display screen.

A layer structure located below the pixel layer 25P is the circuit driving layer 26P, which is electrically connected to the pixel layer 25P to drive the pixel layer 25P to operate. The circuit driving layer 26P includes a driving circuit and a packaging layer for encapsulating the driving circuit, wherein the packaging layer is made of a material with relatively high light transmittance, and thus it does not greatly affect the overall light transmittance of the display screen. However, improper arrangement of the driving circuit will affect the transmission of light. Specifically, if electronic elements of the driving circuit correspond to the gaps between the pixels, this part of the driving circuit will adversely affect light passing through the display screen; and if the elements of the driving circuit are located below the pixels, this part of the driving circuit will not affect the transmission of light.

A layer structure located below the circuit driving layer 26P is the back plate layer, which is mainly used to enhance the overall structural strength of the display screen. When the display screen is an OLED display screen, the light transmittance of the back plate layer is not low, and when the display screen is an LCD display screen, the back plate layer is used to provide a light source, and the light transmittance is relatively low.

In conclusion, the reasons for the low overall light transmittance of the existing OLED display screens are that: first, the proportion of the light transmitting area of the pixel layer 25P is relatively low, that is, the proportion of the gaps between the pixels is relatively low, so that only small amount of light can pass through the pixel layer 25P via the gaps between the pixels; second, a part of the driving circuit (when the elements of the driving circuit correspond to the gaps between the pixels) in the circuit driving layer 26P will affect the light transmittance of the display screen.

Accordingly, in the embodiment of the present application, the display screen 20 is provided with a microlens layer 28 which is provided above the pixel layer 25 and corresponds to each gap 250 between the pixels 251 in the pixel layer 25. The microlens layer 28 has a light converging function and is used to converge light to each gap 250 between the pixels 251, so that larger amount of light can effectively pass through the pixel layer 25 via the gaps 250 between the pixels 251 without changing the size proportion of the gaps 250 between the pixels.

Further, the back plate layer is an unnecessary functional layer of the display screen 20, and therefore, in the embodiment of the present application, the back plate layer 27P can be directly omitted. Or, an opening hole 270 is provided at a position where the back plate layer 27 needs to transmit light.

Through the above optimization, the overall light transmittance of the display screen 20 can be effectively increased, so that light from the outside can pass through the cover plate layer 21, the touch layer 22, the polarizing layer 23, the encapsulation layer 24, the microlens layer 28 and the circuit driving layer 26 in sequence from one side (referred to as a front face) of the display screen 20 to reach the other side (referred to as a rear face) of the display screen 20.

Figure 3A:
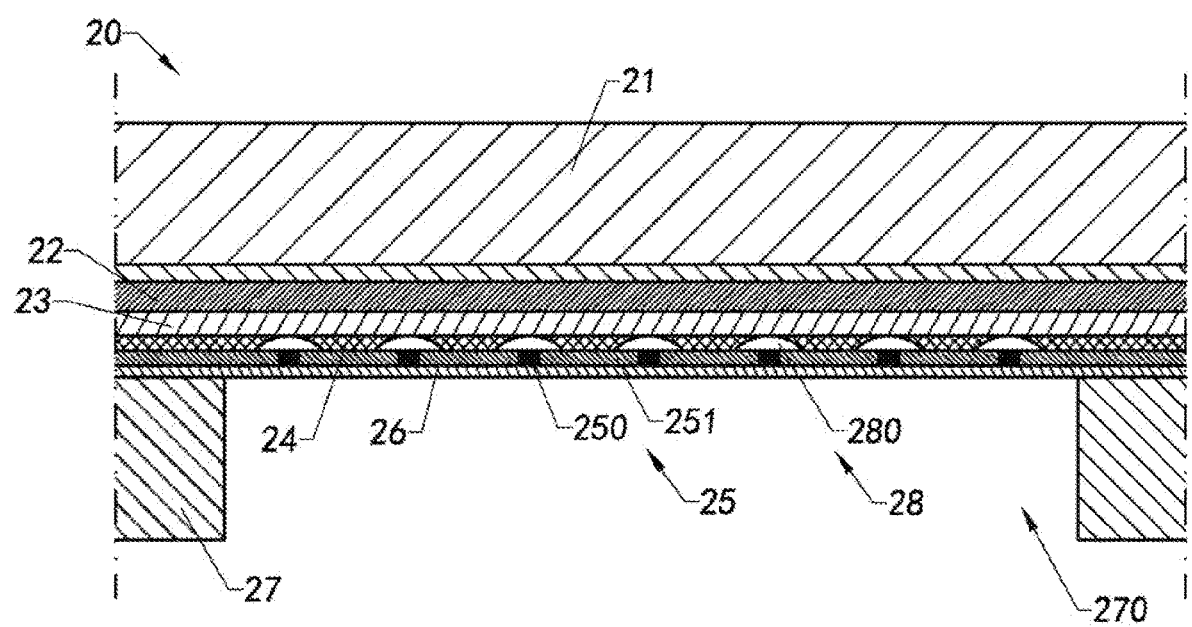
FIG. 3A is a variant implementation mode of the display screen according to an embodiment of the present application.

FIG. 3A is a variant implementation mode of the display screen 20 according to an embodiment of the present application. As shown in FIG. 3, in the variant implementation mode, the display screen further includes a back plate layer 27 supporting a bottom side of the circuit driving layer 26 so as to enhance the structural strength of the display screen 20 through the back plate layer 27. Particularly, at least one opening hole 270 is provided at a position where the display screen 20 needs to transmit light of the back plate layer 27, wherein the opening hole 270 corresponds to the gaps 250 between the pixels 251 in the pixel layer 25 to allow light passing through the pixel layer 25 via the gaps 250 of the pixel layer 25 to reach the rear face of the display screen via the opening hole 270.

It is worthwhile to note that in the embodiment of the present application, optionally, the opening hole 270 has a size corresponding to a camera module mounted below the display screen 20, and thus, the opening hole 270 itself can serve as a reference hole for mounting and positioning the camera module, which is advantageous for installation and calibration of the camera module. Moreover, when the camera module is mounted in the opening hole 270, light passing through the display screen 20 via the opening hole 270 can directly enter the camera module to perform an imaging reaction.

To further improve the light transmittance of the display screen 20, in the embodiment of the present application, the circuit driving layer 26 can also be optimized. Specifically, the arrangement of the driving circuit in the circuit driving layer 26 is adjusted to: prevent the elements in the driving circuit from being arranged below the gaps 250 between the pixels, so as to effectively avoid adverse effects of the driving circuit on the overall light transmittance of the display screen 20.

It should be understood that in the embodiment of the present application, the configuration of the microlens layer 28 is a core factor affecting the light transmittance of the display screen 20. Specifically, in the embodiment of the present application, the microlens layer 28 includes a series of microlens units 280, preferably, the microlens units 280 are distributed in an array, and each microlens unit 280 corresponds to each gap 250 between the pixels 251. Each microlens unit 280 has a light converging effect, that is, light radiated to each microlens unit 280 is refracted at each microlens unit 280 so as to be converged to the corresponding gap 250 between the pixels; and therefore, compared with that of the existing display screen 20, the amount of light passing through each gap 250 is increased, that is, the overall light transmittance of the display screen 20 is increased.

Figure 4A:
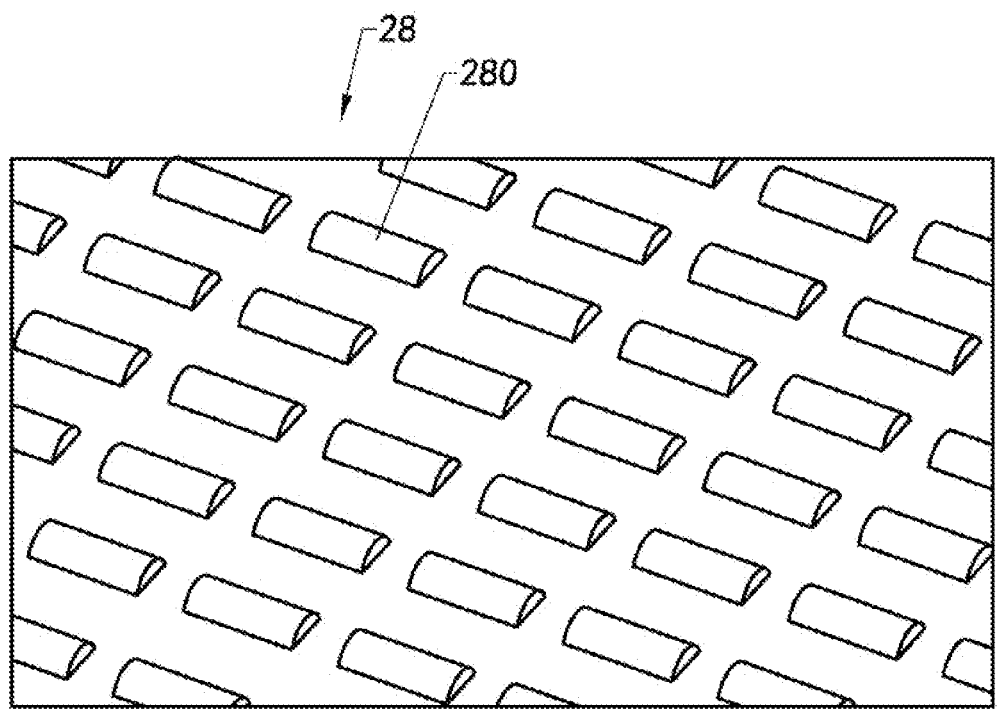
FIG. 4A is a schematic diagram of a microlens array in the display screen according to an embodiment of the present application.
Figure 4B:
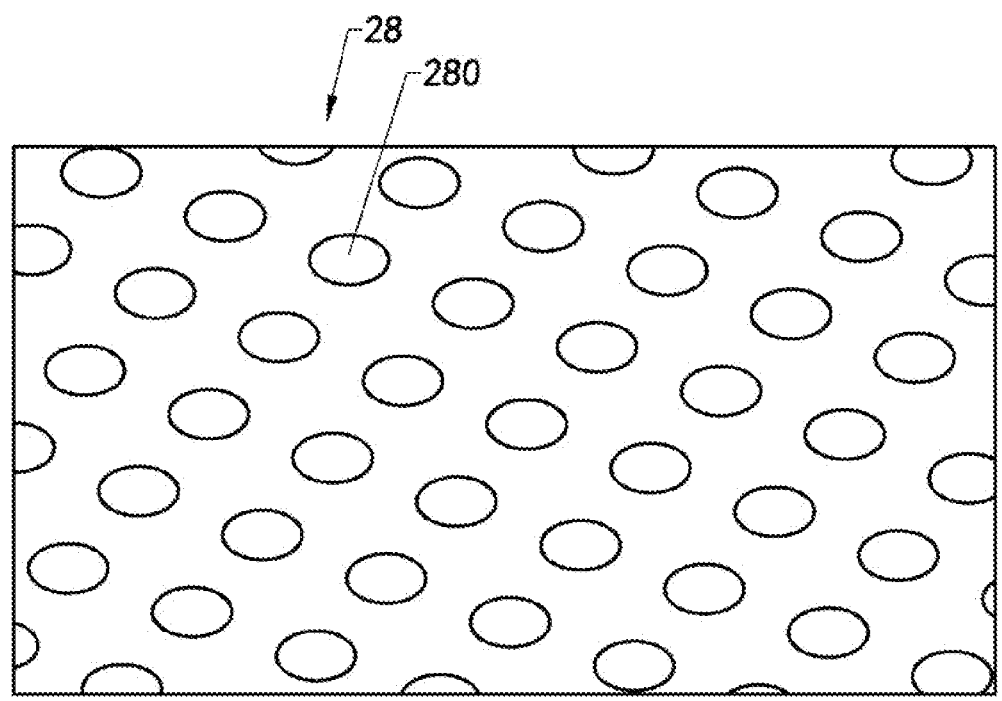
FIG. 4B is another schematic diagram of the microlens array in the display screen according to an embodiment of the present application.

More specifically, in the embodiment of the present application, each microlens unit 280 is implemented as a convex lens having a light converging effect, wherein a convex face of the convex lens faces a front surface of the display screen 20, a bottom surface of the convex lens faces each gap 250, so that when light from the outside reaches the convex lens, the light from the outside is refracted at the convex face of the convex lens and converged to the gaps 250 between the pixels 251, and thus, larger amount of light from the outside can pass through the pixel layer 25 via the gaps 250 between the pixels 251. In a specific implementation, the convex lens can be implemented as a spherical convex lens, a non-spherical convex lens or a cylindrical lens (wherein a convex face of the cylindrical lens can be implemented as a spherical face or a non-spherical face), as shown in FIG. 4A and FIG. 4B, which is not limited in the present application.

Preferably, the microlens layer 28 of the present invention is formed on the encapsulation layer 24, that is, the encapsulation layer 24 is used to encapsulate the pixel layer 25, and itself has a light transmitting function. In the prior art, the encapsulation layer 24 is basically implemented as a glass cover plate or light transmitting encapsulation film. However, in the present invention, referring to FIG. 5, the encapsulation layer 24 is provided with a light transmitting area and a light converging area, wherein the light transmitting area is used to allow light emitted by the pixel layer 25 to be transmitted and displayed on the screen for imaging; and the light converging area is implemented as the microlens layer 28 for converging light. Further, in the process of preparing the encapsulation layer 24, the microlens layer 28 is formed in a light transmitting area, for example, when the encapsulation layer 24 is formed by a process such as an injection molding process, a mold corresponding to the light transmitting area is designed to be in a shape of the microlens layer 28 so as to obtain the microlens layer 28 of the encapsulation layer 24.

More specifically, a preset position of the encapsulation layer 24 is set to protrude downward and upward, respectively, to form at least one microlens unit 280. The encapsulation layer 24 has an upper surface and a lower surface, wherein at least part of the upper surface protrudes from the other part of the upper surface, at least part of the lower surface protrudes from the other part of the lower surface, the protruding part of the upper surface corresponds to the protruding part of the lower surface to form the light converging area, so as to form at least one microlens unit 280, thereby integrally forming the microlens layer 28 on the encapsulation layer 24.

Further, in the embodiment of the present application, the microlens layer 28 can be integrally formed in each gap between the pixels 251 in the pixel layer 25, so that each microlens unit 280 of the microlens layer 28 directly corresponds to each gap 250 between the pixels 251 to converge larger amount of light to each gap 250 between the pixels 251, thereby increasing the light transmittance of the display screen 20.

For example, the microlens layer 28 of the present application can be prepared by, for example, a preparation process of forming a microlens layer 28 on a photosensitive chip. Certainly, the microlens layer 28 can also be formed on the pixel layer 25 by other process, which is not limited in the present application. Accordingly, bottom surfaces of various microlens units 280 of the formed microlens layer 28 are attached to the gaps 250 between various pixels 251 to cover the gaps 250, and moreover, convex faces of various microlens units 280 protrude upward relative to the gaps 250 so as to converge light from the outside to the gaps 250. Accordingly, the encapsulation layer 24 is integrally formed on the microlens layer 28 and the pixel layer 25 to encapsulate the pixel layer 25 and the microlens layer 28. For example, the encapsulation layer 24 can be formed above the microlens layer 28 and the pixel layer 25 by a deposition process. The display screen described in the present embodiment can also be prepared by an etching process.

Figure 3B:
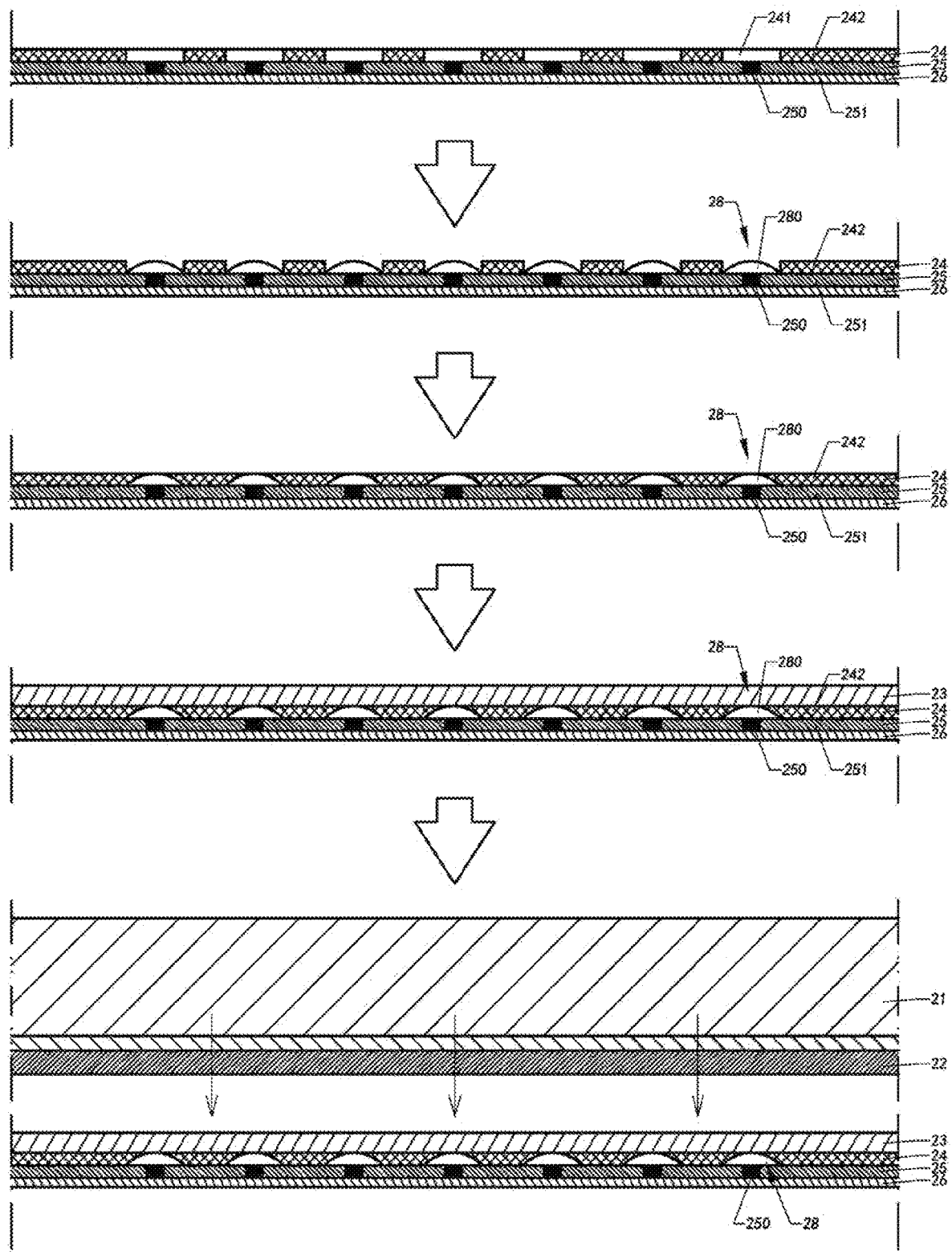
FIG. 3B is a schematic diagram of a preparation process of the display screen according to an embodiment of the present application.

Referring to FIG. 3B, a preparation method of the display screen 20 in FIG. 3A is shown. An encapsulation layer 24, a pixel layer 25, and a circuit driving layer 26 are first obtained, wherein the encapsulation layer 24 is supported on the pixel layer 25, and the pixel layer 25 is supported on the circuit driving layer. The encapsulation layer 24 includes a first encapsulation layer part 241 and a second encapsulation layer part 242, wherein the first encapsulation layer part 241 is made of a material with a relatively high refractive index, and the second encapsulation layer part 242 is made of a material with a relatively low refractive index. The first encapsulation layer part 241 of the encapsulation layer 24 corresponds to the gaps between adjacent pixels 251 of the pixel layer 25, so that light can pass through the gaps between adjacent pixels 251 of the pixel layer 25 after passing through the first encapsulation layer part 241 of the encapsulation layer 24.

Further, the microlens layer 28 is integrally formed on the encapsulation layer 24. Specifically, the first encapsulation layer part 241 of the encapsulation layer 24 is etched to form the microlens units 280, the thickness of the microlens unit 280 can be equal to that of the second encapsulation layer part 242 of the encapsulation layer 24, and the thickness of the microlens unit 280 can also be smaller than that of the first encapsulation layer part 241 of the encapsulation layer 24.

In the present example, the thickness of the microlens unit 280 is smaller than that of the first encapsulation layer part 241 of the encapsulation layer 24, a material same as that of the second encapsulation layer part 242 of the encapsulation layer 24 may be filled above the microlens units 280, and the polarizing layer 23, the touch layer 22 and the cover plate layer 21 are in sequence provided above the encapsulation layer 24, and the back plate layer 27 with the opening hole is provided below the circuit driving layer 26 to obtain a complete display screen.

Figure 3C:
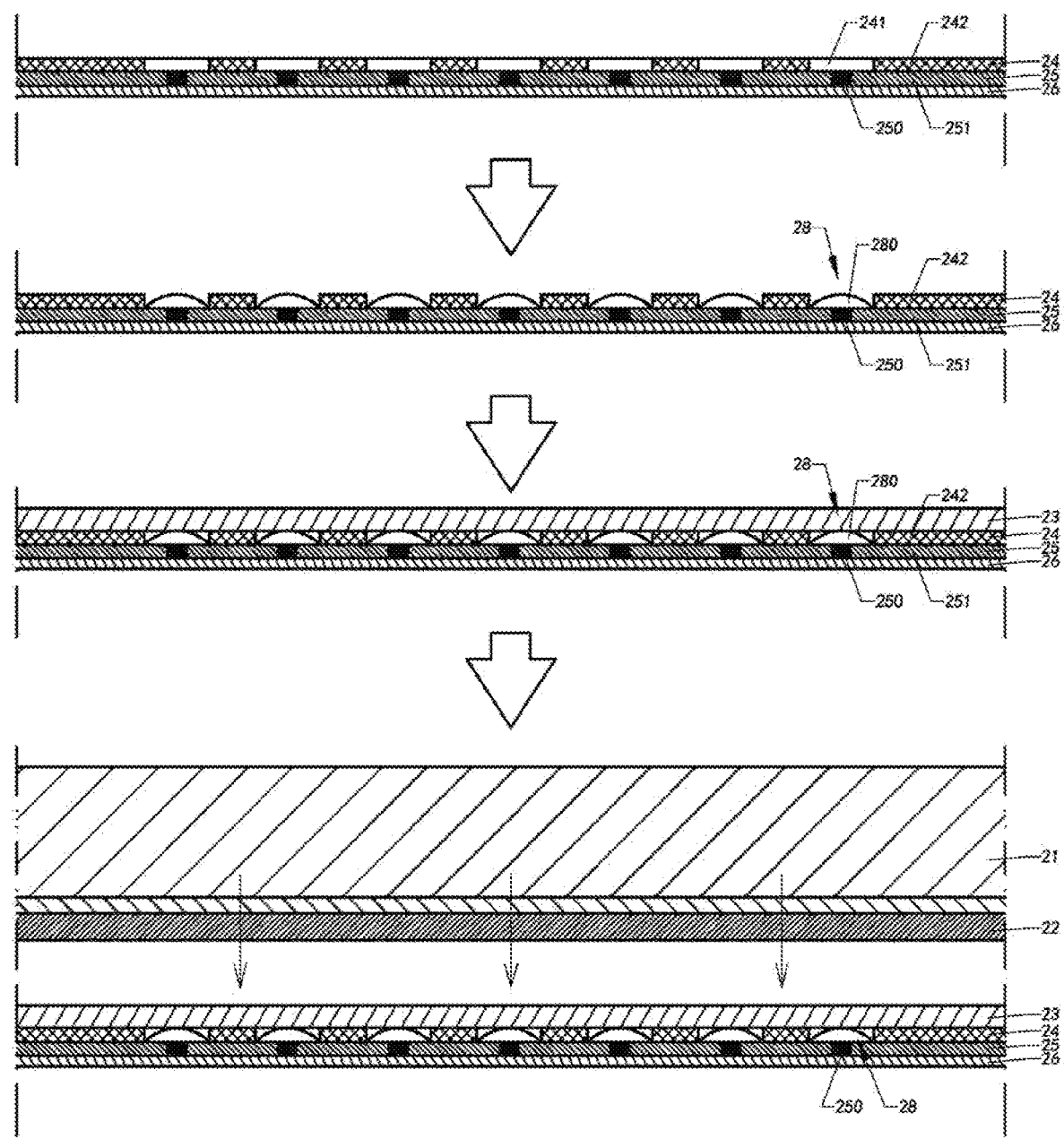
FIG. 3C is a schematic diagram of a preparation process of the display screen according to an embodiment of the present application.

Referring to FIG. 3C, another implementation mode based on the preparation method in FIG. 3B is shown. In the present embodiment, the thickness of the microlens layer 28 is smaller than that of the second encapsulation layer part 242 of the encapsulation layer 24, and the polarizing layer 23 is directly provided above the encapsulation layer 24, so that light passes through the polarizing layer 23, a gap between the polarizing layer 23 and the microlens units 280, the microlens layer 28, and the gaps between adjacent pixels 251 of the pixel layer 25 in sequence to reach the circuit driving layer 26.

It is worthwhile to note that the microlens unit 280 formed by an etching process may further be coated or sprayed with an anti-reflection film or a material with a higher refractive index so as to increase the transmittance and refractive index of light at the position.

Figure 3D:
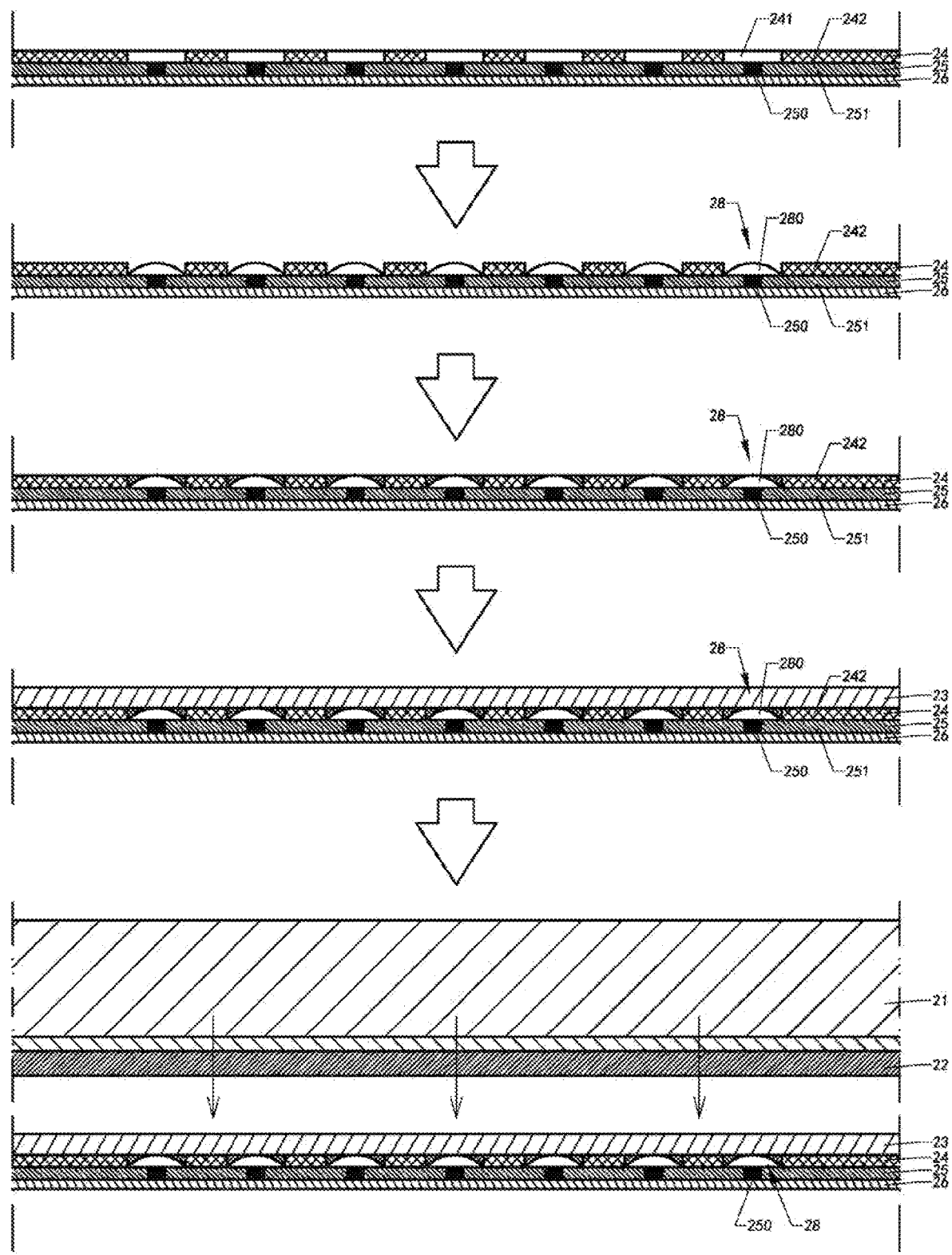
FIG. 3D is a schematic diagram of a preparation process of the display screen according to an embodiment of the present application.

Referring to FIG. 3D, another implementation mode based on the preparation method in FIG. 3B is shown. In the present embodiment, the thickness of the microlens layer 28 is smaller than that of the second encapsulation layer part 242 of the encapsulation layer 24, and a light-transmissive material is filled between the microlens unit 280 and the encapsulation layer 24, so that the microlens layer 28 is flush with the encapsulation layer 24, and a refractive index of the filling material is different from that of a material of the second encapsulation layer part 242 of the encapsulation layer 24. Then the polarizing layer 23 is provided above the encapsulation layer 24, so that light passes through the polarizing layer 23, a gap between the encapsulation layer 24 and the microlens units 280, the microlens layer 28, and the gaps between adjacent pixels 251 of the pixel layer 25 in sequence to reach the circuit driving layer 26.

It is worthwhile to note that the microlens unit 280 formed by an etching process may further be coated or sprayed with an anti-reflection film or a material with a higher refractive index so as to increase the transmittance and refractive index of light at the position.

Figure 3E:
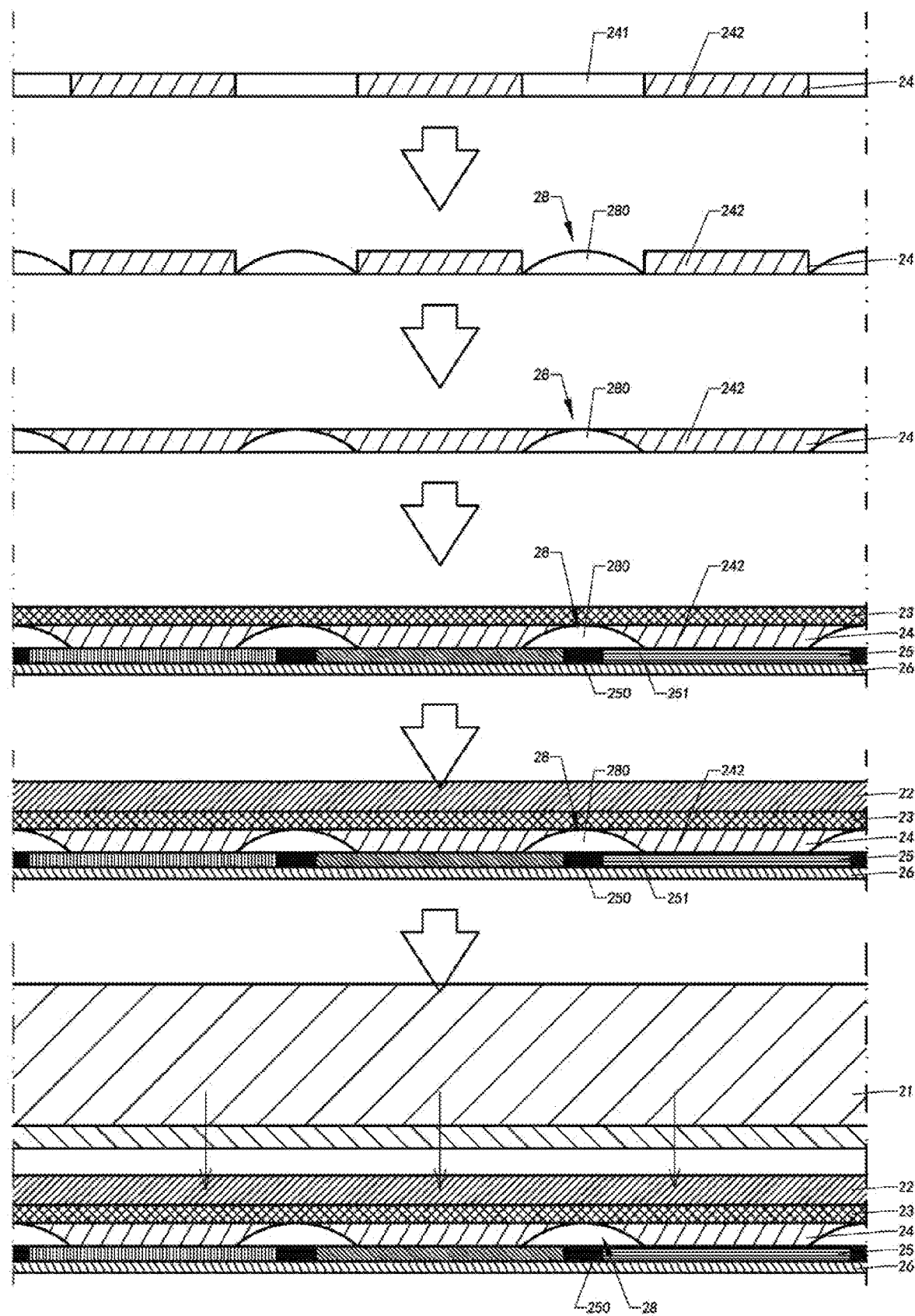
FIG. 3E is a schematic diagram of a preparation process of the display screen according to an embodiment of the present application.

Referring to FIG. 3E, another implementation mode based on the preparation method in FIG. 3B is shown. In the present embodiment, the encapsulation layer 24 is first obtained, the encapsulation layer 24 includes two parts, wherein one part is a first encapsulation layer part 241, and the other part is a second encapsulation layer part 242, and the first encapsulation layer part 241 and the second encapsulation layer part 242 are spaced apart from each other. It is worthwhile to note that a size of a gap between the first encapsulation layer part 241 and the second encapsulation layer part 242 can be determined according to a size of the pixel 251 and a size of the gap between the pixels 251. A refractive index of the first encapsulation layer part 241 is higher than that of the second encapsulation layer part 242.

The microlens units 280 are formed on the first encapsulation layer part 241 by an etching process so as to integrally form the microlens layer 28 on the encapsulation layer 24. A thickness of the microlens unit 280 can be smaller than or equal to that of the encapsulation layer 24.

In the present example, the thickness of the microlens unit 280 is equal to that of the encapsulation layer 24, and specifically, an upper light inlet face of the microlens unit 280 and an upper surface of the encapsulation layer 24 are on the same surface, and a lower light outlet face of the microlens unit 280 and a lower surface of the encapsulation layer 24 are on the same surface.

In some embodiments of the present invention, the thickness of the microlens unit 280 is smaller than that of the encapsulation layer 24, an upper light inlet face of the microlens unit 280 is lower than an upper surface of the encapsulation layer 24, and a lower light outlet s face of the microlens unit 280 and a lower surface of the encapsulation layer 24 are on the same surface. In another embodiment of the present invention, the upper light inlet face of the microlens layer 28 is lower than the upper surface of the encapsulation layer 24, and the lower light outlet face of the microlens layer 28 is higher than the lower surface of the encapsulation layer 24.

Then, a material is filled between the microlens unit 280 and the encapsulation layer 24, and the filling material is same as a material of the second encapsulation layer part 242 of the encapsulation layer 24.

Then, the pixel layer 25 and the circuit driving layer 26 are mounted below the encapsulation layer 24, and the microlens units 280 of the microlens layer 28 are aligned with the gaps between adjacent pixels 251 of the pixel layer 25.

Then, the polarizing layer 23, the touch layer 22 and the cover plate layer 21 are mounted to obtain the display screen.

Figure 3F:
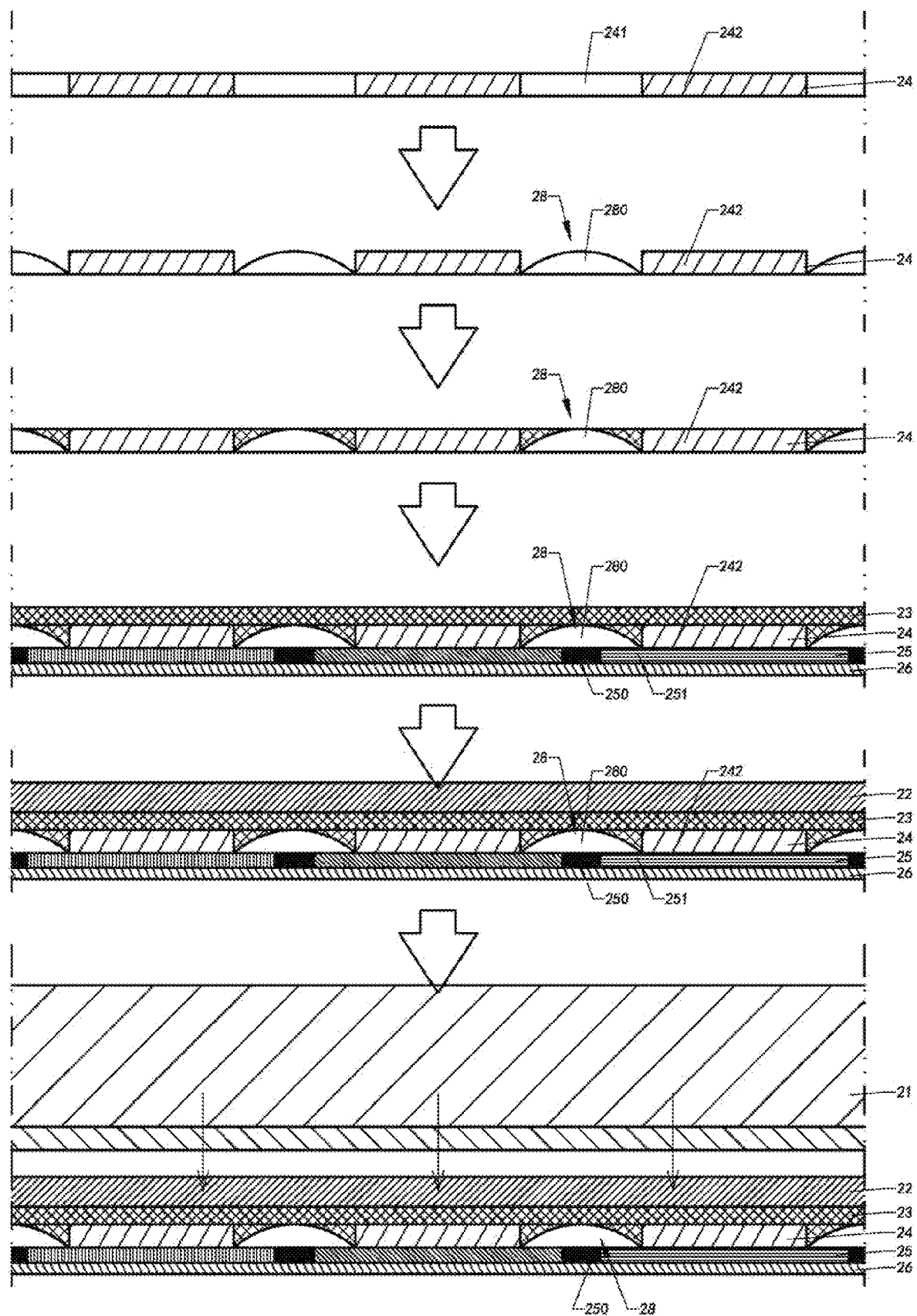
FIG. 3F is a schematic diagram of a preparation process of the display screen according to an embodiment of the present application.

Referring to FIG. 3F, another implementation mode of the preparation method of the display screen according to an embodiment of the present application is shown. The main difference is that the thickness of the microlens is smaller than that of the encapsulation layer 24, and the upper light inlet face of the microlens is lower than the upper surface of the encapsulation layer 24, and the lower light outlet face of the microlens is flush with the lower surface of the encapsulation layer 24.

The refractive index of the material filled between the encapsulation layer 24 and the microlens units 280 is higher than that of the material of the second encapsulation layer part 242 of the encapsulation layer 24, and the material is filled above the microlens layer 28 and is flush with the encapsulation layer 24.

Then, the other layers are mounted on the encapsulation layer 24 to obtain the display screen.

Figure 3G:
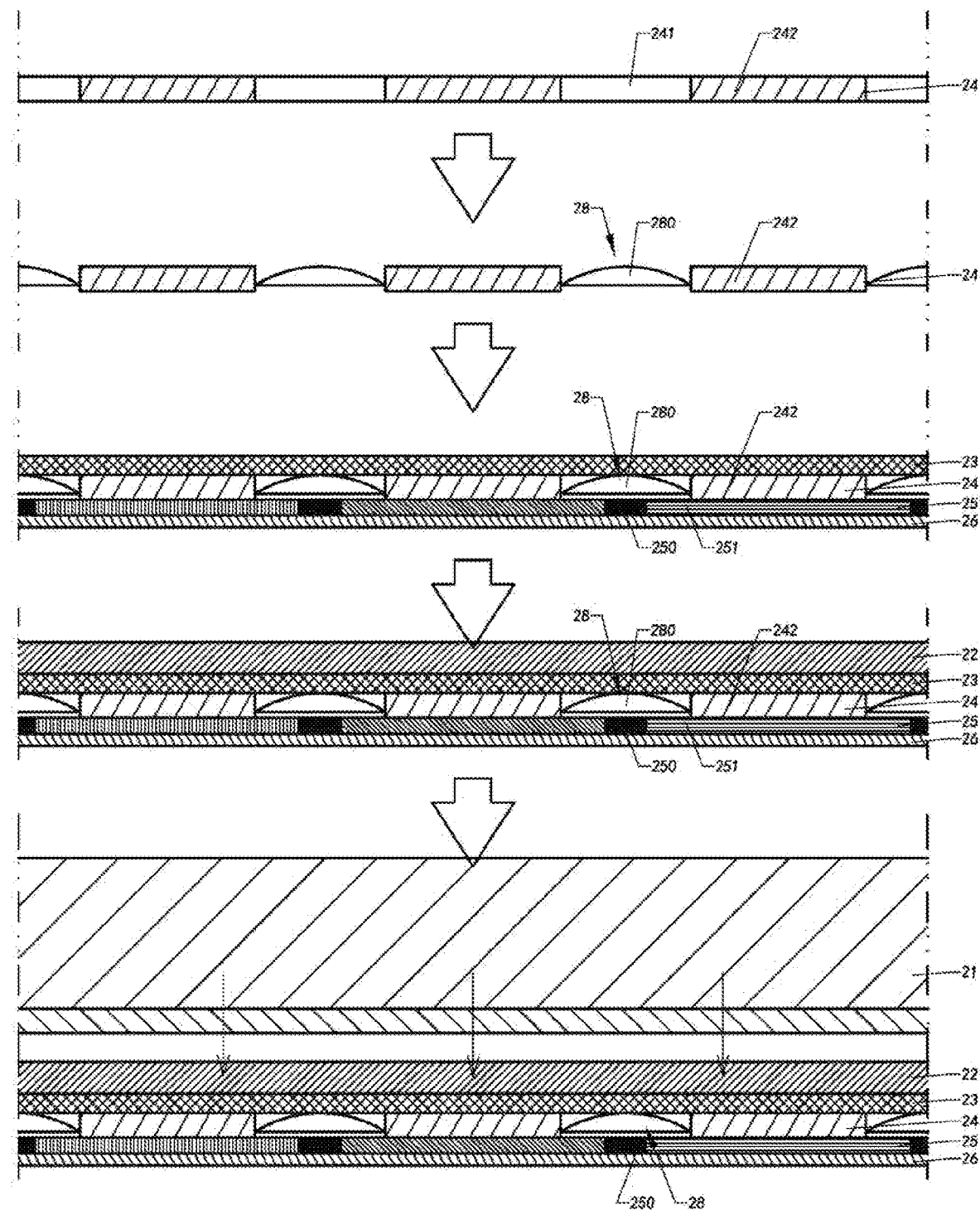
FIG. 3G is a schematic diagram of a preparation process of the display screen according to an embodiment of the present application.

Referring to FIG. 3G, another implementation mode of the preparation method of the display screen according to an embodiment of the present application is shown. The main difference is that the thickness of the microlens is smaller than that of the encapsulation layer 24, and the upper light inlet face of the microlens is lower than the upper surface of the encapsulation layer 24, and the lower light outlet face of the microlens is higher than the lower surface of the encapsulation layer 24.

Then, the other layers are directly mounted on the encapsulation layer 24 to obtain the display screen.

In the present example, light passes through a gap between the polarizing layer 23 and the microlens layer 28, the microlens layer 28, a gap between the microlens layer 28 and the pixel layer 25, and the gaps between adjacent pixels 250 of the pixel layer 25 in sequence, and then finally reaches the circuit driving layer 26.

Figure 6A:
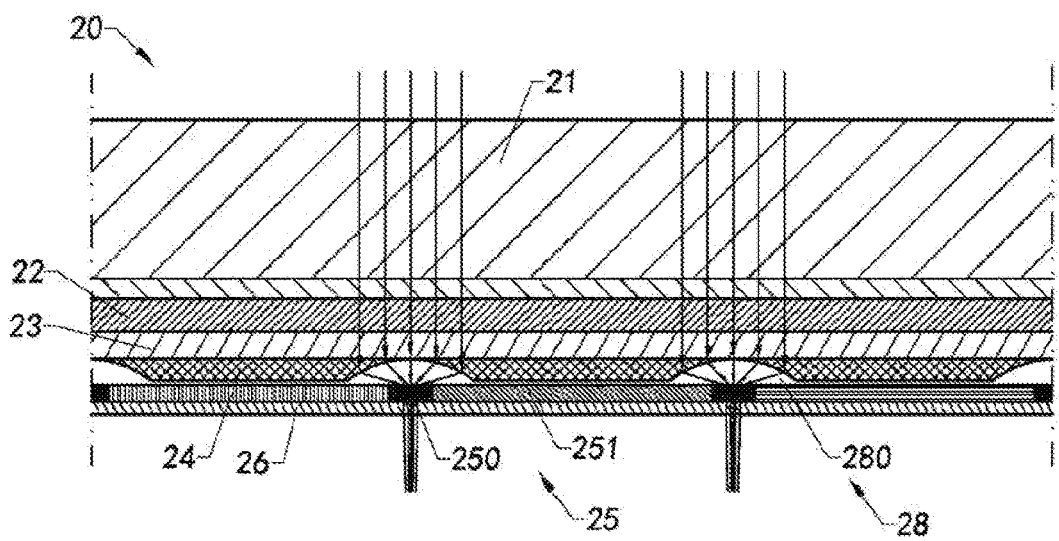
FIG. 6A is another variant implementation mode of the display screen according to an embodiment of the present application.

FIG. 6A is another variant implementation mode of the display screen 20 according to an embodiment of the present application. As shown in FIG. 6A, in the variant implementation mode, the microlens layer 28 is provided with a film structure which is pre-prepared and then attached to the pixel layer 25, wherein with an attaching position of the microlens layer 28 and the arrangement of the microlens units 280 of the microlens layer 28, when the microlens layer 28 is attached to the pixel layer 25, each microlens unit 280 of the microlens layer 28 corresponds to each gap 250 between the pixels 251 so as to increase the light transmittance of the display screen 20. Accordingly, the encapsulation layer 24 is integrally formed on the microlens layer 28 and the pixel layer 25 to encapsulate the pixel layer 25 and the microlens layer 28. For example, the encapsulation layer 24 can be formed above the microlens layer 28 and the pixel layer 25 by a deposition process. The preparation method in which the microlens layer is integrally formed on the pixel layer illustrated in FIG. 3B, FIG. 3C or FIG. 3D can also be applied to the present embodiment.

It should be noted that in the specific examples of the display screen 20 illustrated in FIG. 4B and FIG. 6A, the microlens layer 28 is located inside the encapsulation layer 24. In other words, a height size H of the microlens unit 280 (i.e. a height size of the microlens unit 280) is smaller than or equal to that of the encapsulation layer 24. When a height size of the microlens is equal to that of the encapsulation layer 24, the microlens layer 28 is tangent to the top surface of the encapsulation layer 24.

Particularly, if the microlens unit 280 is implemented as a cylindrical lens, preferably, a width W of a bottom face of the cylindrical lens (i.e. a horizontal size of the microlens unit 280) is larger than a size of the gap 250 between the pixels 251, so that the cylindrical lens can completely cover the gap 250 between the pixels 251. It should be understood that when the cylindrical lens completely covers the gap 250 between the pixels 251, light originally falling outside the gap 250 can be diverted to the gap 250 between the pixels 251 by a light converging effect of the cylindrical lens, so that this part of light can pass through the pixel layer 25 via the gap 250.

Moreover, preferably, a length L of the bottom face of the cylindrical lens (i.e. a longitudinal size of the microlens unit 280) is larger than or equal to the gap between adjacent pixels 251, so that the cylindrical lens can completely cover the gap 250 between various pixels 251, thereby increasing the amount of light converged to the gaps 250 between the pixels. More preferably, the length L of the bottom face of the cylindrical lens is an integer multiple of a size of a single gap between adjacent pixels 251, for example, the length of the bottom face of the cylindrical lens can be set to be a size of a gap, and thus, an array formed by the cylindrical lenses can perfectly correspond to an array formed by the pixels 251.

To further enhance the light converging effect of the microlens layer 28, preferably, in the embodiment of the present application, a refractive index of a material for forming the microlens layer 28 is higher than that of a material for forming the encapsulation layer 24. It should be understood that the higher the refractive index is, the greater the light bending ability is, and therefore, when the microlens layer 28 has a higher refractive index, light originally falling outside the gaps 250 in a relatively larger range can be diverted to the gaps 250 between the pixels 251 through the light converging effect of the cylindrical lenses. It should be understood that the light converging effect increases as a difference between the refractive index of the microlens layer 28 and the refractive index of the encapsulation layer 24 increases.

Figure 6B:
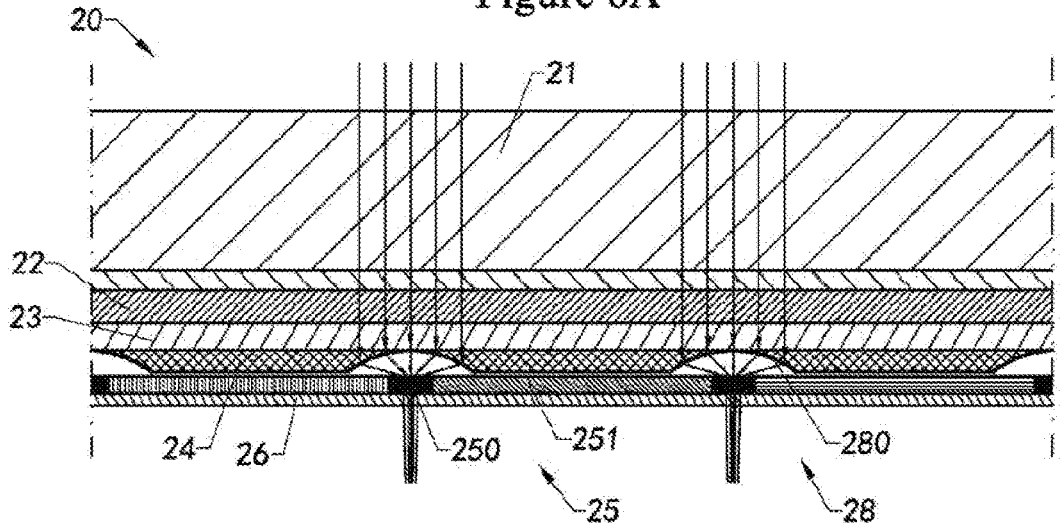
FIG. 6B is another variant implementation mode of the display screen according to an embodiment of the present application.

FIG. 6B is another variant implementation mode of the display screen 20 according to an embodiment of the present application. As shown in FIG. 6B, in the variant implementation mode, the microlens layer 28 is a film structure.

Specifically, recessed structures are first etched at positions corresponding to the gaps between adjacent pixels 251 of the encapsulation layer 24, and then coated with films, that is, the lower surface recessed inward of the encapsulation layer 24 is coated with a film to form a film structure, which can play the role of converging light.

A certain gap may be reserved between the film structure and the pixel layer 25. In the present example, a preset distance is reserved between the film structure and the pixel layer 25. That is, the film structure is not in direct contact with the pixel layer 25. After passing through the polarizing layer 23, light passes through the encapsulation layer 24, the film structure of the microlens layer 28, the gap between the film structure and the pixel layer 25, and the pixel layer 25 in sequence.

Figure 7:
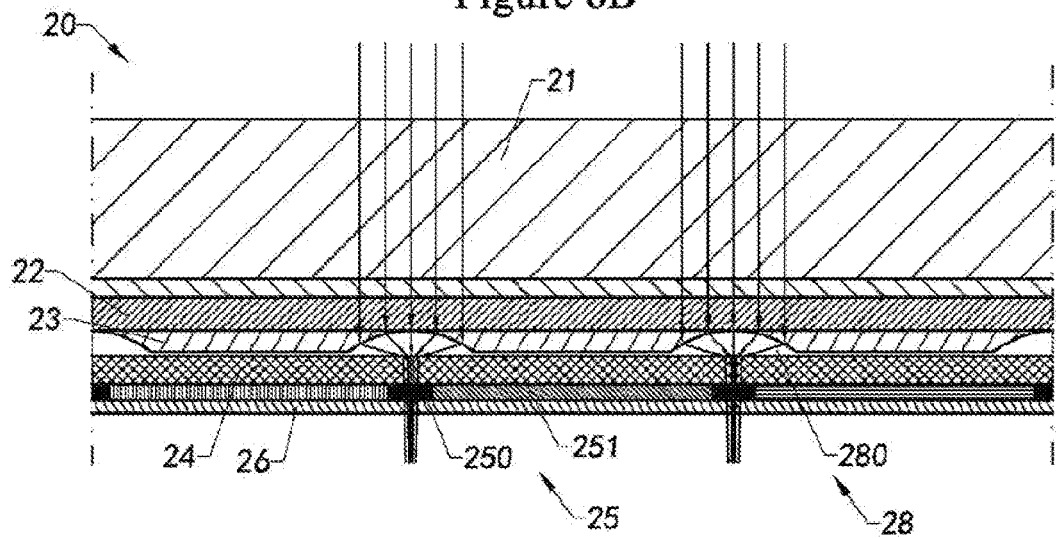
FIG. 7 is yet another variant implementation mode of the display screen according to an embodiment of the present application.

FIG. 7 is yet another variant implementation mode of the display screen 20 according to an embodiment of the present application. As shown in FIG. 7, in the variant implementation mode, the microlens layer 28 is provided with a film structure which is first pre-prepared and then attached to the encapsulation layer 24, wherein with an attaching position of the microlens layer 28 and the arrangement of the microlens units 280 of the microlens layer 28, when the microlens layer 28 is attached to the encapsulation layer 24, each microlens unit 280 of the microlens layer 28 corresponds to each gap 250 between the pixels 251 so as to increase the light transmittance of the display screen 20.

It is worthwhile to note that the polarizing layer 23 is provided with at least one accommodating space, wherein the accommodating space corresponds to the microlens units 280 of the microlens layer 28, the accommodating space is set to match with the microlens units 280 with a film structure, and at least part of the microlens units 280 can be accommodated in the accommodating space of the polarizing layer 23.

A lower surface of the polarizing layer 23 and an upper surface of the microlens layer 28 are set to match with each other. In the present example, the lower surface of the polarizing layer 23 is set to at least partially recess inward, at least part of the upper surface of the microlens layer 28 is set to at least partially protrude outward, and the lower surface of the polarizing layer 23 can be attached to the upper surface of the microlens layer 28.

Figure 5:
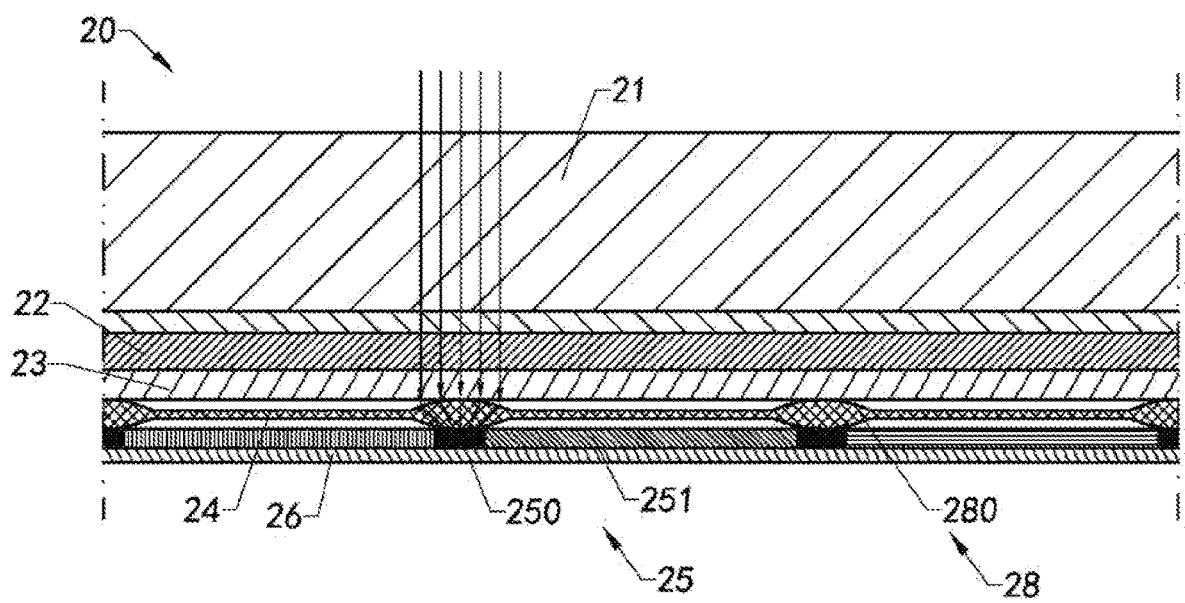
FIG. 5 is another variant implementation mode of the display screen according to an embodiment of the present application.

It should be seen that, compared with the display screens 20 in FIG. 5, FIG. 6A and FIG. 6B, in the variant embodiment, the microlens layer 28 is not in direct contact with the pixel layer 25, that is, an encapsulation layer 24 is provided between the microlens layer 28 and the pixel layer 25. However, each microlens unit 280 of the microlens layer 28 still corresponds to each gap 250 between the pixels 251, and therefore, the microlens layer 28 can still converge a larger amount of light to each gap 250 between the pixels 251 so as to increase the light transmittance of the display screen 20.

Figure 8A:
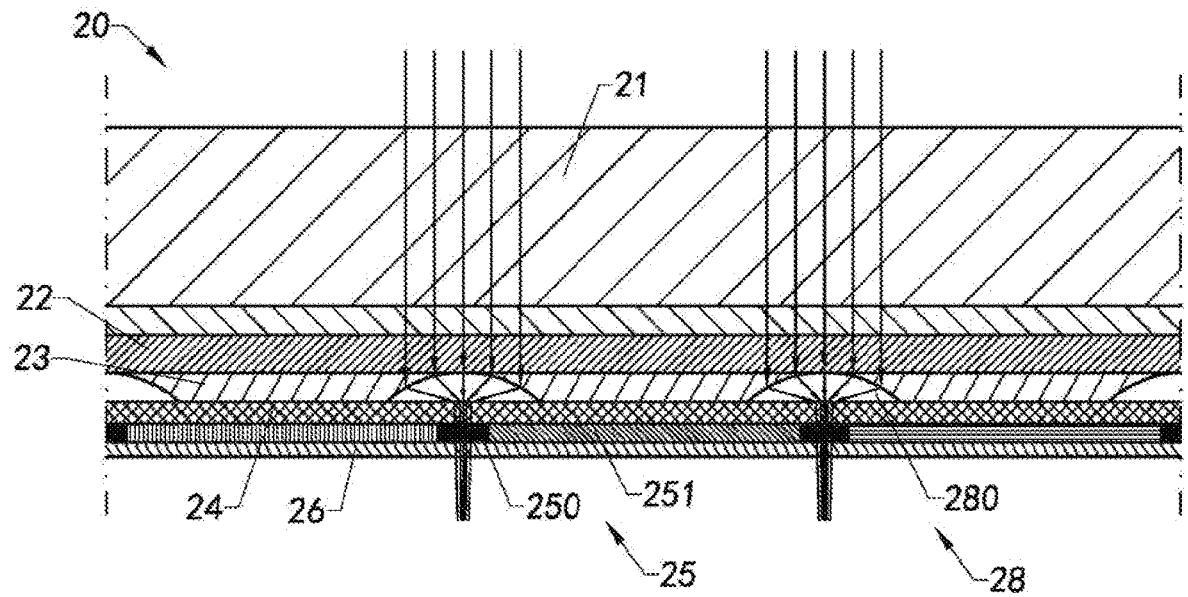
FIG. 8A is yet another variant implementation mode of the display screen according to an embodiment of the present application.

FIG. 8A is yet another variant implementation mode of the display screen 20 according to an embodiment of the present application. As shown in FIG. 8A, in the variant implementation mode, the microlens layer 28 is integrally formed on the top surface of the encapsulation layer 24 in a recessed manner (for example, by an etching process). Specifically, at least part of the polarizing layer 23 is etched, so that a bottom surface of the polarizing layer 23 recesses inwardly, and then recessed positions of the bottom surface of the polarizing layer 23 are filled to form the microlens units 280. The filling material can be a transparent material with a high refractive index.

Further, by adjusting the amount of the filling material, the microlens units 280 can be flush with the polarizing layer 23.

With a position where the microlens layer 28 is formed and the arrangement of the microlens units 280 of the microlens layer 28, when the microlens layer 28 is integrally formed on the top surface of the encapsulation layer 24, each microlens unit 280 of the microlens layer 28 corresponds to each gap 250 between the pixels 251 so as to increase the light transmittance of the display screen 20.

It is worthwhile to note that in the variant implementation mode, the microlens layer 28 and the encapsulation layer 24 are of an integral structure, which is advantageous for the preparation of the display screen 20. For example, in the preparation process, the microlens layer 28 and the encapsulation layer 24 can be prepared as one element in a same process to reduce the preparation process and preparation cost of the display screen 20.

Figure 8B:
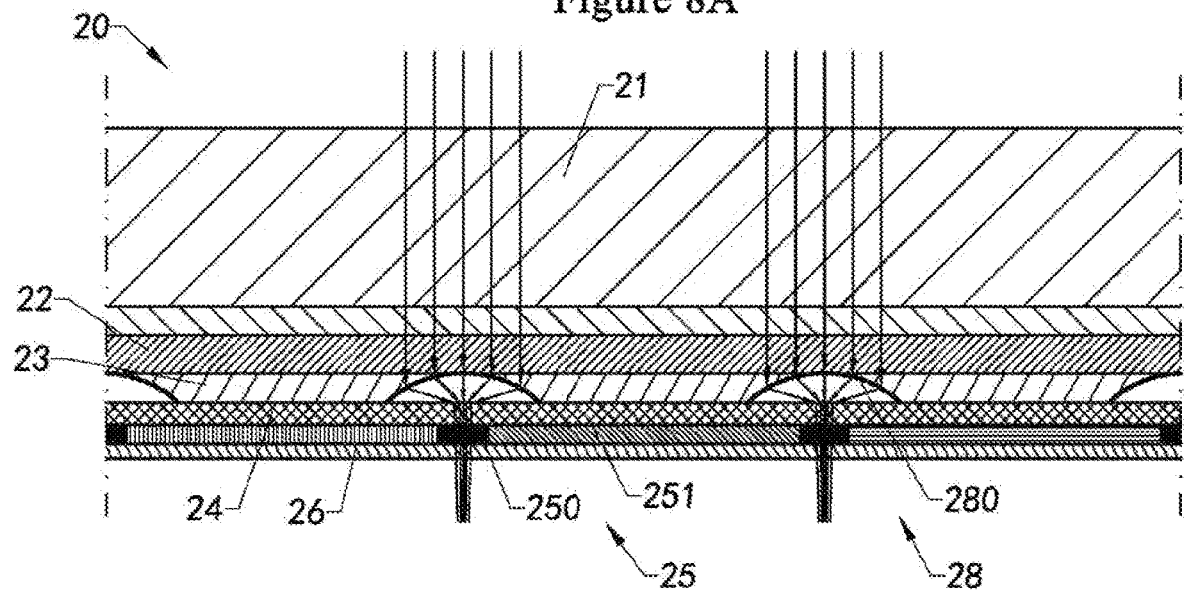
FIG. 8B is another variant implementation mode of the display screen according to an embodiment of the present application.

FIG. 8B is yet another variant implementation mode of the display screen 20 according to an embodiment of the present application. As shown in FIG. 8B, in the variant implementation mode, the microlens layer 28 is a film structure and is provided on the polarizing layer 23.

Specifically, recessed structures are first etched at positions corresponding to the gaps between adjacent pixels 251 of the polarizing layer 23, and then coated with films, that is, the lower surface recessed inward of the polarizing layer 23 is coated with a film to form a film structure, which can play the role of converging light.

A certain gap may be reserved between the film structure and the pixel layer 25. In the present example, a preset distance is reserved between the film structure and the pixel layer 25. That is, the film structure is not in direct contact with the pixel layer 25. After passing through the polarizing layer 23, light passes through the film structure of the microlens layer 28, a gap between the film structure and the encapsulation layer 24, and the encapsulation layer 24 in sequence to reach the pixel layer 25.

Figure 9:
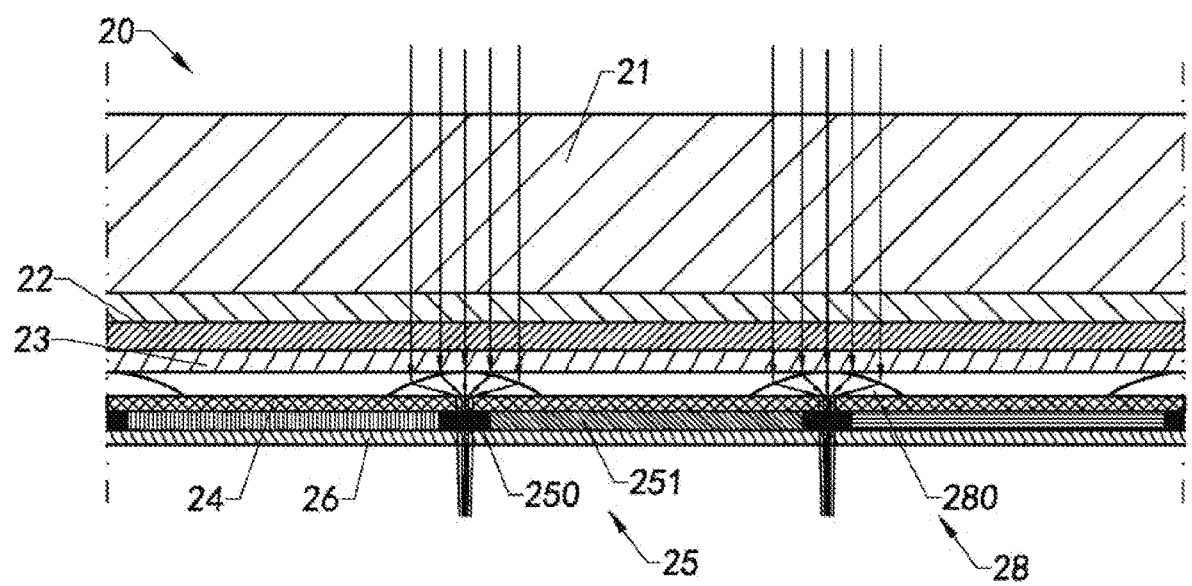
FIG. 9 is yet another variant implementation mode of the display screen according to an embodiment of the present application.

FIG. 9 is yet another variant implementation mode of the display screen 20 according to an embodiment of the present application. As shown in FIG. 9, in the variant implementation mode, the microlens layer 28 is integrally formed on the top surface of encapsulation layer 24 in a protruded manner (for example, by a deposition process), wherein with a position where the microlens layer 28 is formed and the arrangement of the microlens units 280 of the microlens layer 28, when the microlens layer 28 is integrally formed on the top surface of the encapsulation layer 24, each microlens unit 280 of the microlens layer 28 corresponds to each gap 250 between the pixels 251 so as to increase the light transmittance of the display screen 20.

It is worthwhile to note that in the variant implementation mode, the microlens layer 28 and the encapsulation layer 24 are of an integral structure, which is advantageous for the preparation of the display screen 20. For example, in the preparation process, the microlens layer 28 and the encapsulation layer 24 can be prepared as one element in a same process to reduce the preparation process and preparation cost of the display screen 20.

In conclusion, the display screen 20 of the present application does not require a sharp adjustment to the existing structure of the existing display screen 20, and only one microlens layer 28 corresponding to each gap 250 between the pixels in the pixel layer 25 needs to be additionally provided above the pixel layer 25 of the display screen 20. Accordingly, the preparation process of the microlens layer 28 is relatively simple, the preparation efficiency is high, and cost is relatively low.

Exemplary Preparation Method of a Display Screen

According to another aspect of the present application, the present application further provides a preparation method of a display screen, which is used to prepare a display screen with relatively high transmittance.

Figure 10:
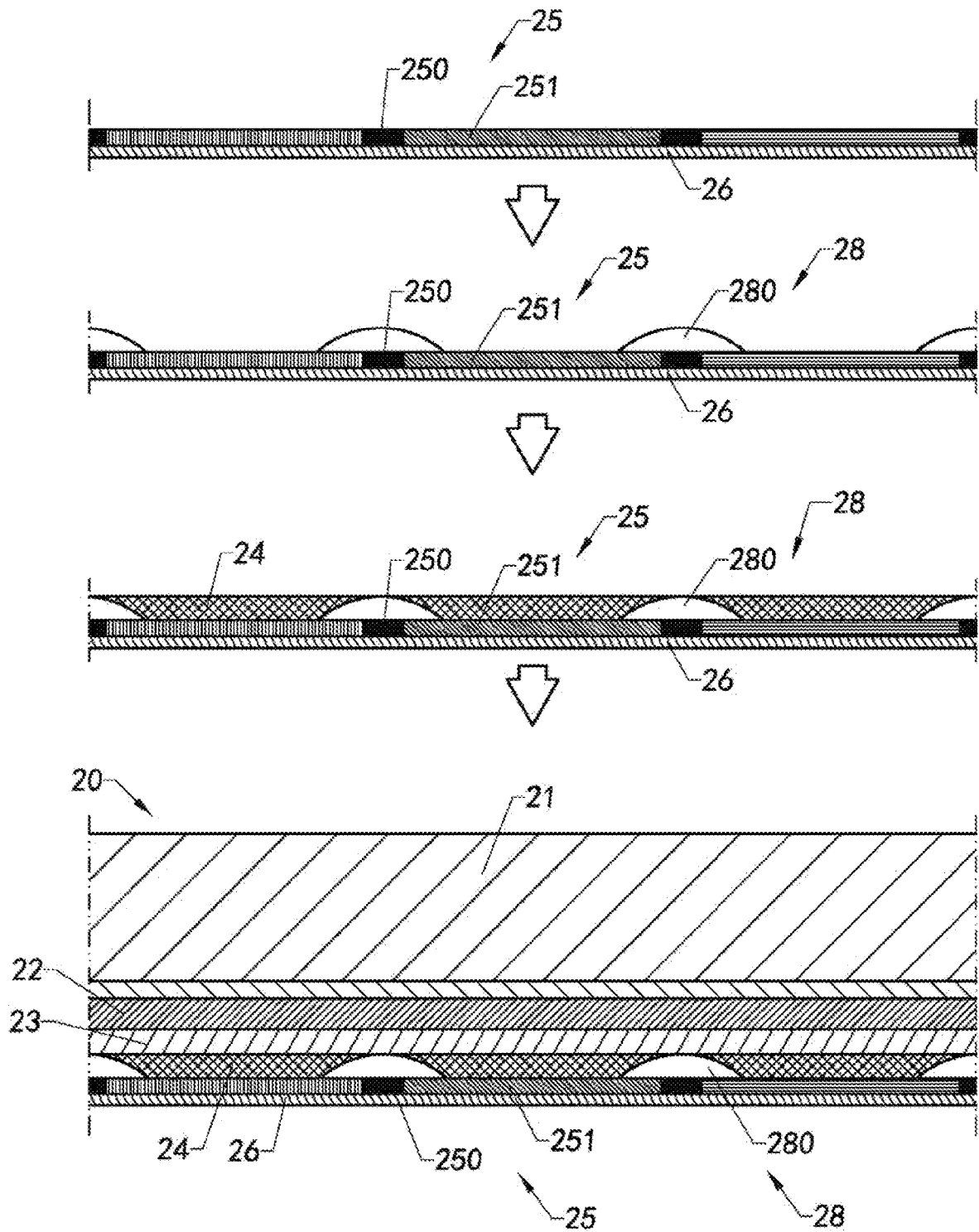
FIG. 10 is a schematic diagram of a preparation process of the display screen according to an embodiment of the present application.

FIG. 10 is a schematic diagram of a preparation process of the display screen 20 according to an embodiment of the present application. As shown in FIG. 10, in the preparation process, the circuit driving layer 26 is first pre-prepared, and the pixel layer 25 is formed on the circuit driving layer 26, wherein the circuit driving layer 26 is electrically connected to the pixel layer 25 to drive the pixel layer 25 to operate. Those skilled in the art should know that at present, the mainstream production process of the pixel layer 25 in the OLED display screen is the evaporation process. In simple terms, the evaporation process is to use a method such as electric current heating, electron beam bombardment heating and laser heating in a vacuum to evaporate a material to be evaporated into atoms or molecules, which then move in a straight line with a larger free path, and collide with a surface of a substrate and condense to form a thin film. In addition, besides the evaporation process for "evaporating" each pixel 251 into the OLED screen, the printing process can also be used, that is, an organic material thin film of a display device is prepared in a printing manner.

Further, as shown in FIG. 10, the microlens layer 28 is integrally formed on the pixel layer 25, wherein each microlens unit 280 of the microlens layer 28 corresponds to each gap 250 between the pixels 251 in the pixel layer 25. For example, the microlens units 280 can be respectively formed on the gaps 250 between various pixels 251 of the pixel layer 25 by a deposition process, and by this way, the microlens layer 28 is integrally formed on the pixel layer 25.

Further, as shown in FIG. 10, the encapsulation layer 24 is formed on the microlens layer 28 and the pixel layer 25 to encapsulate the microlens layer 28 and the pixel layer 25 through the encapsulation layer 24. For example, the encapsulation layer 24 can also be integrally formed on the pixel layer 25 and the microlens layer 28 by a deposition process to encapsulate the pixel layer 25 and the microlens layer 28 through the encapsulation layer 24. Further, the polarizing layer 23, the touch layer 22 and the cover plate layer 21 are formed in sequence on the encapsulation layer 24 to form the display screen 20 in a combined manner.

Optionally, a back plate layer 27 provided with an opening hole 270 can further be attached to a bottom side of the circuit driving layer 26 to enhance the structural strength of the display screen 20 through the back plate layer 27. Particularly, the opening hole 270 of the back plate layer 27 is formed at a light transmitting position of the display screen 20.

It should be understood that the microlens layer 28 is formed inside the encapsulation layer 24, and corresponds to the gaps 250 between various pixels 251, so that when light passes through the cover plate layer 21, the touch layer 22, the polarizing layer 23, and the encapsulation layer 24 in sequence to reach the microlens layer 28, the microlens layer 28 converges the light to the gaps 250 between various pixels 251, and thus, larger amount of light can pass through the pixel layer 25 via the gaps 250. Further, the light passing through the pixel layer 25 can pass through the circuit driving layer 26 to reach a bottom side of the display screen 20. Thus, the overall light transmittance of the display screen 20 can be effectively increased.

Particularly, in the above preparation method, a refractive index of a material for forming the microlens layer 28 is higher than that of a material for forming the encapsulation layer 24.

Figure 11:
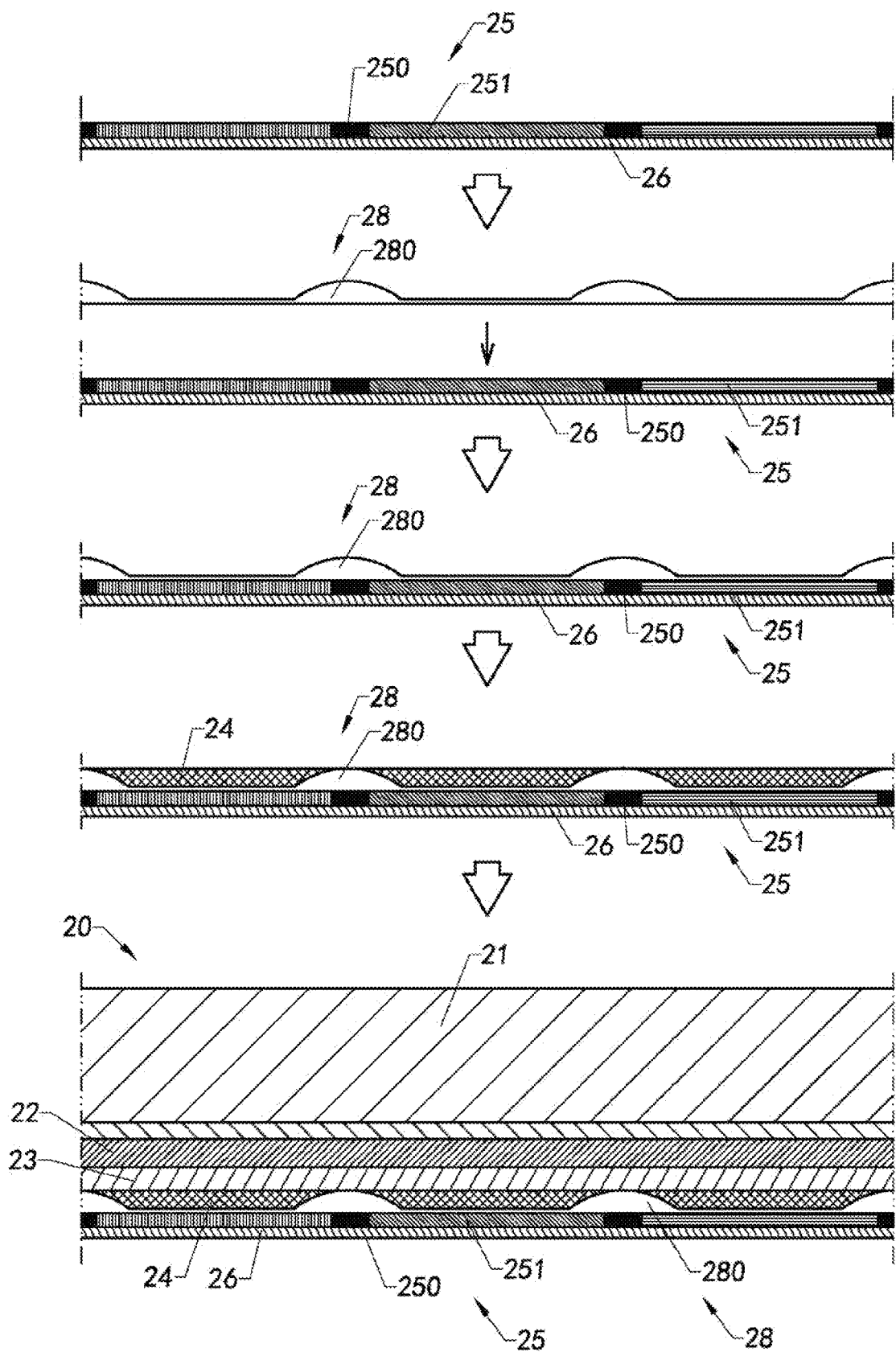
FIG. 11 is a schematic diagram of another preparation process of the display screen according to an embodiment of the present application.

FIG. 11 is a schematic diagram of another preparation process of the display screen 20 according to an embodiment of the present application. As shown in FIG. 11, in the preparation process, the circuit driving layer 26 is first pre-prepared, and the pixel layer 25 is formed on the circuit driving layer 26, wherein the circuit driving layer 26 is electrically connected to the pixel layer 25 to drive the pixel layer 25 to operate. Those skilled in the art should know that at present, the mainstream production process of the pixel layer 25 in the OLED display screen is the evaporation process. In simple terms, the evaporation process is to use a method such as electric current heating, electron beam bombardment heating and laser heating in a vacuum to evaporate a material to be evaporated into atoms or molecules, which then move in a straight line with a larger free path, and collide with a surface of a substrate and condense to form a thin film. In addition, besides the evaporation process for "evaporating" each pixel 251 into the OLED screen, the printing process can also be used, that is, an organic material thin film of a display device is prepared in a printing manner.

As shown in FIG. 11, further, the microlens layer 28 with a film structure is pre-prepared, and the microlens layer 28 is attached to the pixel layer 25. Particularly, in the embodiment of the present application, with an attaching position of the microlens layer 28 and the arrangement of the microlens units 280 of the microlens layer 28, when the microlens layer 28 is attached to the pixel layer 25, each microlens unit 280 of the microlens layer 28 corresponds to each gap 250 between the pixels 251 so as to increase the light transmittance of the display screen 20.

As shown in FIG. 11, further, the encapsulation layer 24 is formed on the microlens layer 28 and the pixel layer 25 to encapsulate the microlens layer 28 and the pixel layer 25 through the encapsulation layer 24. For example, the encapsulation layer 24 can be integrally formed on the pixel layer 25 and the microlens layer 28 by a deposition process to encapsulate the pixel layer 25 and the microlens layer 28 through the encapsulation layer 24. Further, the polarizing layer 23, the touch layer 22 and the cover plate layer 21 are formed in sequence on the encapsulation layer 24 to form the display screen 20 in a combined manner.

Optionally, a back plate layer 27 provided with an opening hole 270 can further be attached to a bottom side of the circuit driving layer 26 to enhance the structural strength of the display screen 20 through the back plate layer 27. Particularly, the opening hole 270 of the back plate layer 27 is formed at a light transmitting position of the display screen 20.

It should be understood that the microlens layer 28 is located inside the encapsulation layer 24, and the microlens units 280 correspond to the gaps 250 between various pixels 251 in the pixel layer 25, so that when light passes through the cover plate layer 21, the touch layer 22, the polarizing layer 23, and the encapsulation layer 24 in sequence to reach the microlens layer 28, the microlens layer 28 converges the light to the gaps 250 between various pixels 251, and thus, larger amount of light can pass through the pixel layer 25 via the gaps 250. Further, the light passing through the pixel layer 25 can pass through the circuit driving layer 26 to reach a bottom side of the display screen 20. Thus, the overall light transmittance of the display screen 20 can be effectively increased.

Particularly, in the above preparation method, a refractive index of a material for forming the microlens layer 28 is higher than that of a material for forming the encapsulation layer 24.

Figure 12:
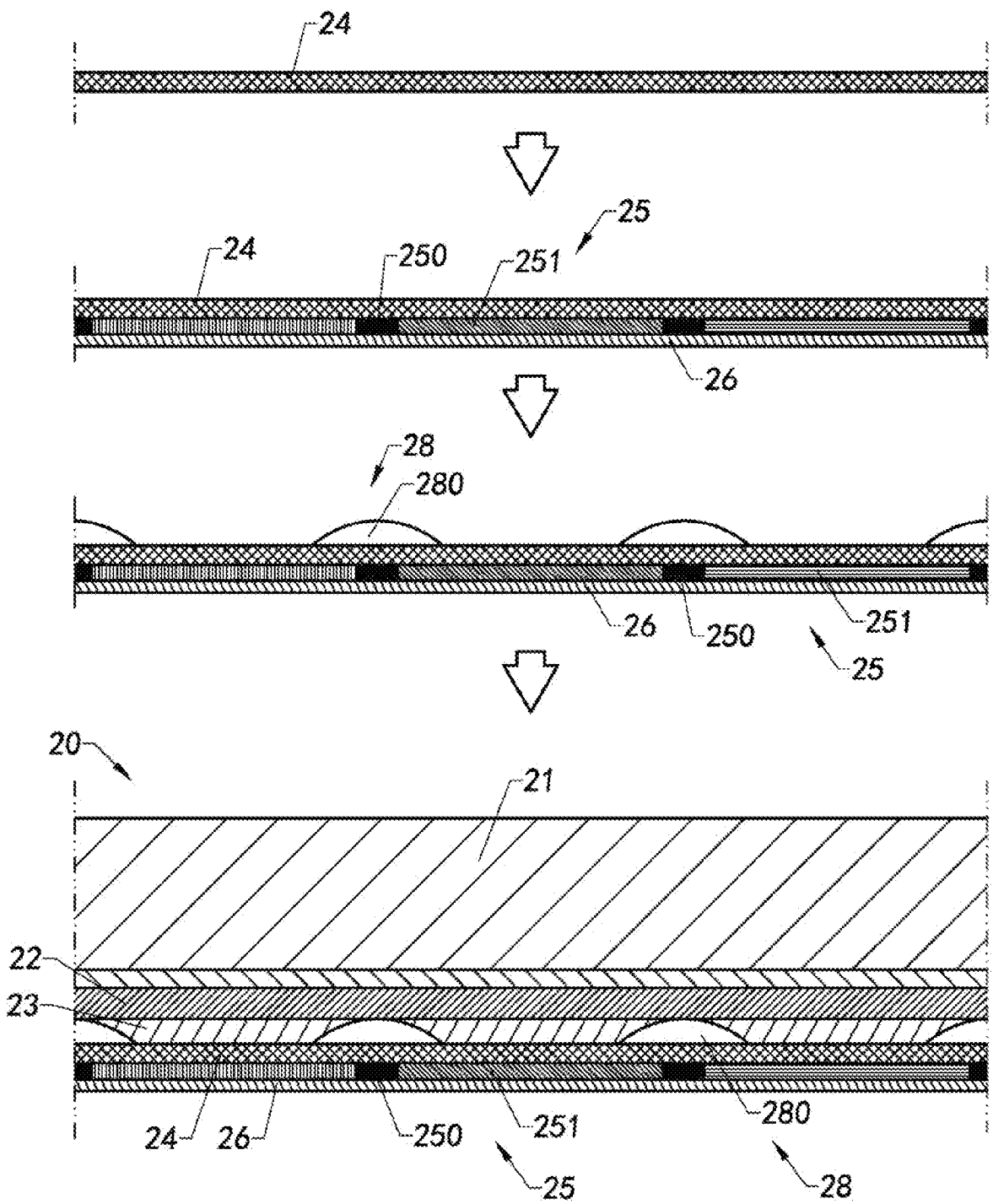
FIG. 12 is a schematic diagram of yet another preparation process of the display screen according to an embodiment of the present application.

FIG. 12 is a schematic diagram of yet another preparation process of the display screen 20 according to an embodiment of the present application. As shown in FIG. 12, in the preparation process, the circuit driving layer 26 is first pre-prepared, and the pixel layer 25 is formed on the circuit driving layer 26, wherein the circuit driving layer 26 is electrically connected to the pixel layer 25 to drive the pixel layer 25 to operate. Those skilled in the art should know that at present, the mainstream production process of the pixel layer 25 in the OLED display screen is the evaporation process. In simple terms, the evaporation process is to use a method such as electric current heating, electron beam bombardment heating and laser heating in a vacuum to evaporate a material to be evaporated into atoms or molecules, which then move in a straight line with a larger free path, and collide with a surface of a substrate and condense to form a thin film. In addition, besides the evaporation process for "evaporating" each pixel 251 into the OLED screen, the printing process can also be used, that is, an organic material thin film of a display device is prepared in a printing manner.

As shown in FIG. 12, further, an encapsulation layer 24 is integrally formed on the pixel layer 25 to encapsulate the pixel layer 25 through the encapsulation layer 24. Further, a microlens layer 28 is integrally formed on a top surface of the encapsulation layer 24, wherein the microlens layer 28 includes microlens units 280 distributed in an array, and each microlens unit 280 corresponds to each gap 250 between the pixels 251 of the pixel layer 25.

Specifically, in the preparation process, the microlens layer 28 is integrally formed on the top surface of the encapsulation layer 24 by a process such as a deposition process. As shown in FIG. 12, the formed microlens layer 28 extends on the top surface of the encapsulation layer 24 in a protruded manner, and moreover, each microlens unit 280 of the microlens layer 28 corresponds to each gap 250 between the pixels 251.

Figure 13:
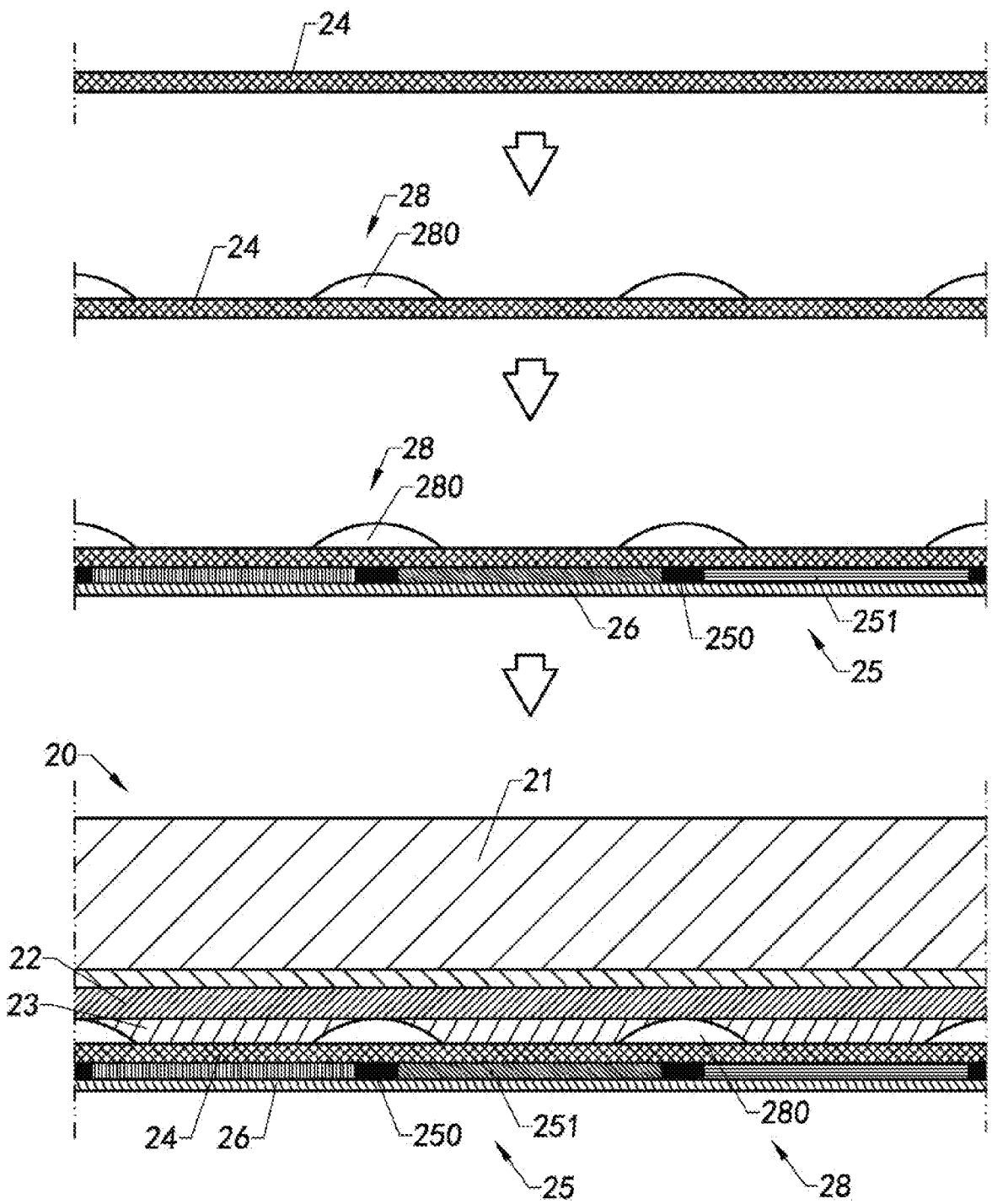
FIG. 13 is a schematic diagram of yet another preparation process of the display screen according to an embodiment of the present application.

It is worthwhile to note that the microlens layer 28 is integrally formed on the top surface of the encapsulation layer 24, that is, the microlens layer 28 and the encapsulation layer 24 are of an integral structure, and therefore, in the preparation process, the microlens layer 28 can be integrally formed on the top surface of the encapsulation layer 24 in advance, and then the encapsulation layer 24 with the microlens layer 28 is attached above the pixel layer 25, as shown in FIG. 13.

As shown in FIG. 12, further, the polarizing layer 23, the touch layer 22 and the cover plate layer 21 are formed in sequence on the microlens layer 28 to form the display screen 20 in a combined manner.

Optionally, a back plate layer 27 provided with an opening hole 270 can further be attached to a bottom side of the circuit driving layer 26 to enhance the structural strength of the display screen 20 through the back plate layer 27. Particularly, the opening hole 270 of the back plate layer 27 is formed at a light transmitting position of the display screen 20.

It should be understood that the microlens layer 28 is formed on a top side of the encapsulation layer 24, and the microlens units 280 correspond to the gaps 250 between various pixels 251 in the pixel layer 25, so that when light passes through the cover plate layer 21, the touch layer 22, and the polarizing layer 23 in sequence to reach the microlens layer 28, the microlens layer 28 converges the light, then the light passes through the encapsulation layer 24 to reach the gaps 250 between various pixels 251, and thus, larger amount of light can pass through the pixel layer 25 via the gaps 250. Further, the light passing through the pixel layer 25 can pass through the circuit driving layer 26 to reach a bottom side of the display screen 20. Thus, the overall light transmittance of the display screen 20 can be effectively increased.

Particularly, in the above preparation method, a refractive index of a material for forming the microlens layer 28 is higher than that of a material for forming the encapsulation layer 24.

Figure 14:
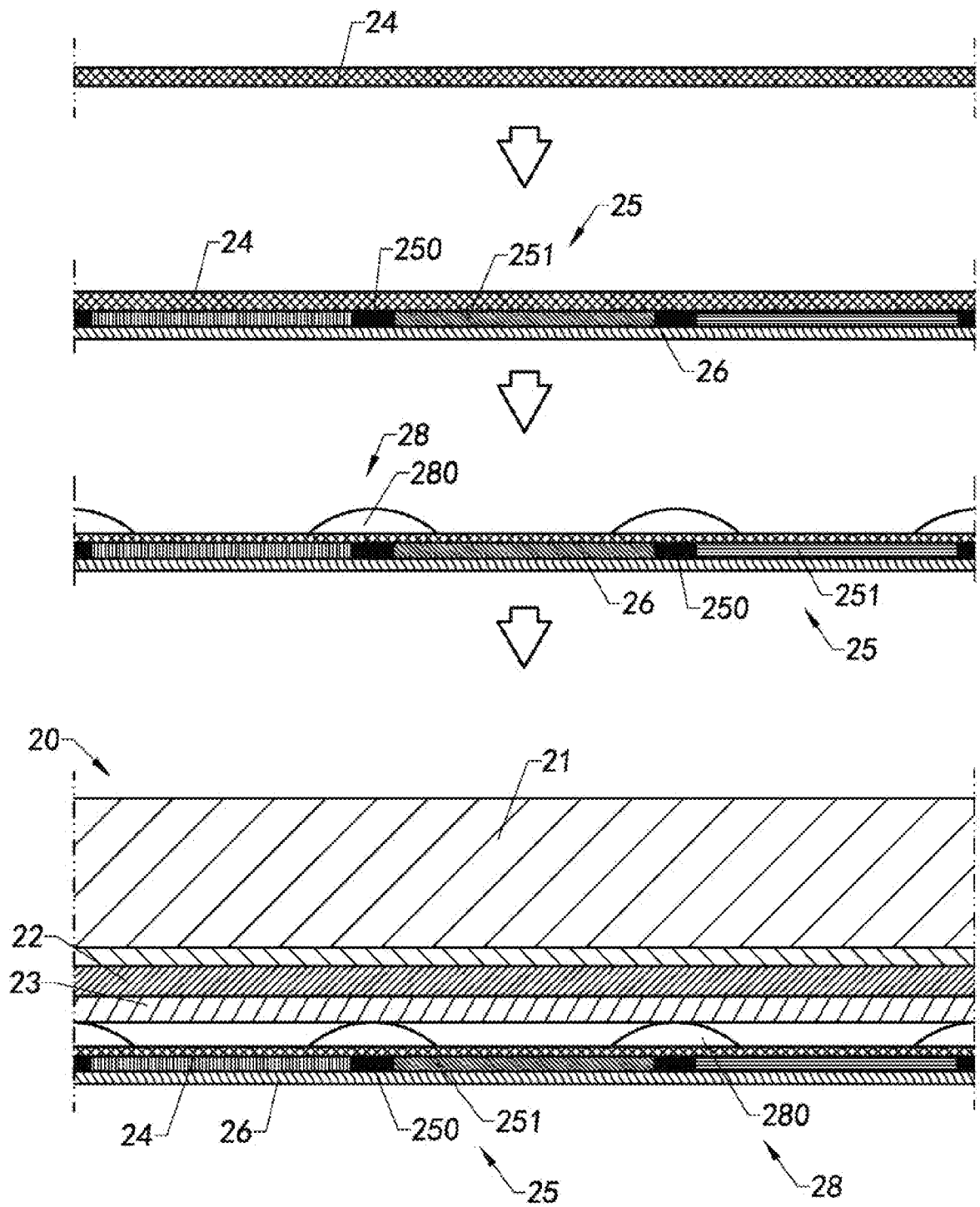
FIG. 14 is a schematic diagram of yet another preparation process of the display screen according to an embodiment of the present application.

FIG. 14 is a schematic diagram of yet another preparation process of the display screen 20 according to an embodiment of the present application. As shown in FIG. 14, in the preparation process, the circuit driving layer 26 is first pre-prepared, and the pixel layer 25 is formed on the circuit driving layer 26, wherein the circuit driving layer 26 is electrically connected to the pixel layer 25 to drive the pixel layer 25 to operate. Those skilled in the art should know that at present, the mainstream production process of the pixel layer 25 in the OLED display screen is the evaporation process. In simple terms, the evaporation process is to use a method such as electric current heating, electron beam bombardment heating and laser heating in a vacuum to evaporate a material to be evaporated into atoms or molecules, which then move in a straight line with a larger free path, and collide with a surface of a substrate and condense to form a thin film. In addition, besides the evaporation process for "evaporating" each pixel 251 into the OLED screen, the printing process can also be used, that is, an organic material thin film of a display device is prepared in a printing manner.

As shown in FIG. 14, further, an encapsulation layer 24 is integrally formed on the pixel layer 25 to encapsulate the pixel layer 25 through the encapsulation layer 24. Further, a microlens layer 28 is integrally formed on a top surface of the encapsulation layer 24, wherein the microlens layer 28 includes microlens units 280 distributed in an array, and each microlens unit 280 corresponds to each gap 250 between the pixels 251 of the pixel layer 25.

Specifically, in the preparation process, the microlens layer 28 is integrally formed on the top surface of the encapsulation layer 24 by a process such as an etching process. As shown in FIG. 14, the formed microlens layer 28 is formed on the top surface of the encapsulation layer 24 in a recessed manner, and moreover, each microlens unit 280 of the microlens layer 28 corresponds to each gap 250 between the pixels 251.

Figure 15:
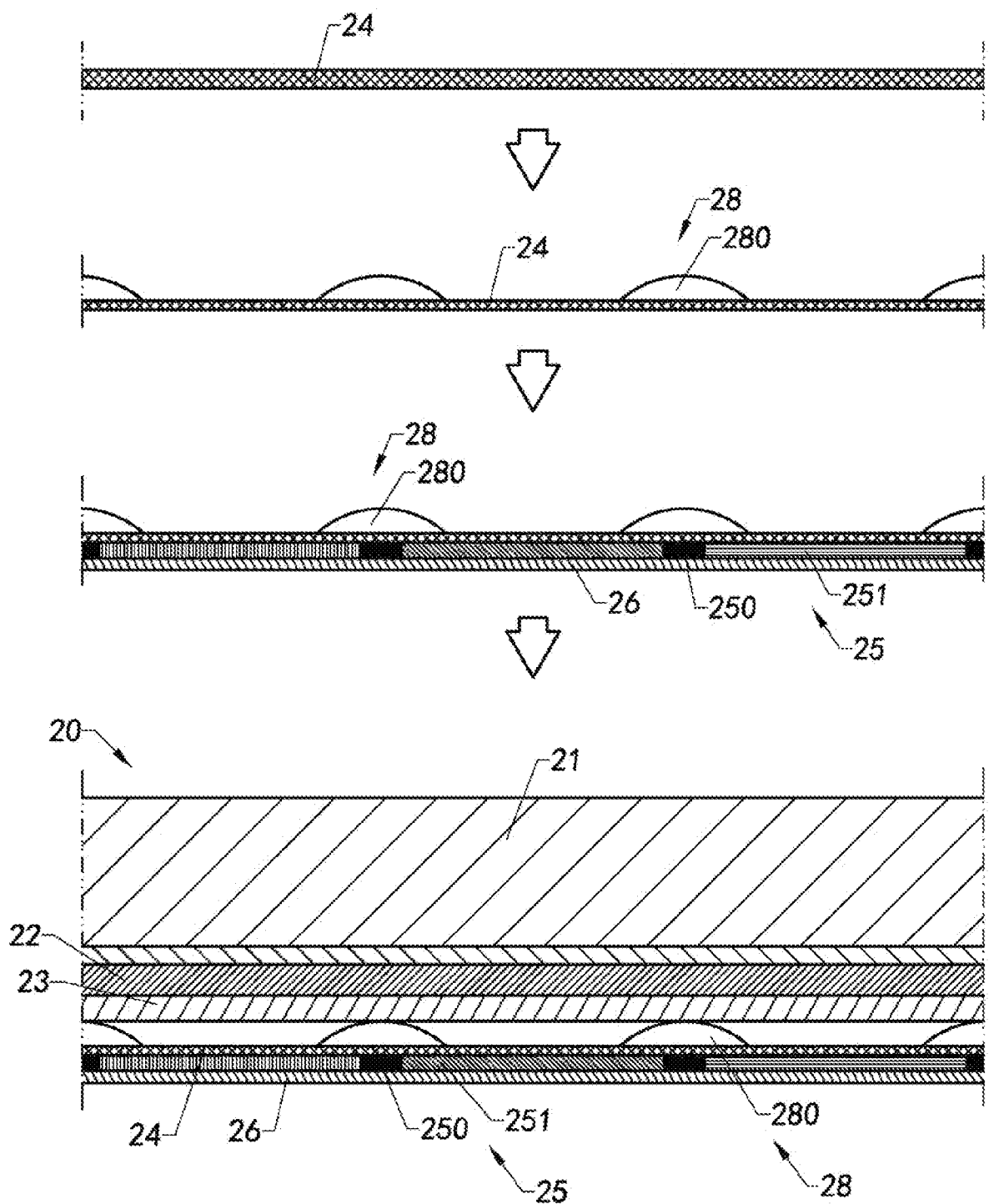
FIG. 15 is a schematic diagram of yet another preparation process of the display screen according to an embodiment of the present application.

It is worthwhile to note that the microlens layer 28 is integrally formed on the top surface of the encapsulation layer 24, that is, the microlens layer 28 and the encapsulation layer 24 are of an integral structure, and therefore, in the preparation process, the microlens layer 28 can be integrally formed on the top surface of the encapsulation layer 24 in advance, and then the encapsulation layer 24 with the microlens layer 28 is attached above the pixel layer 25, as shown in FIG. 15.

As shown in FIG. 14, further, the polarizing layer 23, the touch layer 22 and the cover plate layer 21 are formed in sequence on the microlens layer 28 to form the display screen 20 in a combined manner.

Optionally, a back plate layer 27 provided with an opening hole 270 can further be attached to a bottom side of the circuit driving layer 26 to enhance the structural strength of the display screen 20 through the back plate layer 27. Particularly, the opening hole 270 of the back plate layer 27 is formed at a light transmitting position of the display screen 20.

It should be understood that the microlens layer 28 is formed on a top side of the encapsulation layer 24, and the microlens units 280 correspond to the gaps 250 between various pixels 251 in the pixel layer 25, so that light passes through the cover plate layer 21, the touch layer 22, and the polarizing layer 23 in sequence to reach the microlens layer 28, and when the light passes through the cover plate layer 21, the touch layer 22, the polarizing layer 23, a gap between the polarizing layer 23 and the microlens layer 28, and the microlens layer 28 in sequence, the microlens layer 28 converges the light, then the light passes through the encapsulation layer 24 to reach the gaps 250 between various pixels 251, and thus, larger amount of light can pass through the pixel layer 25 via the gaps 250. Further, the light passing through the pixel layer 25 can pass through the circuit driving layer 26 to reach a bottom side of the display screen 20. Thus, the overall light transmittance of the display screen 20 can be effectively increased.

Particularly, in the above preparation method, a refractive index of a material for forming the microlens layer 28 is higher than that of a material for forming the encapsulation layer 24.

Figure 16:
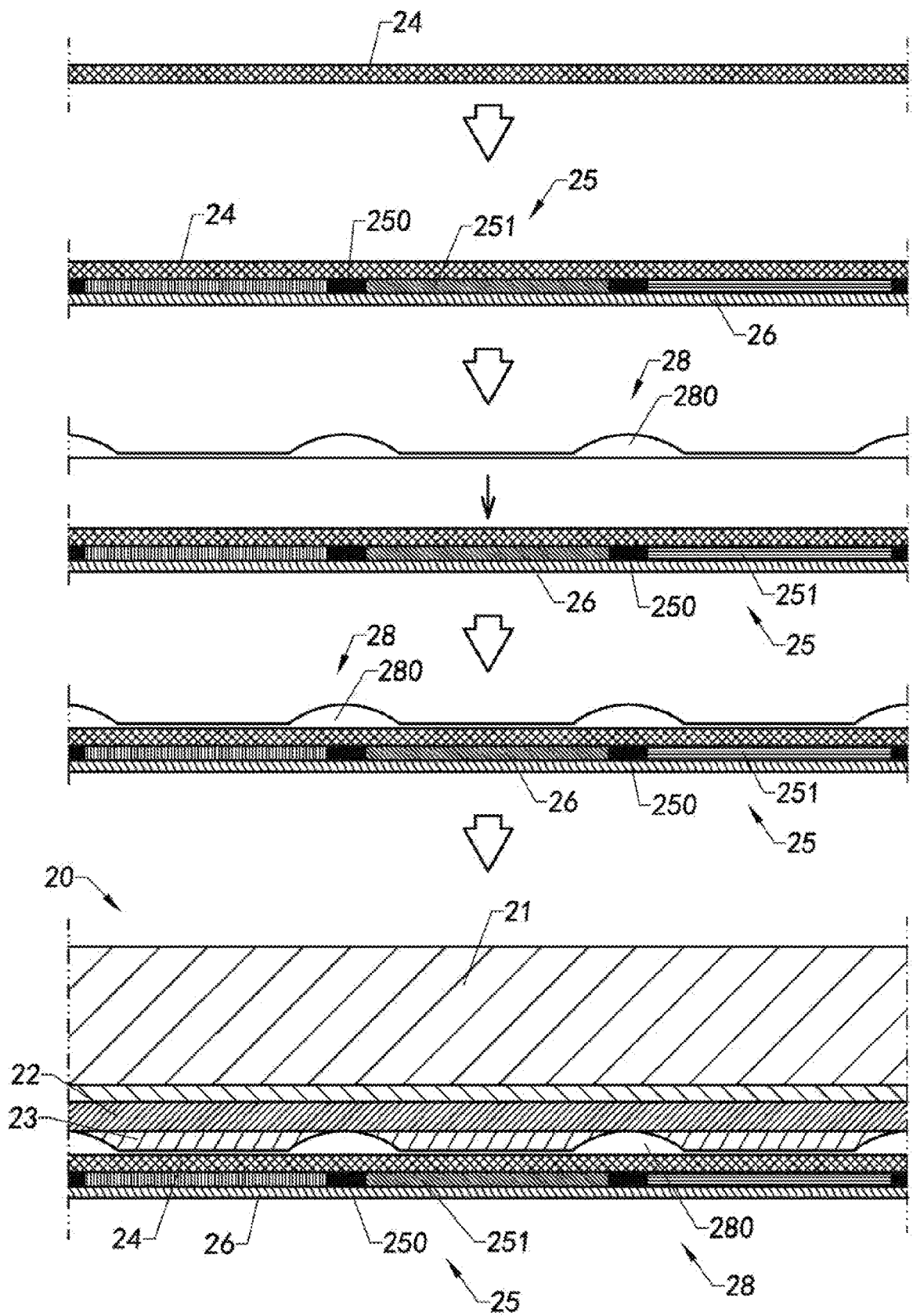
FIG. 16 is a schematic diagram of yet another preparation process of the display screen according to an embodiment of the present application.

FIG. 16 is a schematic diagram of yet another preparation process of the display screen 20 according to an embodiment of the present application. As shown in FIG. 16, in the preparation process, the circuit driving layer 26 is first pre-prepared, and the pixel layer 25 is formed on the circuit driving layer 26, wherein the circuit driving layer 26 is electrically connected to the pixel layer 25 to drive the pixel layer 25 to operate. Those skilled in the art should know that at present, the mainstream production process of the pixel layer 25 in the OLED display screen is the evaporation process. In simple terms, the evaporation process is to use a method such as electric current heating, electron beam bombardment heating and laser heating in a vacuum to evaporate a material to be evaporated into atoms or molecules, which then move in a straight line with a larger free path, and collide with a surface of a substrate and condense to form a thin film. In addition, besides the evaporation process for "evaporating" each pixel 251 into the OLED screen, the printing process can also be used, that is, an organic material thin film of a display device is prepared in a printing manner.

As shown in FIG. 16, further, an encapsulation layer 24 is integrally formed on the pixel layer 25 to encapsulate the pixel layer 25 through the encapsulation layer 24. Further, the microlens layer 28 with a film structure is pre-prepared, and the microlens layer 28 is attached to a top surface of the encapsulation layer 24. Particularly, in the embodiment of the present application, with an attaching position of the microlens layer 28 and the arrangement of various microlens units 280 of the microlens layer 28, when the microlens layer 28 is attached to the encapsulation layer 24, each microlens unit 280 of the microlens layer 28 corresponds to each gap 250 between the pixels 251 so as to increase the light transmittance of the display screen 20.

As shown in FIG. 16, further, the polarizing layer 23, the touch layer 22 and the cover plate layer 21 are formed in sequence on the microlens layer 28 to form the display screen 20 in a combined manner.

Optionally, a back plate layer 27 provided with an opening hole 270 can further be attached to a bottom side of the circuit driving layer 26 to enhance the structural strength of the display screen 20 through the back plate layer 27. Particularly, the opening hole 270 of the back plate layer 27 is formed at a light transmitting position of the display screen 20.

It should be understood that the microlens layer 28 is formed on a top side of the encapsulation layer 24, and the microlens units 280 correspond to the gaps 250 between various pixels 251 in the pixel layer 25, so that when light passes through the cover plate layer 21, the touch layer 22, and the polarizing layer 23 in sequence to reach the microlens layer 28, the microlens layer 28 converges the light, then the light passes through the encapsulation layer 24 to reach the gaps 250 between various pixels 251, and thus, larger amount of light can pass through the pixel layer 25 via the gaps 250. Further, the light passing through the pixel layer 25 can pass through the circuit driving layer 26 to reach a bottom side of the display screen 20. Thus, the overall light transmittance of the display screen 20 can be effectively increased.

Particularly, in the above preparation method, a refractive index of a material for forming the microlens layer 28 is higher than that of a material for forming the encapsulation layer 24.

Figure 17:
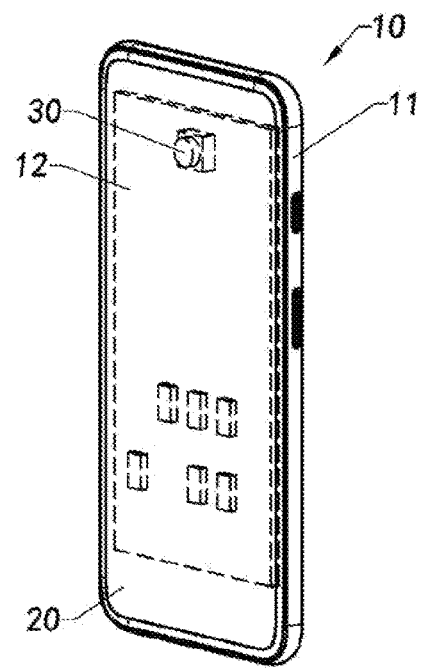
FIG. 17 is a specific example of a terminal device according to an embodiment of the present application.

Exemplary terminal device According to yet another aspect of the present application, the present application further provides a terminal device which can be in various forms, for example, the terminal device described in the present application can include mobile terminals such as mobile phones, smart phones, laptops, PDAs (personal digital assistants), PADs (tablet personal computers), PMPs (portable multimedia players), navigation apparatuses, and smart watches, and fixed terminals such as digital TVs and desk computers. The present application will be described below by setting the terminal device to be a mobile terminal and assuming the mobile terminal to be a smart phone (as shown in FIG. 17). However, it will be understood by those skilled in the art that the configuration according to the implementations of the present application can also be applied to a fixed type terminal in addition to elements specifically for mobile purposes. To facilitate understanding and description, the embodiments of the present application are all described by taking a smart phone as an example, and other application scenarios may refer to each other.

FIG. 17 is a specific example of a terminal device according to an embodiment of the present application, wherein in the specific example, the terminal device is implemented as a smart phone. As shown in FIG. 17, the terminal device includes a terminal main body 10, a camera module 30, and the above display screen 20.

The terminal main body 10 includes a housing 11 configured to form an outer shape of the terminal device, and a mainboard 12 used to mount components of a control circuit and a power supply circuit of the terminal device, wherein a size of the mainboard 12 is smaller than that of an accommodating space defined by the housing 11, so that the mainboard 12 can be "horizontally" mounted inside the housing 11. The display screen 20 is mounted inside the housing 11, and serves as a display module of the terminal device, wherein the display device 20 is electrically connected to the mainboard 12, so that the display screen 20 is powered by the mainboard 12 to realize an image display function. Particularly, in the embodiment of the present application, the display screen 20 is mounted at a top opening of the housing 11 so as to define a top surface of the terminal device by the display screen 20, and the camera module 30 is provided below the display screen 20 and accommodated in the housing 11, and serves as a camera module of the terminal device.

It should be understood that when the camera module 30 is provided below the display screen 20, a screen-to-body ratio (a ratio of the display screen 20 to the top surface of the terminal device) of the terminal device can be further increased (can be increased to a limitation of 100%). In other words, in the embodiment of the present application, the camera module 30 is configured as an under-screen camera module 30, which, together with the display screen 20, is mounted at different height positions of the housing 11, so that the camera module 30 is free from being an obstacle to increase the screen-to-body ratio.

Preferably, in the embodiment of the present application, the housing 11 adopts a "narrow" frame design, that is, width sizes of edges of the housing 11 can be ignored relative to a width size of the display screen 20. Thus, the screen-to-body ratio of the terminal device can be further increased (can be increased to a limitation of 100%).

Figure 18:
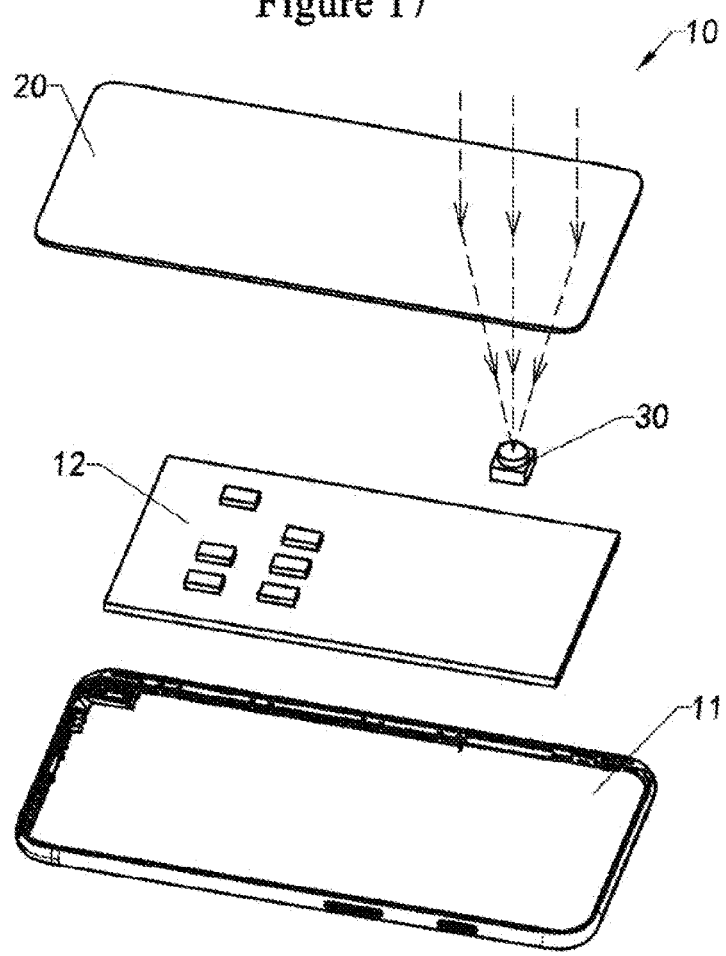
FIG. 18 is a schematic diagram of an imaging path of a camera module in the terminal device according to an embodiment of the present application.

It should be noted that in the embodiment of the present application, the camera module 30 is provided below the display screen 20. As previously described, an essential technical problem of the conventional terminal device which cannot implement the technical solution of the "under-screen camera module 30" is that: when the camera module 30 is provided below the display screen 20, it cannot collect sufficient amount of imaging light from the outside, which makes an imaging function of the camera module 30 difficult to achieve. Accordingly, in the embodiment of the present application, the light transmittance of the display screen 20 is effectively increased by additionally providing a microlens layer 28 in the display screen 20, and a position where the camera module 30 is mounted below the display screen 20 corresponds to a position where the microlens layer 28 is located in the display screen 20, and thus, when the camera module 30 is provided below the display screen 20, imaging light from the outside can still pass through the display screen 20 (from its front face to its rear face) to reach the camera module 30 for imaging, as shown in FIG. 18.

Specifically, when the display screen 20 is implemented as the display screens 20 shown in FIG. 2 and FIG. 6, an imaging path (or a photosensitive path) of the camera module 30 is that: first, light from the outside passes through the cover plate layer 21, the touch layer 22, the polarizing layer 23 and the encapsulation layer 24 of the display screen 20 to reach the microlens layer 28 provided on the pixel layer 25, wherein each microlens unit 280 of the microlens layer 28 corresponds to each gap 250 between the pixels 251 in the pixel layer 25; then, the light reaching the microlens layer 28 is refracted at each microlens unit 280 and converged to the corresponding gap 250 between the pixels 251, so that larger amount of light can pass through the pixel layer 25 via the gaps 250 between the pixels 251; and then, the light passing through the pixel layer 25 can further pass through the circuit driving layer 26 and is collected by the camera module 30 provided below the circuit driving layer 26 to perform an imaging reaction.

Specifically, when the display screen 20 is implemented as the display screens 20 shown in FIG. 7 to FIG. 9, an imaging path (or a photosensitive path) of the camera module 30 is that: first, light from the outside passes through the cover plate layer 21, the touch layer 22 and the polarizing layer 23 of the display screen 20 to reach the microlens layer 28 provided on the encapsulation layer 24, wherein each microlens unit 280 of the microlens layer 28 corresponds to each gap 250 between the pixels 251 in the pixel layer 25 and they are separated by the encapsulation layer 24; then, the light reaching the microlens layer 28 is refracted at each microlens unit 280 and converged to the corresponding gap 250 between the pixels 251; then, the converged light passes through the encapsulation layer 24 and enters the corresponding gaps 250 between pixels 251, by this way, larger amount of light can pass through the pixel layer 25 via the gaps 250 between the pixels 251; and then, the light passing through the pixel layer 25 can further pass through the circuit driving layer 26 and is collected by the camera module 30 provided below the circuit driving layer 26 to perform an imaging reaction.

It is worthwhile to note that when the display screen 20 is implemented as the display screen 20 shown in FIG. 3 (that is, the display screen 20 further includes a back plate layer 27 provided with an opening hole 270), an imaging path (or a photosensitive path) of the camera module 30 is that: first, light from the outside passes through the cover plate layer 21, the touch layer 22, the polarizing layer 23 and the encapsulation layer 24 of the display screen 20 to reach the microlens layer 28 provided on the pixel layer 25, wherein each microlens unit 280 of the microlens layer 28 corresponds to each gap 250 between the pixels 251 in the pixel layer 25; then, the light reaching the microlens layer 28 is refracted at each microlens unit 280 and converged to the corresponding gap 250 between the pixels 251, so that larger amount of light can pass through the pixel layer 25 via the gaps 250 between the pixels 251; and then, the light passing through the pixel layer 25 can further pass through the circuit driving layer 26 and the opening hole 270 of the back plate layer 27, and is collected by the camera module 30 provided at a bottom of the display screen 20 to perform an imaging reaction.

Or, an imaging path (or a photosensitive path) of the camera module 30 is that: first, light from the outside passes through the cover plate layer 21, the touch layer 22 and the polarizing layer 23 of the display screen 20 to reach the microlens layer 28 provided on the encapsulation layer 24, wherein each microlens unit 280 of the microlens layer 28 corresponds to each gap 250 between the pixels 251 in the pixel layer 25 and they are separated by the encapsulation layer 24; then, the light reaching the microlens layer 28 is refracted at each microlens unit 280 and converged to the corresponding gap 250 between the pixels 251; then, the converged light passes through the encapsulation layer 24 and enters the corresponding gaps 250 between pixels 251, by this way, larger amount of light can pass through the pixel layer 25 via the gaps 250 between the pixels 251; and then, the light passing through the pixel layer 25 can further pass through the circuit driving layer 26 and the opening hole 270 of the back plate layer 27, and is collected by the camera module 30 provided at a bottom of the display screen 20 to perform an imaging reaction.

Particularly, when the display screen 20 includes the back plate layer 27 provided at the bottom, optionally, the camera module 30 can be mounted below the display screen 20 and corresponds to the opening hole 270 of the back plate layer 27; or, when a size of the opening hole 270 matches that of the camera module 30, the camera module 30 can be directly mounted in the opening hole 270 of the back plate layer 27, wherein by mounting the camera module 30 in the opening hole 270 of the back plate layer 27, the light passing through the circuit driving layer 26 can be directly collected by the camera module 30, and an overall height size of the terminal device can be reduced, which will be further described below.

Although, due to the display screen 20 with relatively high light transmittance, the camera module 30 can be configured as an under-screen camera module 30, thereby further increasing the screen-to-body ratio of the terminal device. However, in a spatial relationship, because the camera module 30 is provided below the display screen 20, and both of them are accommodated in the housing 11 of the terminal device at the same time, a height size of the housing 11 needs to increase, that is, the overall height size of the terminal device needs to increase, which is inconsistent with the current trend of thin terminal devices.

Figure 19:
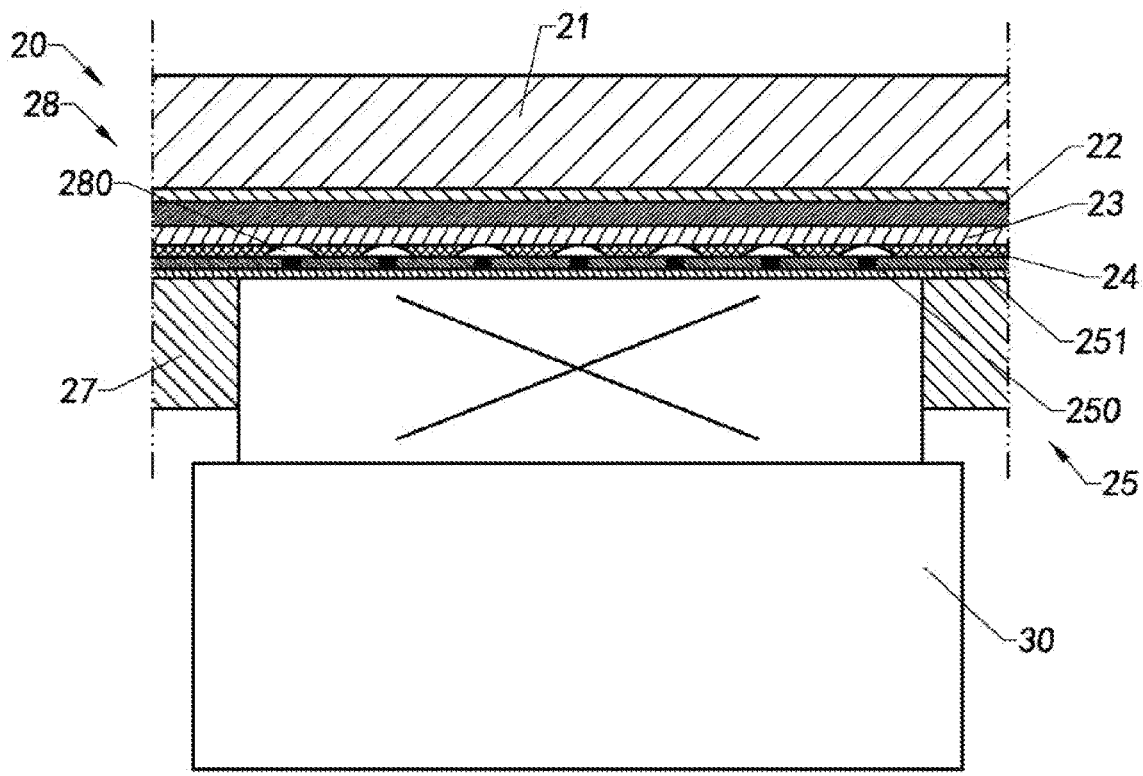
FIG. 19 is another schematic diagram of the terminal device according to an embodiment of the present application.

Accordingly, a technical solution of reducing the overall height size of the terminal device is previously provided. Specifically, when the display screen 20 is implemented as the display screen 20 shown in FIG. 3, that is, the display screen 20 includes a back plate layer 27 provided with an opening hole 270, wherein the opening hole 270 corresponds to the microlens layer 28. Particularly, in order to reduce the overall height size of the terminal device, preferably, a size of the opening hole 270 of the back plate layer 27 matches that of the camera module 30, so that the camera module 30 can be directly mounted in the opening hole 270 of the back plate layer 27, as shown in FIG. 19. In other words, in this case, the opening hole 270 of the back plate layer 27 is not only a light transmitting hole of the display screen 20, but also a mounting reference hole of the camera module 30. It should be understood that when the camera module 30 is mounted in the opening hole 270 of the back plate layer 27, the overall height sizes of the display screen 20 and the camera module 30 can be effectively reduced, thereby reducing the overall height size of the terminal device.

Figure 20:
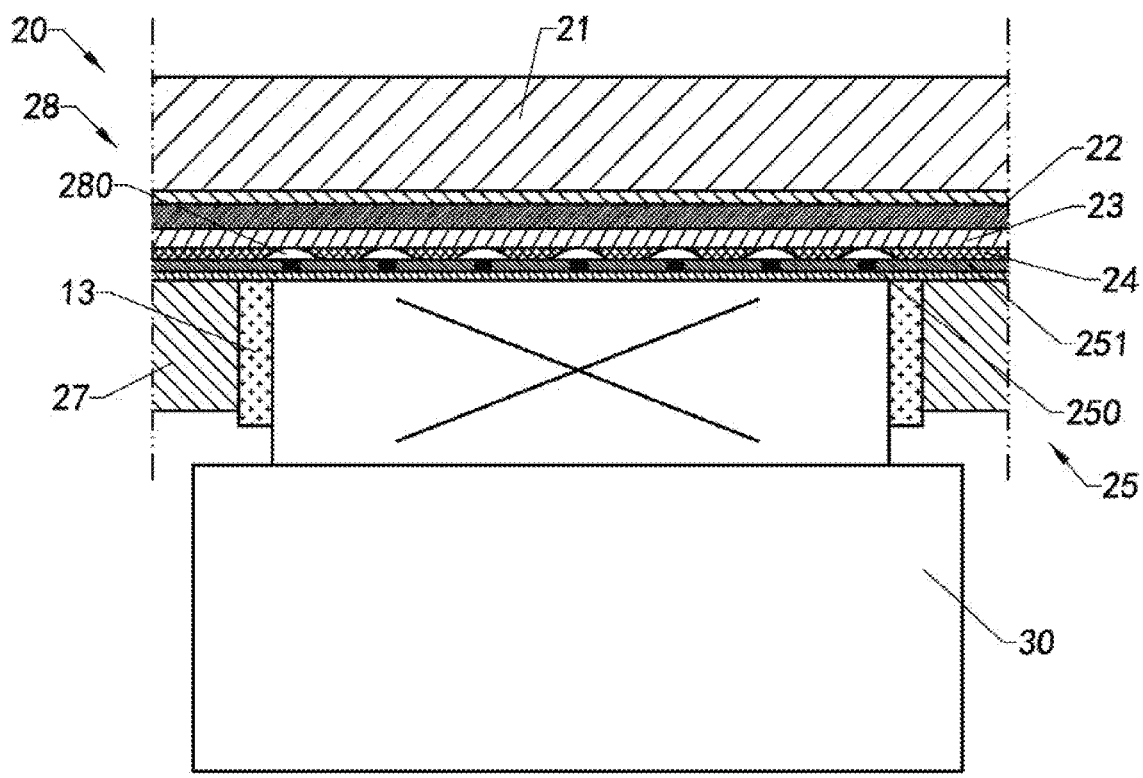
FIG. 20 is yet another schematic diagram of the terminal device according to an embodiment of the application.

It should be understood that when the size of the opening hole 270 of the back plate layer 27 does not match that of the camera module 30, for example, when the size of the opening hole 270 is larger than that of the camera module 30, the terminal device can be further provided with an auxiliary mounting piece 13, wherein the auxiliary mounting piece 13 is mounted in the opening hole 270 of the back plate, and is used to mount the camera module 30 therein, as shown in FIG. 20. For example, the auxiliary mounting piece 13 can be implemented as a tubular piece with a through hole, wherein an outer diameter of the tubular piece is equal to an aperture diameter of the opening hole 270, an inner diameter of the through hole of the tubular piece matches the size of the camera module 30, so that the camera module 30 can still be mounted in the opening hole 270 of the back plate layer 27 by using the tubular piece. Preferably, a height of the tubular piece is equal to or slightly smaller than that of the opening hole 270, and thus, when the camera module 30 is mounted in the through hole of the tubular piece, the overall height sizes of the camera module 30 and the display screen 20 can be reduced, thereby directly mounting the camera module 30 in the opening hole 270 of the back plate layer 27.

To further reduce the overall height size of the terminal device, preferably, in the embodiment of the present application, a camera module 30 with a relatively low height size is adopted.

Figure 21:
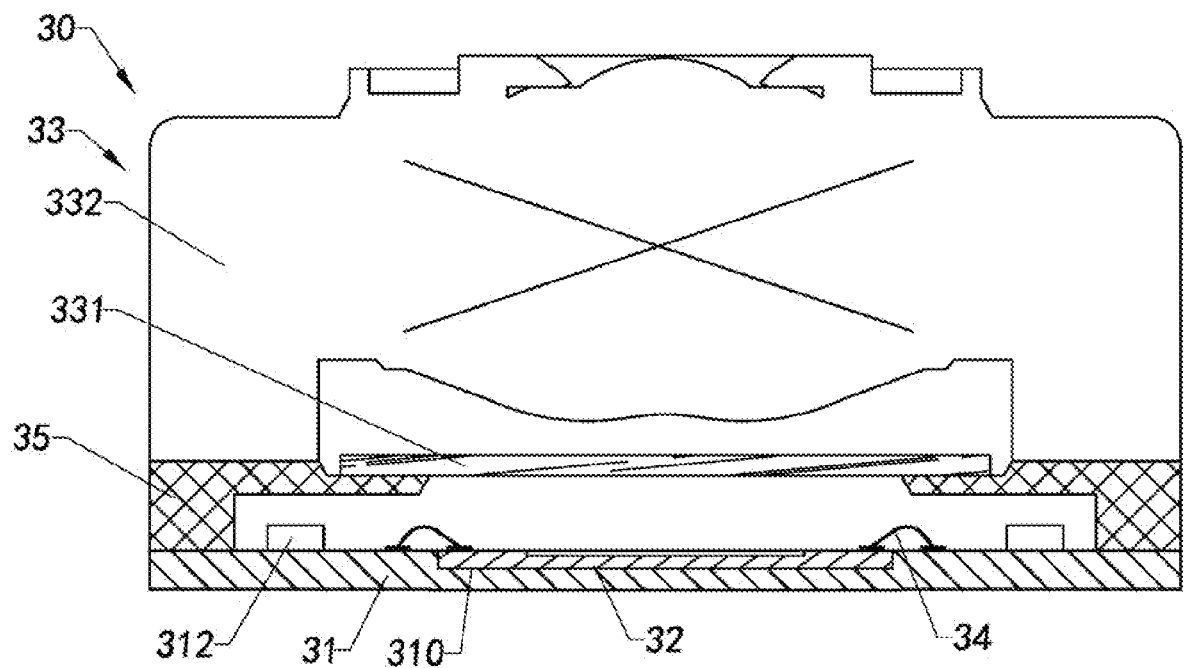
FIG. 21 is a specific example of a camera module according to an embodiment of the present application.

FIG. 21 is a specific example of the camera module 30 according to an embodiment of the present application. As shown in FIG. 21, in the specific example, the camera module 30 includes a circuit board 31, a photosensitive chip 32, and a light transmitting component 33, wherein the circuit board 31 has a groove 310, the photosensitive chip 32 is provided in the groove 310 and electrically connected to the circuit board 31, and the light transmitting component 33 is located on a photosensitive path of the photosensitive chip 32. Thus, imaging light passing through the display screen 20 first reaches the light transmitting component 33 and then the photosensitive chip 32, and is sensed by the photosensitive chip 32 to perform an imaging reaction.

Those skilled in the art should know that in an existing COB process-based camera module, a circuit board has a flat surface, and moreover, a photosensitive chip is directly attached to and is electrically connected to the flat surface of the circuit board. Each camera module has a preset optical back focus requirement, and therefore, a mounting reference height of the photosensitive chip directly determines the overall height size of the camera module 30.

Accordingly, compared with the existing COB process-based camera module, in the specific example, the circuit board 31 is provided with the groove 310 to reduce the mounting reference height of the photosensitive chip 32 through the groove 310. In other words, in the embodiment of the present application, a top surface of the circuit board 31 is a non-flat surface, wherein an area for mounting the photosensitive chip 32 of the circuit board 31 recesses downward to reduce the mounting reference height of the photosensitive chip 32. It should be understood that under the premise that the optical back focus requirement remains unchanged, a mounting height of an optical lens 332 relative to the circuit board 31 can be reduced, and thus the overall height size of the camera module 30 can be reduced.

Preferably, in the specific example, a size of the groove 310 is consistent with that of the photosensitive chip 32, and thus the groove 310 itself can be used to position and limit the photosensitive chip 32. Specifically, in the process of mounting the photosensitive chip 32 in the groove 310, the photosensitive chip 32 can be directly embedded into the groove 310 snugly, and it is unnecessary to continuously calibrate and position a mounting position of the photosensitive chip on the circuit board as in the existing COB process-based camera module. Further, after the photosensitive chip 32 is mounted in the groove 310 and electrically connected to the circuit board 31, the photosensitive chip 32 is "limited" in the groove 310 to prevent the photosensitive chip 32 from being separated or shifted from the groove 310.

Further, the camera module 30 further includes a group of leads 34, wherein after the photosensitive chip 32 is attached in the groove 310 of the circuit board 31, electrical connection between the photosensitive chip 32 and the circuit board 31 is realized through the leads 34. Specifically, each lead 34 is bent and extended between the photosensitive chip 32 and the circuit board 31 to connect the photosensitive chip 32 to the circuit board 31 through the lead 34. Thus, the circuit board 31 can supply power to the photosensitive chip 32 via the leads 34, and the photosensitive chip 32 can transmit collected signals via the leads 34.

It is worthwhile to note that in the specific example, the type of the lead 34 is not limited in the present application, for example, the lead 34 may be a gold wire, a silver wire or a copper wire. Moreover, the leads 34 can be mounted between the circuit board 31 and the photosensitive chip 32 by a "wire bonding" process to realize the electrical connection therebetween.

Specifically, the "wire bonding" process is generally divided into two types: a "forward wire bonding" process and a "reverse wire bonding" process. The "forward wire bonding" process refers to that in the process of laying the leads 34, one end of the lead 34 is first formed at a conductive end of the circuit board 31, then the lead 34 is bent and extended, and finally the other end of the lead 34 is formed at a conductive end of the photosensitive chip 32. By this way, the leads 34 are formed between the photosensitive chip 32 and the circuit board 31. The "reverse wire bonding" process refers to that in the process of laying the leads 34, one end of the lead 34 is formed at the conductive end of the photosensitive chip 32, then the lead 34 is bent and extended, and finally the other end of the lead 34 is formed at the conductive end of the circuit board 31. By this way, the leads 34 are formed between the photosensitive chip 32 and the circuit board 31. It is worthwhile to note that a height of an upward protrusion of the lead 34 formed by the "reverse wire bonding" process is lower than that of an upward protrusion of the lead 34 formed by the "forward wire bonding" process. Therefore, preferably, in the specific implementation, the leads 34 are formed by the "reverse wire bonding" process.

Further, the camera module 30 further includes a base 35, wherein the base 35 is provided on the circuit board 31 to support the light transmitting component 33. The light transmitting component 33 includes a color filtering element 331 and an optical lens 332, wherein the color filtering element 331 and the optical lens 332 are in sequence provided on the photosensitive path of the photosensitive chip 32.

Specifically, in the specific example, the base 35 can be implemented as a conventional plastic support, which is pre-prepared and then attached to a top surface of the circuit board 31; or, the base 35 can be implemented as a molded base, which can be integrally formed at a corresponding position of the circuit board 31 and/or the photosensitive chip 32 by an MOB (Molding on Board) or MOC (molding on Chip) process. Those skilled in the art should know that the MOB (Molding on Board) process refers to that the molded base is integrally formed on the circuit board 31 by a molding process, wherein the formed molded base integrally covers the circuit board 31 and electrical elements 312 on the circuit board 31. The MOC process refers to that the molded base is integrally formed on the circuit board 31 by a molding process, wherein besides the circuit board 31 and the electrical elements 312 on the circuit board 31, the formed molded base further covers at least part of the leads 34, or, covers the leads 34 and at least part of the photosensitive chip 32 (wherein the at least part of the photosensitive chip 32 is a non-photosensitive area of the photosensitive chip 32).

In the specific example, the color filtering element 331 is provided between the optical lens 332 and a photosensitive element, so that light entering the camera module 30 via the optical lens 332 is filtered by the color filtering element 331, and then is received and photo-electrically converted by the photosensitive chip 32, thereby improving the imaging quality of the camera module 30. For example, the color filtering element 331 can be used to filter infrared rays in the light entering the camera module 30 via the optical lens 332.

Those skilled in the art should know that the color filtering element 331 can be implemented into different types, which include but are not limited to, an infrared ray cut-off filter, a full-transmittance spectral filter, other filters, and a combination of multiple filters. Specifically, for example, when the color filtering element 331 is implemented as a combination of an infrared ray cut-off filter and a full-transmittance spectral filter, that is, the infrared ray cut-off filter and the full-transmittance spectral filter can be switched to be selectively located on the photosensitive path of the photosensitive chip 32, and by this way, when the camera module 30 is used in an environment with sufficient amount of light such as daytime, the infrared ray cut-off filter can be switched to the photosensitive path of the photosensitive chip 32 to filter infrared rays in light which is reflected by an object and enters the camera module 30 through the infrared ray cut-off filter. Moreover, when the camera module 30 is used in an environment with dark light such as night, the full-transmittance spectral filter can be switched to the photosensitive path of the photosensitive chip 32 to allow infrared rays in light which is reflected by an object and enters the camera module 30 to be transmitted.

It is worthwhile to note that the color filtering element 331 can also be provided at another position on the photosensitive path of the photosensitive chip 32, for example, the color filtering element 331 is provided at a bottom side of the optical lens 332, or a bottom part of the optical lens 332, which is not limited in the present application.

In addition, it is worthwhile to note that in the specific example, the camera module 30 can be implemented as a fixed focus module or a dynamic focus module, wherein when the camera module 30 is a dynamic focus module, the camera module 30 further includes a driver 36 connected to the circuit board 31, and the driver 36 is used to controllably drive the lens to move so as to realize auto-focus (Auto-Focus).

Figure 22:
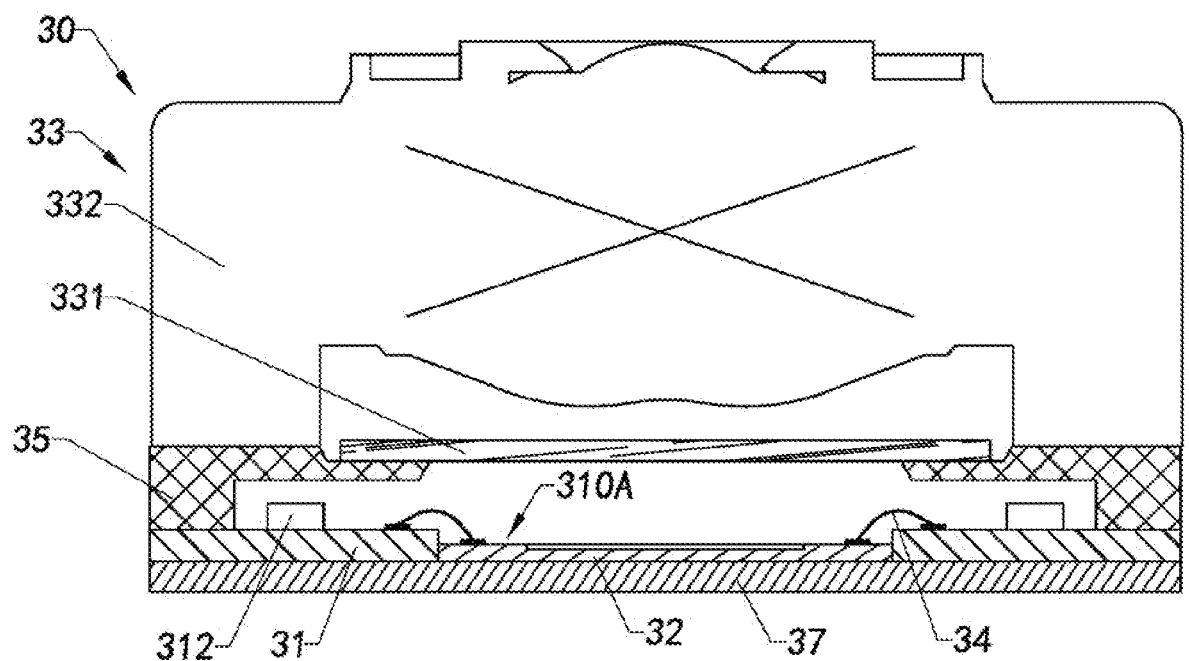
FIG. 22 is another specific example of a camera module according to an embodiment of the application.

FIG. 22 is another specific example of the camera module 30 according to an embodiment of the present application, wherein the camera module 30 in FIG. 22 is a variant implementation mode of the camera module 30 in FIG. 21.

Specifically, as shown in FIG. 22, in the specific example, the camera module 30 includes a circuit board 31, a photosensitive chip 32, a light transmitting component 33, and a reinforcement plate 37, wherein the circuit board 31 has an opening hole 310A penetrating through the circuit board 31, the reinforcement plate 37 is attached to a bottom surface of the circuit board 31, the photosensitive chip 32 is provided in the opening hole 310A of the circuit board 31 and is attached to the reinforcement plate 37, the photosensitive chip 32 can be conductively connected to the circuit board 31, and the light transmitting component 33 is provided on a photosensitive path of the photosensitive chip 32. Thus, imaging light passing through the display screen 20 first reaches the light transmitting component 33 and then the photosensitive chip 32, and is sensed by the photosensitive chip 32 to perform an imaging reaction.

In other words, compared with the camera module 30 in FIG. 21, in the specific example, the circuit board 31 has the opening hole 310A penetrating through the circuit board 31, so that a mounting reference height of the photosensitive chip 32 is reduced through the opening hole 310A. In other words, in the embodiment of the present application, a top surface of the circuit board 31 is a non-flat surface, wherein an area for mounting the photosensitive chip 32 of the circuit board 31 recesses downward and penetrates through the circuit 31, so that the mounting reference height of the photosensitive chip 32 can be further reduced. It should be understood that each camera module has a preset optical back focus requirement, so that under the premise that the optical back focus requirement remains unchanged, a mounting height of the optical lens 332 relative to the circuit board 31 can be further reduced, thereby further reducing the overall height size of the camera module 30.

As shown in FIG. 22, it should be specially noted that in the specific example, a bottom surface of the photosensitive chip 32 is flush with a bottom surface of the circuit board 31, that is, the mounting reference height of the photosensitive chip 32 is equal to a height of the bottom surface of the circuit board 31, so that under the premise of ensuring the preset optical back focus, a mounting position of the photosensitive chip 32 can be further lowered, thereby further reducing the overall height size of the camera module 30.

Preferably, in the specific example, a size of the opening hole 310A is consistent with that of the photosensitive chip 32, and thus the opening hole 310 itself can be used to position and limit the photosensitive chip 32. Specifically, in the process of mounting the photosensitive chip 32 in the opening hole 310A, the photosensitive chip 32 can be directly embedded into the opening hole 310 snugly and finally attached to the reinforcement plate 37, and it is unnecessary to continuously calibrate and position the mounting position of the photosensitive chip 32 on the circuit board 31 as in the existing COB process-based camera module. Further, after the photosensitive chip 32 is mounted in the opening hole 310A and electrically connected to the circuit board 31, the photosensitive chip 32 is "limited" in the opening hole 310A to prevent the photosensitive chip 32 from being separated or shifted from the opening hole 310.

Further, the camera module 30 further includes a group of leads 34, wherein after the photosensitive chip 32 is mounted in the opening hole 310A of the circuit board 31, electrical connection between the photosensitive chip 32 and the circuit board 31 is realized through the leads 34. Specifically, each lead 34 is bent and extended between the photosensitive chip 32 and the circuit board 31 to connect the photosensitive chip 32 to the circuit board 31 through the lead 34. Thus, the circuit board 31 can supply power to the photosensitive chip 32 through the leads 34, and the photosensitive chip 32 can transmit collected signals through the leads 34.

It is worthwhile to note that in the specific example, the type of the lead 34 is not limited in the present application, for example, the lead 34 may be a gold wire, a silver wire or a copper wire. Moreover, the leads 34 can be mounted between the circuit board 31 and the photosensitive chip 32 by a "wire bonding" process to realize the electrical connection therebetween.

Specifically, the "wire bonding" process is generally divided into two types: a "forward wire bonding" process and a "reverse wire bonding" process. The "forward wire bonding" process refers to that in the process of laying the leads 34, one end of the lead 34 is first formed at a conductive end of the circuit board 31, then the lead 34 is bent and extended, and finally the other end of the lead 34 is formed at a conductive end of the photosensitive chip 32. By this way, the leads 34 are formed between the photosensitive chip 32 and the circuit board 31. The "reverse wire bonding" process refers to that in the process of laying the leads 34, one end of the lead 34 is formed at the conductive end of the photosensitive chip 32, then the lead 34 is bent and extended, and finally the other end of the lead 34 is formed at the conductive end of the circuit board 31. By this way, the leads 34 are formed between the photosensitive chip 32 and the circuit board 31. It is worthwhile to note that a height of an upward protrusion of the lead 34 formed by the "reverse wire bonding" process is lower than that of an upward protrusion of the lead 34 formed by the "forward wire bonding" process. Therefore, preferably, in the specific implementation, the leads 34 are formed by the "reverse wire bonding" process.

Further, the camera module 30 further includes a base 35, wherein the base 35 is provided on the circuit board 31 to support the light transmitting component 33. The light transmitting component 33 includes a color filtering element 331 and an optical lens 332, wherein the color filtering element 331 and the optical lens 332 are in sequence provided on the photosensitive path of the photosensitive chip 32.

Specifically, in the specific example, the base 35 can be implemented as a conventional plastic support, which is pre-prepared and then attached to a top surface of the circuit board 31; or, the base 35 can be implemented as a molded base, which can be integrally formed at a corresponding position of the circuit board 31 and/or the photosensitive chip 32 by an MOB (Molding on Board) or MOC (molding on Chip) process. Those skilled in the art should know that the MOB (Molding on Board) process refers to that the molded base is integrally formed on the circuit board 31 by a molding process, wherein the formed molded base integrally covers the circuit board 31 and electrical elements 312 on the circuit board 31. The MOC process refers to that the molded base is integrally formed on the circuit board 31 by a molding process, wherein besides the circuit board 31 and the electrical elements 312 on the circuit board 31, the formed molded base further covers at least part of the leads 34, or, covers the leads 34 and at least part of the photosensitive chip 32 (wherein the at least part of the photosensitive chip 32 is a non-photosensitive area of the photosensitive chip 32).

In the specific example, the color filtering element 331 is provided between the optical lens 332 and the photosensitive element, so that light entering the camera module 30 via the optical lens 332 is filtered by the color filtering element 331, and then is received and photo-electrically converted by the photosensitive chip 32, thereby improving the imaging quality of the camera module 30. For example, the color filtering element 331 can be used to filter infrared rays in the light entering the camera module 30 via the optical lens 332.

Those skilled in the art should know that the color filtering element 331 can be implemented into different types, which include but are not limited to, an infrared ray cut-off filter, a full-transmittance spectral filter, other filters, and a combination of multiple filters. Specifically, for example, when the color filtering element 331 is implemented as a combination of an infrared ray cut-off filter and a full-transmittance spectral filter, that is, the infrared ray cut-off filter and the full-transmittance spectral filter can be switched to be selectively located on the photosensitive path of the photosensitive chip 32, and by this way, when the camera module 30 is used in an environment with sufficient amount of light such as daytime, the infrared ray cut-off filter can be switched to the photosensitive path of the photosensitive chip 32 to filter infrared rays in light which is reflected by an object and enters the camera module 30 through the infrared ray cut-off filter. Moreover, when the camera module 30 is used in an environment with dark light such as night, the full-transmittance spectral filter can be switched to the photosensitive path of the photosensitive chip 32 to allow infrared rays in light which is reflected by an object and enters the camera module 30 to be transmitted.

It is worthwhile to note that the color filtering element 331 can also be provided at another position on the photosensitive path of the photosensitive chip 32, for example, the color filtering element 331 is provided at a bottom side of the optical lens 332, or a bottom part of the optical lens 332, which is not limited in the present application.

It is also worthwhile to note that in the specific example, the camera module 30 can be implemented as a fixed focus module or a dynamic focus module, wherein when the camera module 30 is a dynamic focus module, the camera module 30 further includes a driver 36 electrically connected to the circuit board 31, and the driver 36 is used to controllably drive the lens to move so as to realize auto-focus (Auto-Focus).

Figure 23:
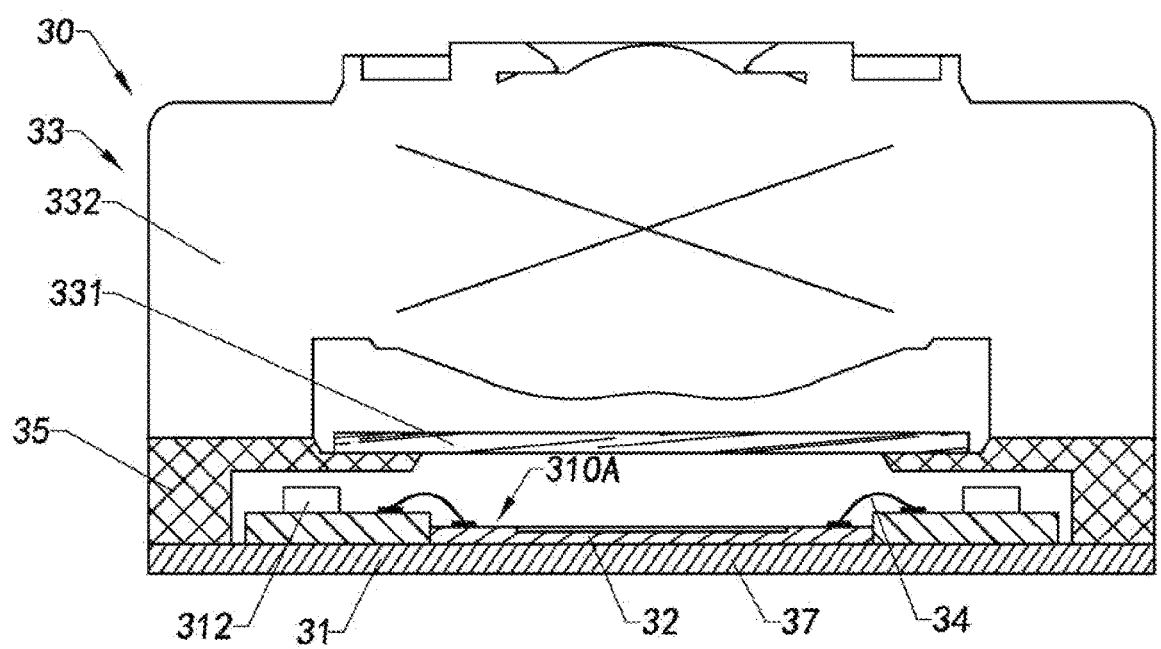
FIG. 23 is yet another specific example of a camera module according to an embodiment of the present application.

FIG. 23 is yet another specific example of the camera module 30 according to an embodiment of the present application, wherein the camera module 30 in FIG. 23 is a variant implementation mode of the camera module 30 in FIG. 22.

Specifically, compared with the camera module 30 in FIG. 22, in the specific example, the base 35 is directly provided on the reinforcement plate 37. In other words, in the specific example, a mounting reference height of the base 35 can be reduced, so that a mounting reference height of the optical lens 332 mounted on the base 35 can be reduced, thereby reducing the overall height size of the camera module 30.

Accordingly, in the specific embodiment, the base 35 can be implemented as a conventional plastic support, which is pre-prepared and then attached to a top surface of the reinforcement plate 37; or, the based 35 can be implemented as a molded base, which can be integrally formed at a corresponding position of the reinforcement plate 37, the circuit board 31 and/or the photosensitive chip 32 by an MOB (Molding on Board) or MOC (Molding on Chip) process. Those skilled in the art should know that the MOB (Molding on Board) process refers to that the molded base is integrally formed on the circuit board 31 by a molding process, wherein the formed molded base integrally covers the reinforcement plate 37, the circuit board 31, and electrical elements 312 on the circuit board 31. The MOC process refers to that the molded base is integrally formed on the circuit board 31 by a molding process, wherein besides the reinforcement plate 37, the circuit board 31 and the electrical elements 312 on the circuit board 31, the formed molded base further covers at least part of the leads 34, or, covers the leads 34 and at least part of the photosensitive chip 32 (wherein the at least part of the photosensitive chip 32 is a non-photosensitive area of the photosensitive chip 32).

Figure 24:
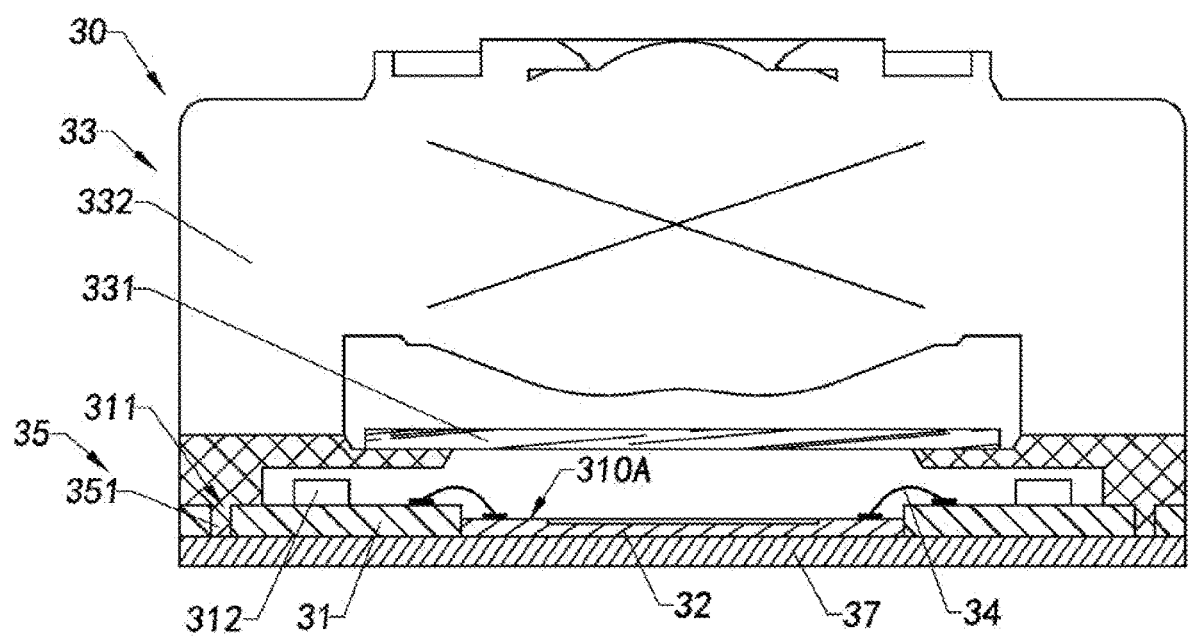
FIG. 24 is yet another specific example of a camera module according to an embodiment of the present application.

FIG. 24 is yet another specific example of the camera module 30 according to an embodiment of the present application, wherein the camera module 30 in FIG. 24 is anther variant implementation mode of the camera module 30 in FIG. 22.

Figure 25:
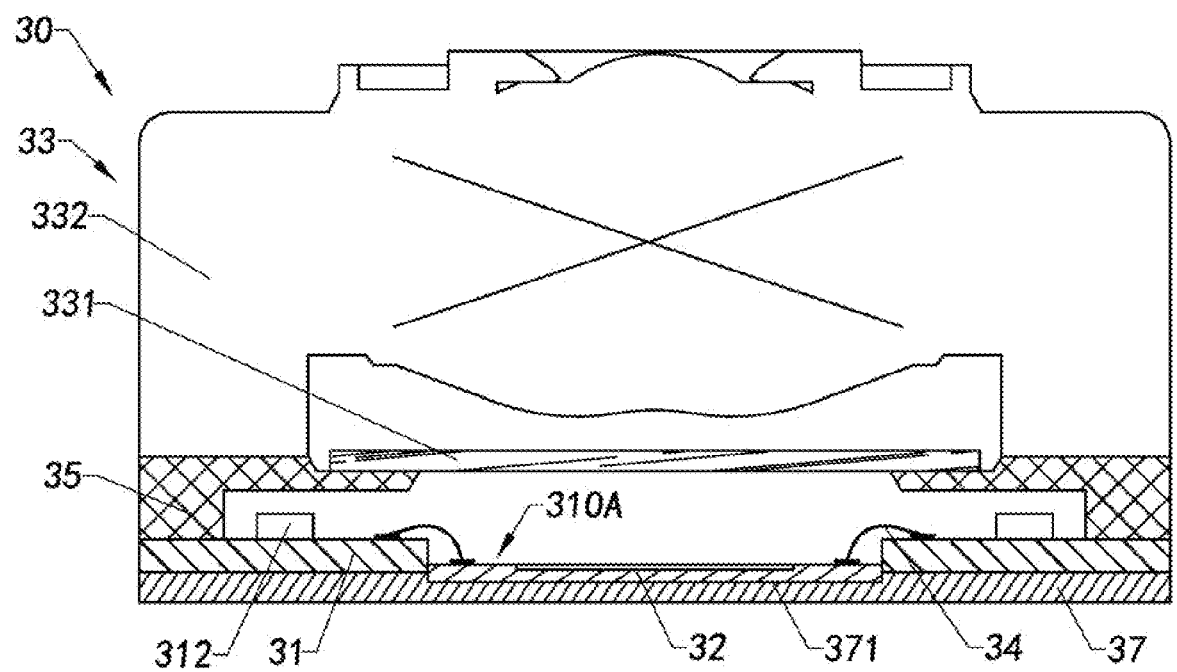
FIG. 25 is yet another specific example of a camera module according to an embodiment of the present application.
Figure 26:
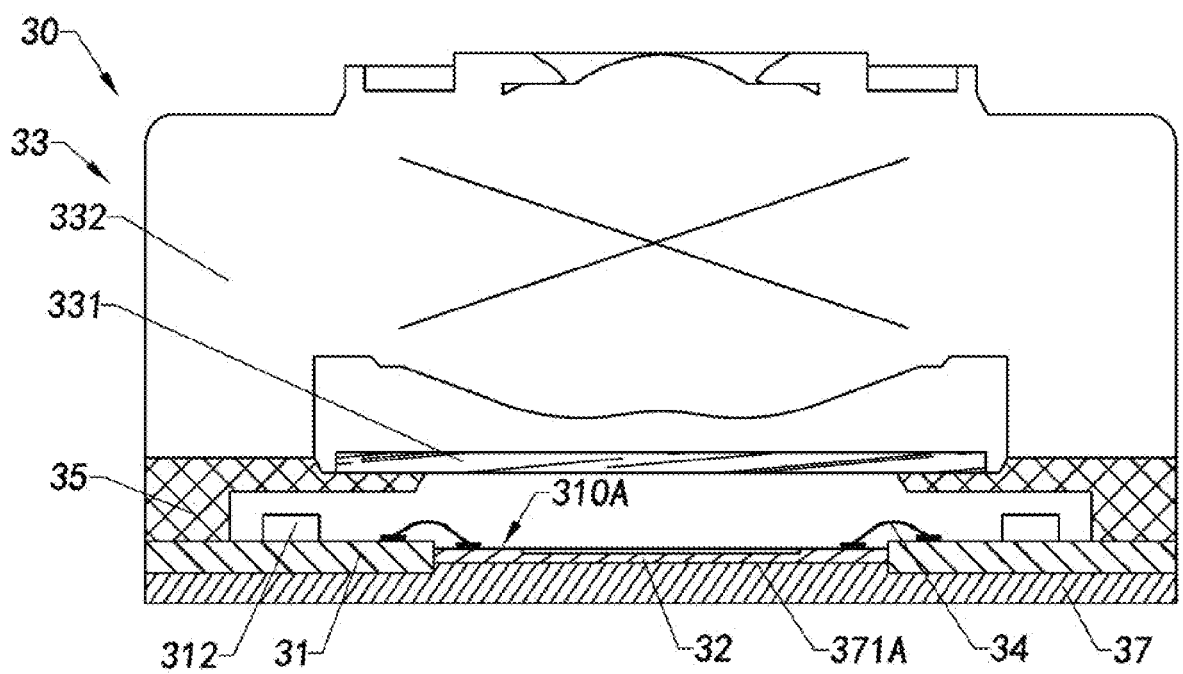
FIG. 26 is yet another specific example of a camera module according to an embodiment of the present application.

Specifically, compared with the camera module 30 in FIG. 22, in the specific example, the base 35 is provided with at least two positioning pillars 351 extending downward, the circuit board 31 is provided with at least two openings 311, and the positioning pillars 351 pass through the openings 311 and are set on the reinforcement plate 37. By this way, a mounting reference height of the base 35 can be reduced, thereby reducing the overall height size of the camera module 30. FIG. 25 and FIG. 26 are yet another specific examples of the camera module 30 according to embodiments of the present application, wherein the camera modules 30 in FIG. 25 and FIG. 26 are yet another variant implementation modes of the camera module 30 in FIG. 22.

As shown in FIG. 25 and FIG. 26, in the specific examples, a boss 371A or a groove 371 is provided at a position, corresponding to the opening hole 310A of the circuit board 31, of the reinforcement plate 37, so that a mounting reference height of the photosensitive chip 32 is adjusted through the boss 371A or the groove 371. In other words, in the specific examples, a bottom surface of the photosensitive chip 32 is not flush with that of the circuit board 31.

Specifically, as shown in FIG. 25, when the groove 371 is provided at the position, corresponding to the opening hole 310A of the circuit board 31, of the reinforcement plate 37, the mounting reference height of the photosensitive chip 32 is further reduced, so that under the premise of meeting the design requirement of the preset optical back focus, the overall height size of the camera module 30 can be further reduced. It should be noted that when the groove 371 is provided at the position, corresponding to the opening hole 310A of the circuit 31, of the reinforcement plate 37, the photosensitive chip 32 is attached to the reinforcement plate 37, and at this moment, the bottom surface of the photosensitive chip 32 is lower than that of the circuit board 31.

Specifically, as shown in FIG. 26, when the boss 371A is provided at the position, corresponding to the opening hole 310A of the circuit board 31, of the reinforcement plate 37, compared with the existing COB process-based camera module, the mounting reference height of the photosensitive chip 32 is reduced, so that under the premise of meeting the design requirement of the preset optical back focus, the overall height size of the camera module 30 can be reduced. It should be noted that when the boss 371A is provided at the position, corresponding to the opening hole 310A of the circuit board 31, of the reinforcement plate 37, the photosensitive chip 32 is attached to the reinforcement plate 37, and at this moment, the bottom surface of the photosensitive chip 32 is higher than that of the circuit board 31 but is lower than a top surface of the circuit board 31.

Figure 27:
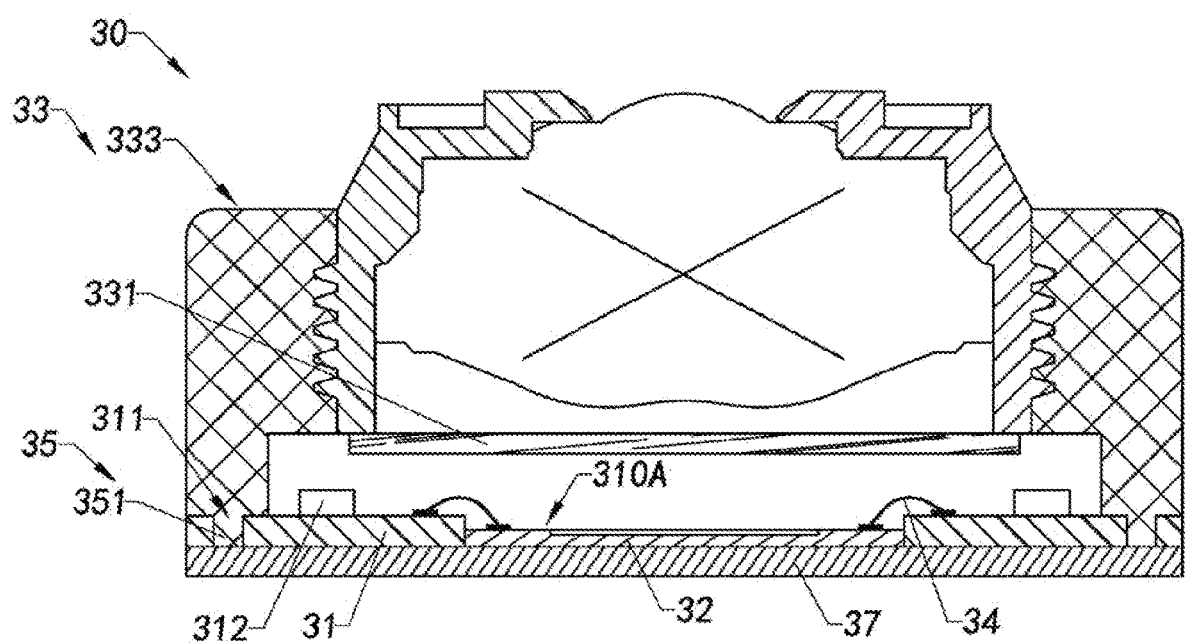
FIG. 27 is yet another specific example of a camera module according to an embodiment of the present application.

FIG. 27 is yet another specific example of the camera module 30 according to an embodiment of the present application, wherein the camera module 30 in FIG. 27 is a variant implementation mode of the camera module 30 in FIG. 24.

Specifically, as shown in FIG. 27, in the specific example, the camera module 30 includes a circuit board 31, a photosensitive chip 32, a base 35, an optical lens 332, a color filtering element 331, and a reinforcement plate 37, wherein the circuit board 31 is provided with an opening hole 310A penetrating through the circuit board 31, the reinforcement plate 37 is attached to a bottom surface of the circuit board 31, the photosensitive chip 32 is provided in the opening hole 310A of the circuit board 31 and attached to the reinforcement plate 37, the photosensitive chip 32 can be conductively connected to the circuit board 31, the color filtering element 331 and the optical lens 332 are in sequence provided on a photosensitive path of the photosensitive chip 32. Thus, imaging light passing through the display screen 20 first reaches the optical lens 332, then is filtered by the color filtering element 331, and reaches the photosensitive chip 32 to be sensed by the photosensitive chip 32 to perform an imaging reaction.

Particularly, in the specific embodiment, the optical lens 332 and the base 35 are of an integral structure, that is, the optical lens 332 and the base 35 are assembled into a whole before being assembled into the camera module 30. In other words, in the specific example, the optical lens 332 is an integrated lens 333, which is assembled with the base 35 to form one element unit. Further, in the specific example, the base 35 is provided with at least two positioning pillars extending downward, and the circuit board 31 is provided with at least two openings, and the positioning pillars penetrate through the openings and are set on the reinforcement plate 37. By this way, the integrated lens 333 and the photosensitive chip 32 have the same mounting reference face (i.e. a top surface of the reinforcement plate 37). Thus, under the premise of meeting the design requirement of the preset optical back focus, the overall height size of the camera module 30 can be reduced.

It is worthwhile to note that in the specific example of the present application, the integrated lens 333 can further include the color filtering unit 331, that is, in the specific implementation, the optical lens 332, the base 35 and the color filtering unit 331 are of an integral structure, that is, the optical lens 332, the base 35 and the color filtering unit 331 are assembled into a whole before being assembled into the camera module 30. Thus, an assembly method of the camera module 30 can be more compact, so that the overall height size of the camera module 30 can be reduced.

Figure 28:
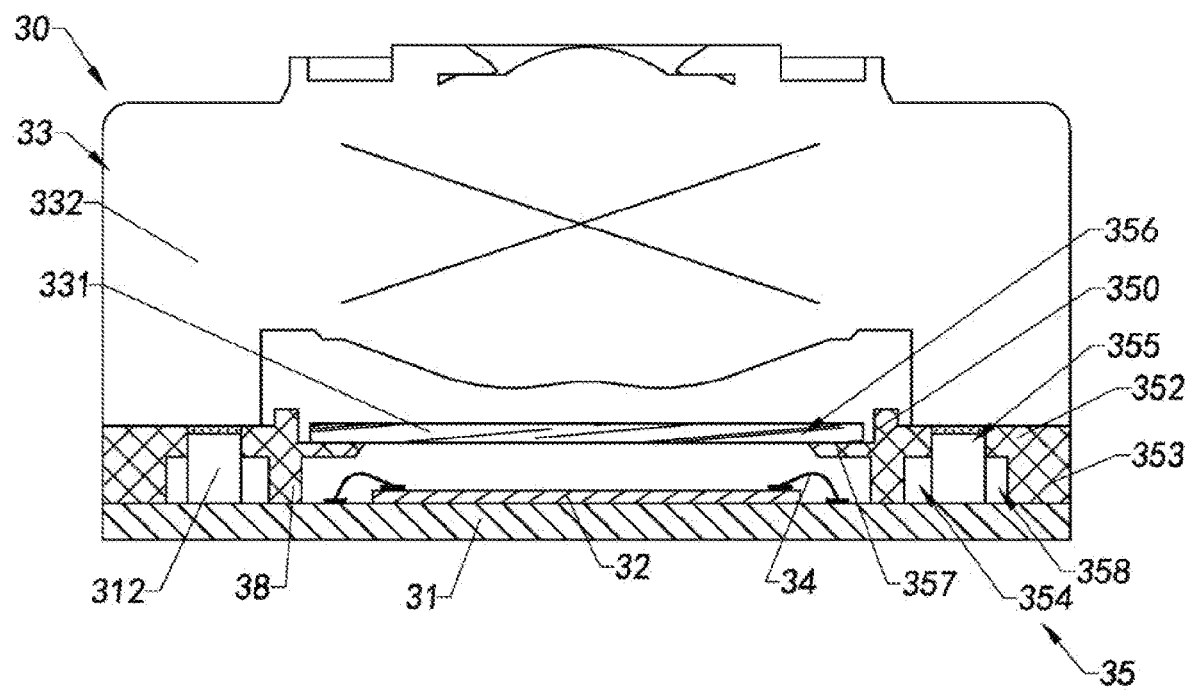
FIG. 28 is yet another specific example of a camera module according to an embodiment of the present application.

FIG. 28 is yet another specific example of the camera module 30 according to an embodiment of the present application. As shown in FIG. 28, in the specific example, the camera module 30 includes an optical lens 332, a base 35, a color filtering element 331, a photosensitive chip 32, and a circuit board 31, wherein the photosensitive chip 32 can be conductively provided on the circuit board 31, the base 35 is provided on the circuit board 31, the lens and the color filtering element 331 are in sequence provided on a photosensitive path of the photosensitive chip 32, and the base 35 is used to support the color filtering element 331. Thus, imaging light passing through the display screen 20 first reaches the optical lens 332, then is filtered by the color filtering element 331, and reaches the photosensitive chip 32 to be sensed by the photosensitive chip 32 to perform an imaging reaction.

Further, the camera module 30 further includes a group of leads 34, wherein after the photosensitive chip 32 is attached to the circuit board, electrical connection between the photosensitive chip 32 and the circuit board 31 is realized through the leads 34. Specifically, each lead 34 is bent and extended between the photosensitive chip 32 and the circuit board 31 to connect the photosensitive chip 32 to the circuit board 31 through the lead 34. Thus, the circuit board 31 can supply power to the photosensitive chip 32 via the leads 34, and the photosensitive chip 32 can transmit collected signals via the leads 34.

It is worthwhile to note that in the specific example, the type of the lead 34 is not limited in the present application, for example, the lead 34 may be a gold wire, a silver wire or a copper wire. Moreover, the leads 34 can be mounted between the circuit board 31 and the photosensitive chip 32 by a "wire bonding" process to realize the electrical connection therebetween.

Specifically, the "wire bonding" process is generally divided into two types: a "forward wire bonding" process and a "reverse wire bonding" process. The "forward wire bonding" process refers to that in the process of laying the leads 34, one end of the lead 34 is first formed at a conductive end of the circuit board 31, then the lead 34 is bent and extended, and finally the other end of the lead 34 is formed at a conductive end of the photosensitive chip 32. By this way, the leads 34 are formed between the photosensitive chip 32 and the circuit board 31. The "reverse wire bonding" process refers to that in the process of laying the leads 34, one end of the lead 34 is formed at the conductive end of the photosensitive chip 32, then the lead 34 is bent and extended, and finally the other end of the lead 34 is formed at the conductive end of the circuit board 31. By this way, the leads 34 are formed between the photosensitive chip 32 and the circuit board 31. It is worthwhile to note that a height of an upward protrusion of the lead 34 formed by the "reverse wire bonding" process is lower than that of an upward protrusion of the lead 34 formed by the "forward wire bonding" process. Therefore, preferably, in the specific implementation, the leads 34 are formed by the "reverse wire bonding" process.

The circuit board 31 is further provided with a group of electrical elements 312, wherein the electrical elements 312 can be attached to a marginal area (relative to a position for attaching the photosensitive chip 32) of the circuit board 31 at intervals by an SMT (Surface Mount Technology) process. The electrical elements 312 include but are not limited to resistors, capacitors, inductor, etc. It is worthwhile to note that the photosensitive chip 32 and each electrical element 312 can be located at the same side or different sides of the circuit board 31 respectively. For example, the photosensitive chip 32 and each electrical element 312 can be located at the same side of the circuit board 31 respectively, and the electrical elements 312 are attached to the marginal area of the circuit board 31 at intervals.

Particularly, as shown in FIG. 28, in the specific example, the base 35 is supported on a top surface of the circuit board 31. Moreover, the base 35 includes a main body 352 and side walls 353 extending downward along the main body 352, wherein an accommodating cavity 354 is defined by the main body 352 and the side walls 353. When the base 35 is provided on the circuit board 31, the side walls 353 are supported on the circuit board 31, and the accommodating cavity 354 is defined by a bottom surface of the base 35, an upper surface of the circuit board 31 and the side walls 353 together, wherein the electrical elements 312 provided on the circuit board 31 are accommodated in the accommodating cavity 354. Preferably, a height size of the accommodating cavity 354 is less than 0.2 mm, such as 0.1 mm.

Further, as shown in FIG. 28, in the specific example, the base 35 is further provided with at least one accommodating hole 355, wherein the accommodating hole 355 penetrates through the base 35 to communicate the accommodating cavity 354 with the external environment. It is worthwhile to note that in the specific embodiment, the height size of the accommodating cavity 354 is smaller than that of a relatively high electrical element 312, for example, a capacitor. Therefore, when the base 35 is provided on the circuit board 31, because a height from a bottom surface of the main body 352 of the base 35 to a top surface of the circuit board 31 is lower than that of the relatively high electrical element 312 such as a capacitor, if the accommodating hole 355 is not provided, the above electrical element 312 can be accommodated. That is, the accommodating hole 355 is used to avoid the high electrical element 312, so that in the case where a height of the base 35 is reduced, the electrical element 312 can still be accommodated in the base 35. In other words, by providing the accommodating hole 355 on the base 35, an overall design height of the base 35 can be reduced, thereby reducing the overall height size of the camera module 30.

By way of example but not limitation, a height of the capacitor in the electrical element 312 is 0.38 mm, the height of the accommodating cavity 354 is 0.1 mm, and a thickness of the main body 352 of the base 35 is set to be 0.4 mm, that is, the height of the accommodating hole 355 is 0.4 mm. Thus, when the base 35 is provided on the circuit board 31, the capacitor in the electrical elements 312 cannot be completely accommodated in the accommodating cavity 354, accordingly, an upper end of the capacitor in the electrical elements 312 extends into the accommodating hole 355 and is accommodated in the accommodating hole 355. It should be understood that in the embodiment of the present application, the accommodating hole 355 should be configured to match the electrical element 312 of the circuit board 31, a size of the accommodating hole 355 is determined by a horizontal size of the electrical element 312, that is, the electrical element 312 should be ensured to be accommodated in the accommodating hole 355.

Further, as shown in FIG. 28, in the specific example, the base 35 is further provided with a light transmitting hole 356, wherein the light transmitting hole 356 is formed on the main body 352 of the base 35 and corresponds to the photosensitive chip 32, and the light transmitting hole 356 is used to place the color filtering element 331. Accordingly, the main body 352 of the base 35 is further provided with an overhanging arm 357, wherein the overhanging arm 357 integrally extends on the main body 352 and defines a size of the light transmitting hole 356, the color filtering element 331 is placed on the overhanging arm 357 and filters light received by the module. It should be specially noted that in the specific example, when the base 35 is provided on the circuit board 31, then the color filtering element 331 is placed on the overhanging arm 357 of the main body 352, and an upper end of at least one electrical element 312 is accommodated in the accommodating hole 355, it can be observed that top surfaces of part of the electrical elements 312 are higher than a bottom surface of the color filtering element 331.

It is worthwhile to note that in the specific example, the color filtering element 331 can be implemented into different types, which include but are not limited to, an infrared ray cut-off filter, a full-transmittance spectral filter, other filters, and a combination of multiple filters. Specifically, for example, when the color filtering element 331 is implemented as a combination of an infrared ray cut-off filter and a full-transmittance spectral filter, that is, the infrared ray cut-off filter and the full-transmittance spectral filter can be switched to be selectively located on the photosensitive path of the photosensitive chip 32, and by this way, when the camera module 30 is used in an environment with sufficient amount of light such as daytime, the infrared ray cut-off filter can be switched to the photosensitive path of the photosensitive chip 32 to filter infrared rays in light which is reflected by an object and enters the camera module 30 through the infrared ray cut-off filter. Moreover, when the camera module 30 is used in an environment with dark light such as night, the full-transmittance spectral filter can be switched to the photosensitive path of the photosensitive chip 32 to allow infrared rays in light which is reflected by an object and enters the camera module 30 to be transmitted.

Certainly, the color filtering element 331 can also be provided at another position on the photosensitive path of the photosensitive chip 32, for example, the color filtering element 331 is provided at a bottom side of the optical lens 332, or a bottom part of the optical lens 332, which is not limited in the present application.

Particularly, as shown in FIG. 28, in the specific example, the base 35 can be implemented as a plastic support, which is pre-prepared and then attached to a top surface of the circuit board 31, or, the base 35 can be implemented as a molded base, which can be integrally formed and attached to the top surface of the circuit board 31 by an injection molding process. However, due to the limitation of the forming process of the base 35, the accommodating hole 355 is set to be a through hole, that is, the accommodating hole 355 communicates the accommodating cavity 354 with the external environment. It should be conceivable that when the camera module 30 is assembled, dirt can easily enter via the accommodating hole 355, causing stains on the photosensitive chip 32.

Therefore, as shown in FIG. 28, in the specific example, the camera module 30 further includes a protective piece 38, wherein the protective piece 38 integrally extends downward from the main body 352, when the base 35 is provided on the circuit board 31, the protective piece 38 surrounds a periphery of the photosensitive chip 32, and the protective piece 38, the main body 352 of the base 35 and the color filtering element 331 provided on the main body 352 form a sealed space to prevent dirt from entering the photosensitive chip 32.

Figure 29:
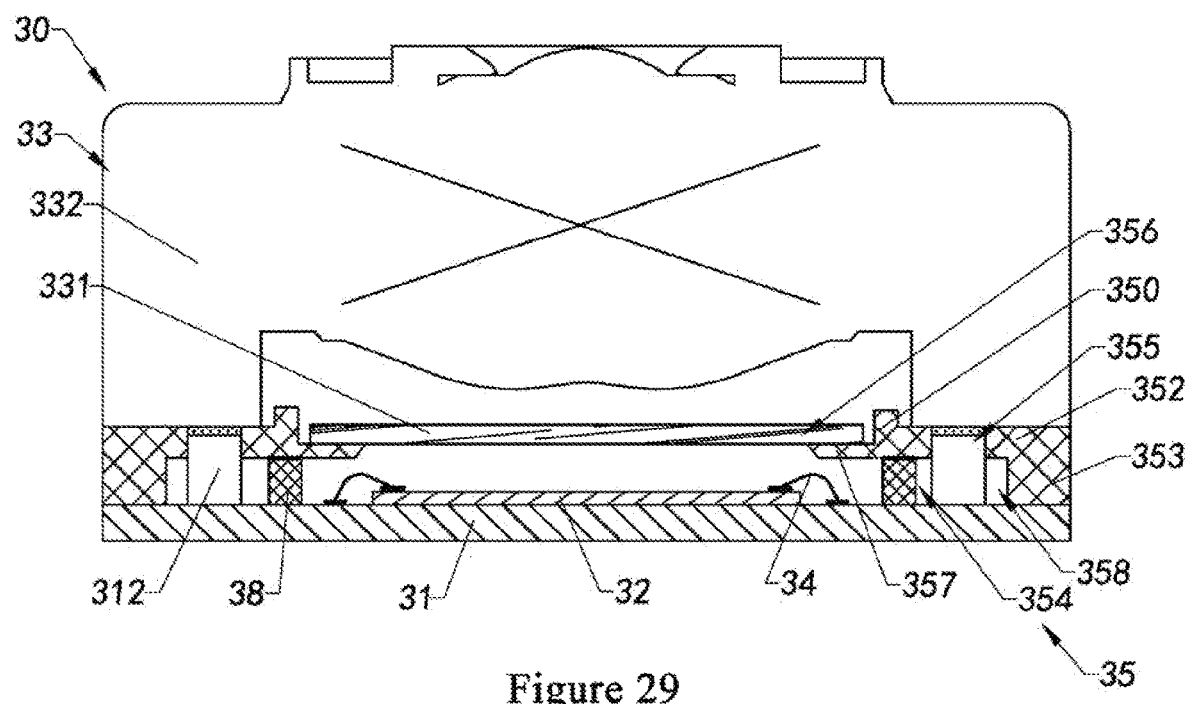
FIG. 29 is yet another specific example of a camera module according to an embodiment of the present application.

In a specific implementation, the protective piece 38 can be implemented as a part of the main body 352 of the base 35, and integrally extends downward from the main body 352, wherein when the base 35 is provided on the circuit board 31, the protective piece 38 surrounds the periphery of the photosensitive chip 32, and the protective piece 38, the main body 352 of the base 35 and the color filtering element 331 provided on the main body 352 form the sealed space to prevent dirt from entering the photosensitive chip 32. Or, the protective piece 38 and the base 35 are provided separately, as shown in FIG. 29, for example, the protective piece 38 is attached to the base 35 by a process such as an adhering process, thereby reducing the forming difficulty of the base 35.

Preferably, an upper end of the accommodating hole 355 is further sealed by a film or glue filling, to protect the electrical elements 312 from being damaged on the one hand, and to further enhance the sealing effect to prevent dirt from entering the photosensitive chip 32 on the other hand.

Figure 30:
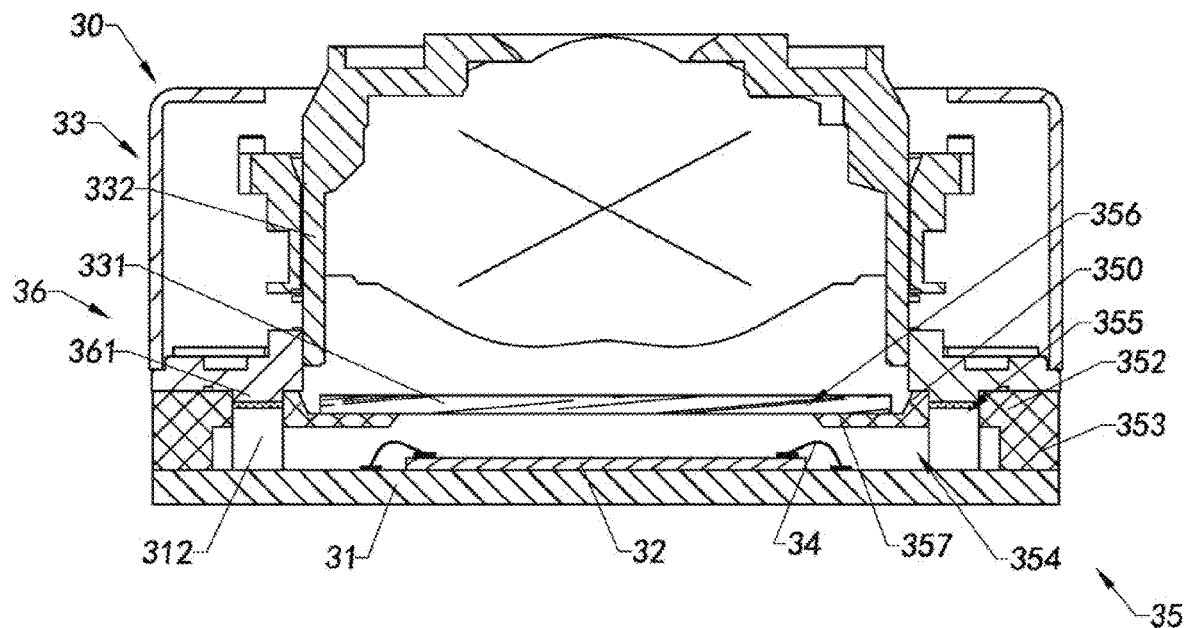
FIG. 30 is yet another specific example of a camera module according to an embodiment of the present application.

It is worthwhile to note that in the specific example, the camera module 30 can be implemented as a fixed focus module or a dynamic focus module, wherein when the camera module 30 is a dynamic focus module, the camera module 30 further includes a driver 36 (for example, but is not limited to, a motor) electrically connected to the circuit board 31, and the driver 36 is used to controllably drive the lens to move to realize auto-focus (Auto-Focus), as shown in FIG. 30.

Particularly, as shown in FIG. 30, the driver 36 includes at least one positioning pillar 361, wherein the positioning pillar extends on a lower end of the driver 36. Moreover, a position where the at least one positioning pillar 361 is formed of the driver 36 corresponds to at least one accommodating hole 355, so that when the driver 36 is mounted on the base 35, the positioning pillar is clamped in the accommodating hole 355 in a plug-pin manner. Thus, the mounting accuracy of the driving piece can be improved by cooperation of the positioning pillar 361 and the accommodating hole 355, and meanwhile, the reliability of the driver 36 can also be improved by the cooperation of the positioning pillar and the accommodating hole 355.

Figure 31:
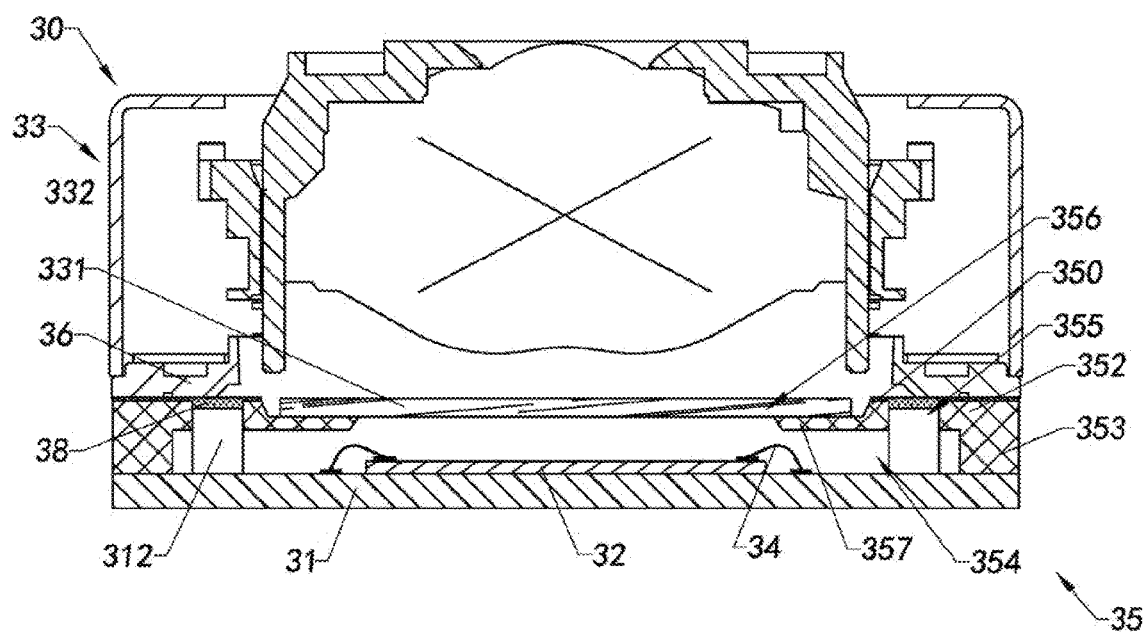
FIG. 31 is yet another specific example of a camera module according to an embodiment of the present application.

FIG. 31 is yet another specific example of the camera module 30 according to an embodiment of the present application, wherein the camera module 30 in FIG. 31 is a variant implementation mode of the camera module 30 in FIG. 28.

Specifically, as shown in FIG. 31, in the specific example, the protective piece 38 is implemented as a protective film, the protective film is attached to an upper end (a top surface of the main body 352) of the accommodating hole 355, so that when the base 35 is provided on the circuit board 31, the accommodating hole 355 and the accommodating cavity 354 are sealed by the protective film, thereby preventing dirt from entering the photosensitive chip 32. Moreover, the protective film can also protect the electrical elements 312. For example, the protective film can be implemented as an attached film, or the protective film is formed on the upper end of the accommodating hole 355 by a process such as a glue filling process, so as to seal the accommodating hole 355.

Figure 32:
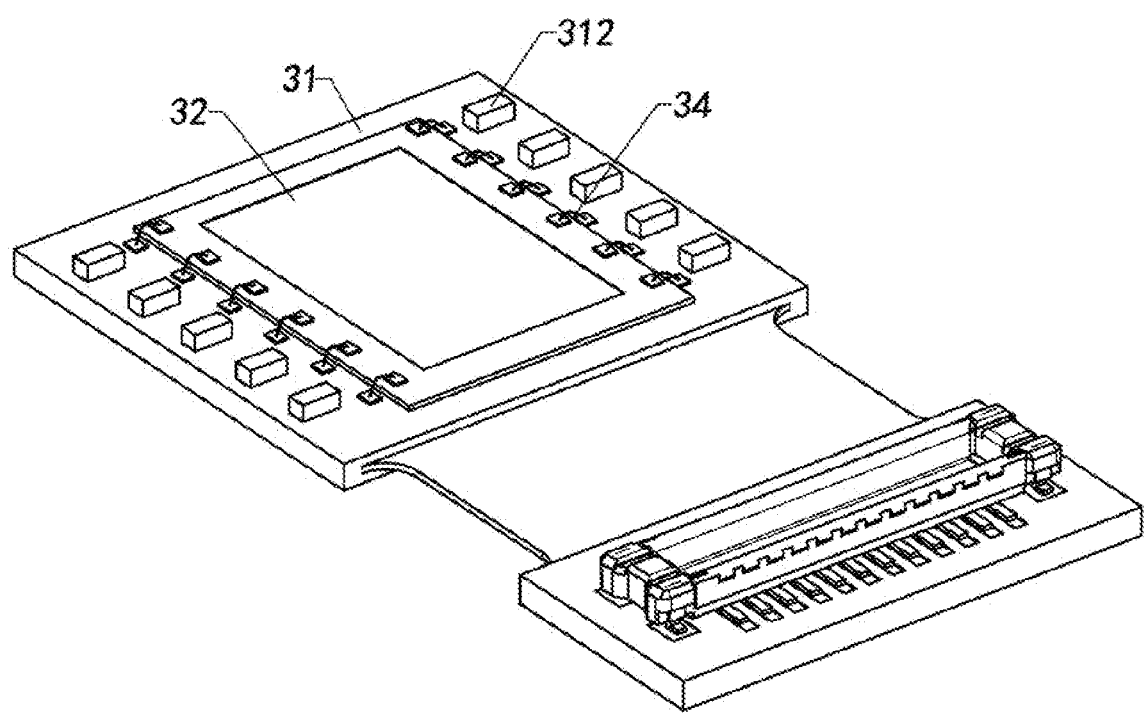
FIG. 32 is yet another specific example of a camera module according to an embodiment of the present application.

FIG. 32 is yet another specific example of the camera module 30 according to an embodiment of the present application, wherein the camera module 30 in FIG. 32 is a variant implementation mode of the camera module 30 in FIG. 28.

Specifically, as shown in FIG. 32, in the specific example, the electrical elements 312 provided on the circuit board 31 are provided on two sides of the circuit board 31, that is, the photosensitive chip 32 is provided on the circuit board 31, and the electrical elements 312 are located on two sides of the photosensitive chip 32. Those skilled in the art should know that in the existing camera module, most of the electrical elements 312 on the circuit 31 are arranged at a periphery (or four sides) of the circuit boards 31.

Further, as shown in FIG. 32, in the specific example, the protective piece 38 is integrally formed on the main body 352 and extends downward from the main body 352. Preferably, the protective piece 38 extends downward from the main body 352 parallel to the side walls 353 to form a receiving cavity 358 between the side walls 353 and the protective piece 38. Moreover, the accommodating hole 355 is formed between the side walls 353 and the protective piece 38 and communicated with the receiving cavity 358.

Particularly, as shown in FIG. 32, in the specific example, the electrical elements 312 are laid at the circuit board 31, such that when the base 35 is attached to the top surface of the circuit board 31, the electrical elements 312 are received in the receiving cavity 358. Moreover, part of the electrical elements 312 which are higher than the receiving cavity 358 can be accommodated in the accommodating hole 355.

It should be understood that in the specific example, positions of the side walls 353 and the protective piece 38 should be determined according to the layout of the electrical elements 312 on the circuit board 31. For example, when the electrical elements 312 are distributed on two sides of the circuit board 31 in an array, the protective piece 38 extends downward from the main body 352 parallel to the side walls 353, and is formed between the electrical elements 312 and the photosensitive chip 32 so as to isolate the photosensitive chip 32 and prevent dirt from entering the photosensitive chip 32 via the accommodating hole 355.

It is worthwhile to point out that in the specific example, the protective pieces 38 only need to be respectively formed between the photosensitive chip 32 and the electrical elements 312 to isolate the photosensitive chip 32, that is, the protective pieces 38 do not need to be provided at the periphery of the photosensitive chip 32, and only need to be formed on two sides of the photosensitive chip 32. In other words, in the specific example, the camera module 30 has an extreme narrow side, wherein the extreme narrow side is formed on a side, without the electrical component 312, of the circuit board 31, and positions for mounting the photosensitive chip 32 and the optical lens 332 are close to edges of the circuit board 31. Particularly, the extreme narrow side may allow the camera module 30 to be provided on an edge of a smart phone.

Figure 33:
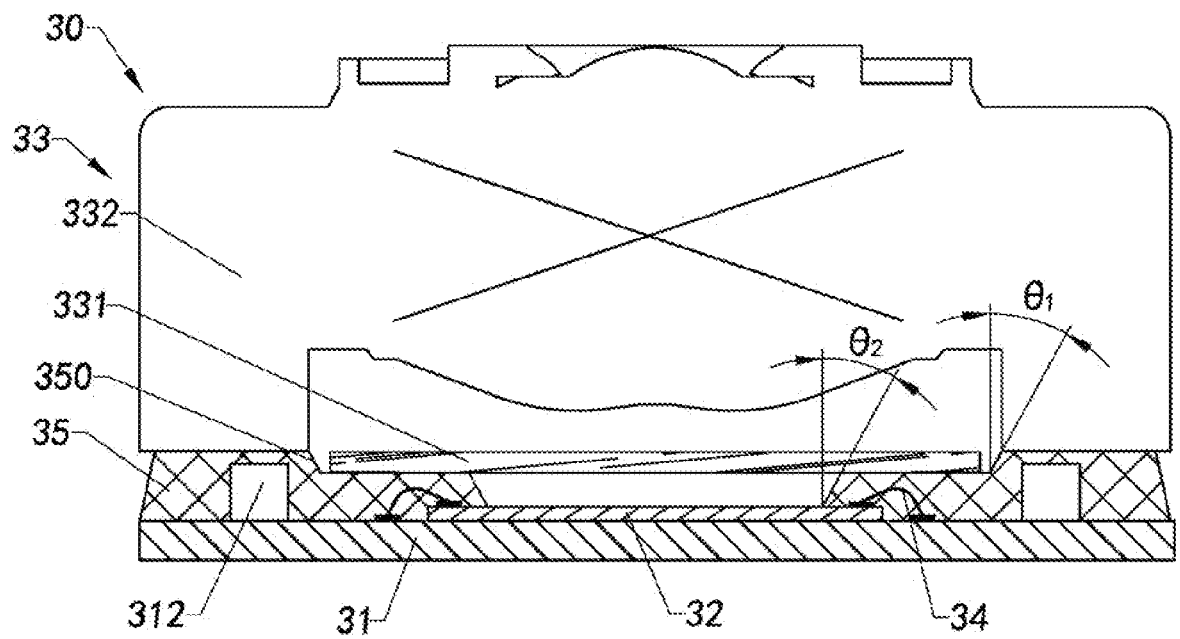
FIG. 33 is yet another specific example of a camera module according to an embodiment of the present application.

FIG. 33 is yet another specific example of the camera module 30 according to an embodiment of the present application. As shown in FIG. 33, in the specific example, the camera module 30 includes an optical lens 332, a base 35, a color filtering element 331, a photosensitive chip 32, and a circuit board 31, wherein the photosensitive chip 32 can be conductively provided on the circuit board 31, the base 35 is integrally formed on the circuit board 31 by a molding process, the optical lens 332 and the color filtering element 331 are in sequence provided on a photosensitive path of the photosensitive chip 32, and the base 35 is used to support the color filtering element 331. Thus, imaging light passing through the display screen 20 first reaches the optical lens 332, then is filtered by the color filtering element 331, and reaches the photosensitive chip 32 to be sensed by the photosensitive chip 32 to perform an imaging reaction.

Figure 34:
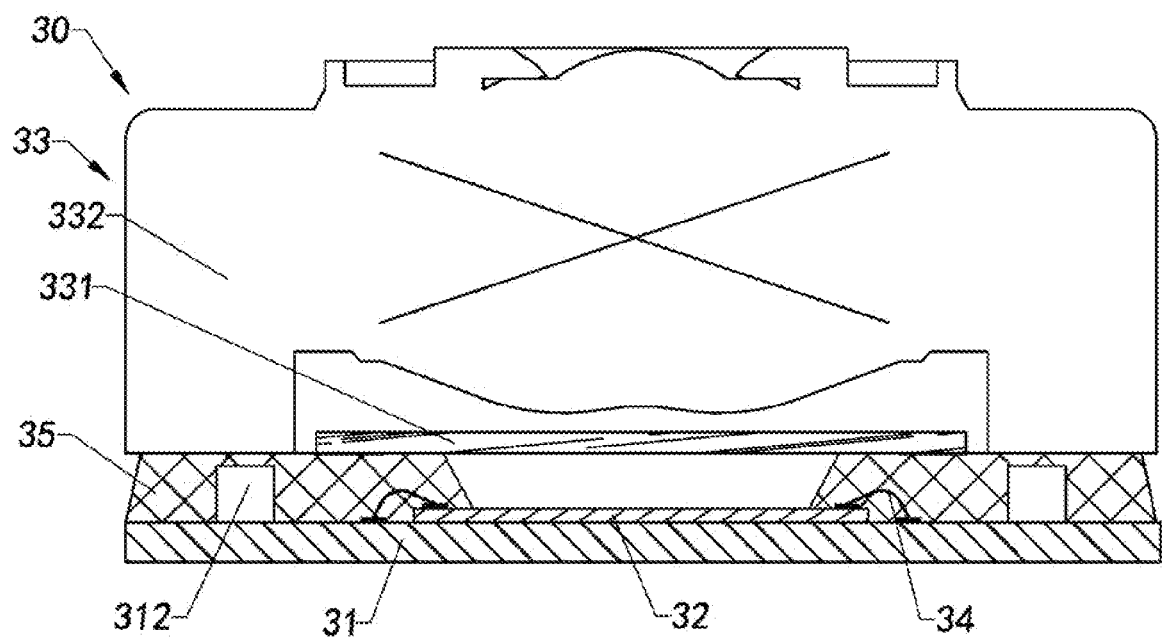
FIG. 34 is a schematic diagram of an existing molding process-based camera module.

Particularly, the specific example is an optimized solution of the existing molding process-based camera module. Those skilled in the art should know that in the existing molding process-based camera module, generally a photosensitive chip and electrical elements are first attached to a circuit board, then a molded base is formed on the circuit board by a molding process, a filter is attached to a back side of the lens base, and a lens is attached to the filtering component to keep the lens on a photosensitive path of the chip, as shown in FIG. 34. The assembly method in the prior art greatly limits the height of the camera module.

In detail, although the horizontal size and height of the camera module can be reduced by replacing a conventional lens base with the molded base, a mold used in the molding process needs to avoid the electrical elements (especially the capacitor with a large size, at present, a height of the smallest capacitor is 0.38 mm) such as capacitors and resistors on the circuit board, a certain safe distance further needs to be reversed between the mold and each electrical element, and therefore, a height of the molded base needs to be at least greater than 0.4 mm. On the other hand, usually the filter and a supporting piece are combined to form a filtering component, and then the filtering component is attached to the molded base, because the supporting piece is usually formed by an injection molding process, which requires a thickness of a part for supporting the filter of the supporting piece to be basically greater than 0.15 mm, and a thickness of the filter itself is usually greater than 0.21 mm, and therefore, a thickness of the filtering component needs to be at least greater than 0.36 mm.

That is, a distance between the lens and the circuit board 31 is equal to the sum of the height of the molded base and the thickness of the filtering component (greater than 0.76 mm), and due to the limitations of the above factors, the distance between the lens and the circuit board 31 in the existing camera module cannot further be reduced, that is, the height of the existing camera module cannot be further reduced, thereby failing to meet the market demand for thinness and miniaturization of camera modules.

Accordingly, as shown in FIG. 33, in the specific example, the molded base is provided with a recessed step part used to mount the color filtering element 331. That is, compared with the existing molding process-based camera module, in the specific example, a top surface of the molded base is a non-flat surface which is provided with a recessed step part. Accordingly, by mounting the color filtering element 331 on the recessed step part of the molded base, a supporting piece of the color filtering element can be omitted, and a distance between the color filtering element 331 and the circuit 31 can be reduced, thereby reducing the height of the module.

Specifically, as shown in FIG. 33, in the specific example, the molded base is provided with a stepped peripheral groove 350, wherein the color filtering element 331 of the light transmitting component 33 is provided in the stepped peripheral groove 350 of the molded base. By this way, the distance between the optical lens 332 and the circuit board 31 is no longer limited by the thickness of the color filtering element 331 itself, that is, the distance between the optical lens 332 and the circuit board 31 can be reduced to be smaller than the sum of the thickness of the color filtering element 331 and the height of the molded base, thereby reducing the overall height size of the camera module 30.

Figure 35:
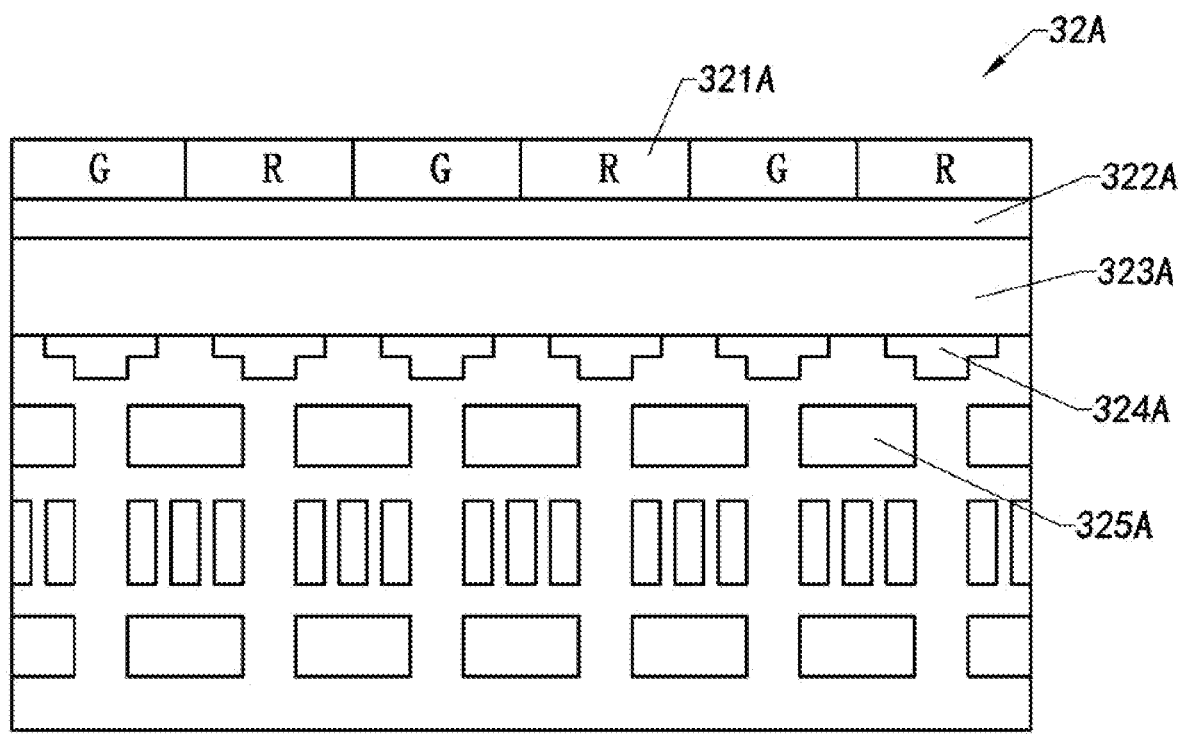
FIG. 35 is a specific example of a photosensitive chip of the camera module.

FIG. 35 is yet another specific implementation mode of the camera module 30 according to an embodiment of the present application. As shown in FIG. 35, in the specific example, the camera module 30 is optimized from the perspective of the structure of the photosensitive chip itself, so as to reduce the overall height size of the camera module 30. In other words, in the specific implementation mode, the camera module 30 can be implemented as the camera module and the variant implementation mode thereof in any one of FIG. 21 to FIG. 33.

Specifically, in the specific example, in the camera module 30, a photosensitive chip 32A with a quantum dot thin film 323A is used to replace the conventional CMOS/CCD photosensitive chip. Compared with the conventional CMOS/CCD photosensitive chip, the photosensitive chip 32A with the quantum dot thin film 323A has advantages in terms of plan view size and height size. First, with adoption of the photosensitive chip 32A with the quantum dot thin film 323A, a size in a Z axial direction of the photosensitive chip can be reduced. As shown in FIG. 35, the photosensitive chip 32A with the quantum dot thin film 323A includes a color filter 321A, a top electrode 322A, the quantum dot thin film 323A, a bottom electrode 324A, and a pixel circuit 325A from top to bottom, wherein the top electrode 322A, the quantum dot thin film 323A, the bottom electrode 324A constitute a photosensitive layer of the photosensitive chip 32A with the quantum dot thin film 323A, the quantum dot thin film 323A is electrically connected to the two electrodes, a current and/or a voltage between the two electrodes is related to an intensity of light received by the quantum dot thin film 323A, and the pixel circuit 325A includes a charge storage and reading circuit. Particularly, the color filter can be implemented as a Bayer filter or Mono filter, which is not limited in the present application.

During operation, light passing through the color filter 321A is irradiated on the photosensitive layer, the photosensitive layer generates a charge between the top electrode and the bottom electrode at a given bias voltage, so that the voltage is accumulated in the charge storage in an integration period, the pixel circuit 325A reads an electrical signal and transmits the same to the chip, wherein the electrical signal is a signal reflecting an intensity of light absorbed by the photosensitive layer in the integration period, the electrical signal is an light intensity generated by the light passing through the color filter 321A, and therefore, the electrical signal can correspond to the light passing through the color filter 321A, that is, if the color filter 321A is red, which indicates that only red light can be transmitted, an electrical signal generated by the corresponding photosensitive layer below the color filter 321A represents an intensity of red light in light at the position.

Compared with the existing CMOS or CCD chip, the photosensitive chip 32A with the quantum dot thin film 323A has a relatively small thickness size.

Figure 36:
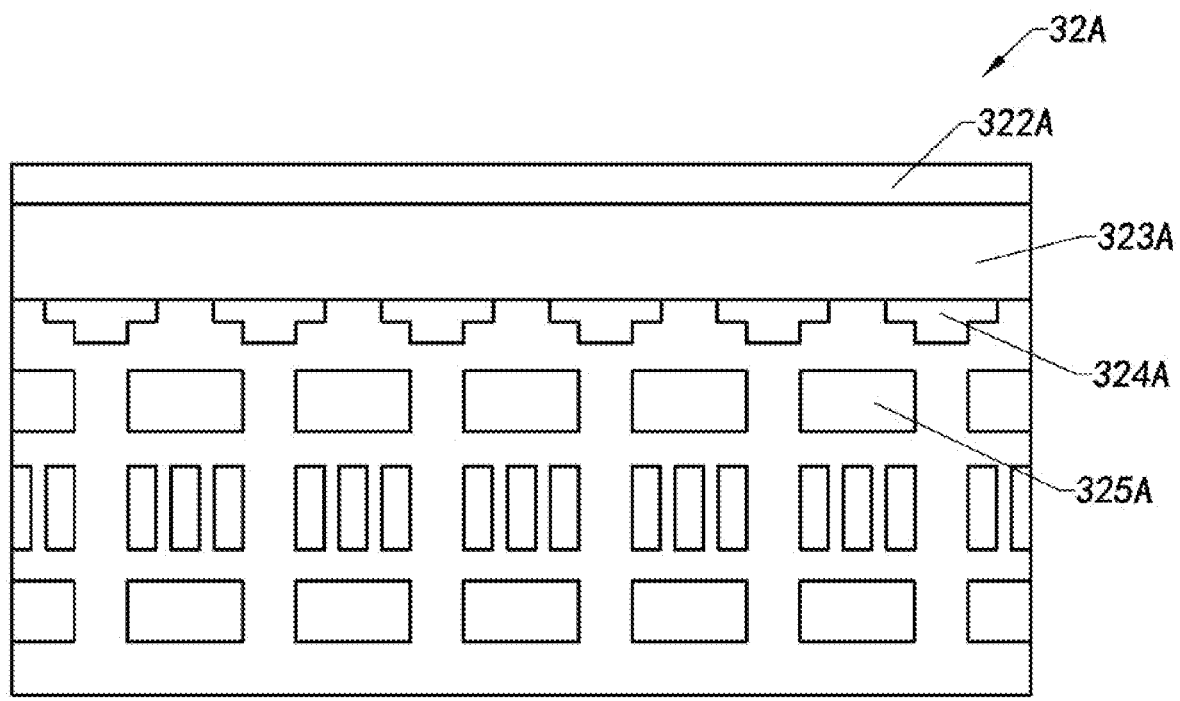
FIG. 36 is another specific example of the photosensitive chip of the camera module.

FIG. 36 is yet another specific example of the photosensitive chip of the camera module 30 according to an embodiment of the present application, wherein the photosensitive chip in FIG. 36 is a variant implementation mode of the photosensitive chip in FIG. 35.

Specifically, as shown in FIG. 36, in the specific example, the quantum dot thin film 323A of the photosensitive layer is configured to correspond to light of a selected color or group of colors, for example, a color sensitive pixel can be formed by combining a photoconductive material and a wavelength selective absorption material (such as a material for forming the color filter 321A array) to realize the color sensitivity. Accordingly, the quantum dot thin film 323A can be configured to be sensitive to three colors of red (R), green (G), and blue (B), respectively. Thus, the color filter 321A in the photosensitive chip can be directly omitted.

During operation, when the light passes through the color sensitive pixel, the sensitive pixel will absorb corresponding light, and an intensity of the light of the wavelength or wave band is converted into an electric signal which is transmitted to the chip by the pixel circuit 325A for imaging, and the rest of light continues to be transmitted forward and does not affect the photoelectric conversion of the pixel point. Accordingly, with the technical solution, not only the size in the Z direction of the photosensitive chip can be reduced, but also the photosensitive chip can receive larger amount of light without light filtering of the color filter 321A, and thus, the imaging of the photosensitive chip is clearer.

Further, with adoption of the photosensitive chip 32A with the quantum dot thin film 323A, sizes in X and Y axial directions of the photosensitive chip can be reduced. Specifically, due to the high light transmittance of the quantum dot thin film 323A, after being configured as a material which is sensitive to light of a certain wavelength or wave band, the quantum dot thin film 323A can only absorb corresponding light, and other light will pass through the thin film and continues to be transmitted forward. Therefore, a plurality of quantum dot thin films 323A sensitive to light of a certain wavelength or wave band can be arranged vertically.

In other words, the intensity information of light of multiple wavelengths or wave bands can be obtained at the same time at a pixel point position. For example, three kinds of quantum dot thin films 323 of a red sensitive pixel, a green sensitive pixel, and a blue sensitive pixel are arranged vertically, when light passes through the red sensitive pixel, red light is absorbed and converted into an electrical signal, the rest of light continues to be transmitted forward, when the light passes through the green sensitive pixel, green light is absorbed and converted into an electrical signal, the rest of light continues to be transmitted forward, when the light passes through the blue sensitive pixel, blue light is absorbed and converted into an electrical signal. Therefore, the intensity information of light of multiple wavelengths or wave bands can be obtained at the same time at a pixel-sized point.

It worthwhile to note that the RGB color described in the specific example of the present application is not limitative, each quantum dot thin film 323A can absorb and covert any light as required, and the quantum dot thin film 323A only needs to be configured to be sensitive to light as required.

Moreover, in the specific example, because the conventional color filter 321A is not used, not only a higher light intensity can be obtained, but also a higher resolution can be obtained for the photosensitive chip of the same specification. In other words, at the same resolution, by the method of the present solution, the sizes in the X and Y directions of the photosensitive chip can be reduced, thereby further reducing the plan view size of the camera module 30.

Moreover, the quantum dot thin film 323A in the chip with the quantum dot thin film 323A of the present application can be prepared by the following process.

In a forming manner, a quantum dot material is processed by molten pool casting to form the quantum dot thin film 323A. The molten pool casting may include steps of depositing the measured quantum dot material on a substrate and allowing a solution to evaporate, wherein the formed film may be or may not be cracked.

In a forming manner, a quantum dot material is processed by electro-deposition to form the quantum dot thin film 323A.

In a forming manner, a quantum dot material is processed by vapor deposition to form the quantum dot thin film 323A.

In a forming manner, a quantum dot material is processed by spraying of a spray gun to form the quantum dot thin film 323A. The spraying of the spray gun may include a processing from gap. The spraying of the spray gun may include an entrainment in a solvent.

In a forming manner, a quantum dot material is processed by growth from a solution to form the quantum dot thin film 323A. The growth of the film from the solution may include cross-linking. A cross-linking agent can be attached to at least part of a substrate to cross-link quantum dots. When the substrate attached with the cross-linking agent is immersed in a quantum dot solution, quantum dots can become cross-linked and grow at a position where the cross-linking agent is attached of the substrate, and the growth process can be similar to the growth process of a seed crystal. Because the growth occurs at the position where the cross-linking agent is attached, the forming of a patterned film on the substrate can be realized by depositing a cross-linking agent along a patterned substrate.

In a forming manner, a quantum dot material is processed by a draining system to form the film. The draining system can enable a single layer of quantum dot thin film 323A capable of depositing quantum dots to be deposited in a pattern.

In a forming manner, a quantum dot material is processed by accelerating or evaporating in a gas phase to form the quantum dot thin film 323A.

In a forming manner, a quantum dot material is processed by a screen-printing method to form the quantum dot thin film 323A.

In a forming manner, a quantum dot material is processed by an ink-jet printing method to form the quantum dot thin film 323A.

In conclusion, the camera module 30 provided below the display screen can adopt but is not limited to the above technical solutions and variant implementation modes thereof, so that the height size of the camera module 30 can be reduced, thereby meeting the requirements of thin smart phones.

Those skilled in the art should understand that the above description and the embodiments of the present invention shown in the drawings are only examples and are not intended to limit the present invention. The objectives of the present invention are completely and effectively realized. The functions and structural principles of the present invention are shown and described in the embodiments, and any variation or modification may be made to the implementation modes of the present invention without departing from the principles described.

What is claimed is:

1. A display screen, characterized by comprising: a cover plate layer (21), a touch layer (22), a polarizing layer (23), an encapsulation layer (24), a pixel layer (25), and a circuit driving layer (26) from top to bottom,
wherein the circuit driving layer (26) is formed on a bottom side of the pixel layer (25), and is electrically connected to the pixel layer (25) to drive the pixel layer (25) to operate;
the encapsulation layer (24) is formed on a top side of the pixel layer (25) to encapsulate the pixel layer (25);
the pixel layer (25) includes a non-light transmitting area defined by pixels and a light transmitting area defined by gaps between the pixels, and the pixels, which have a low light resistance rate, are distributed in an array, and the gaps, which have a high light resistance rate and are filled with a completely different material than the material of the pixels, are reserved in spaces between various pixels to allow light passing through the cover plate layer (21), the touch layer (22), the polarizing layer (23) and the encapsulation layer (24) in sequence to pass through the pixel layer (25) via the gaps; and
the display screen further includes a microlens layer provided above the pixel layer (25), the microlens layer corresponds to each gap between the pixels in the pixel layer (25), and is used to converge light to each gap before the light passes through the pixel layer (25) via the gaps so as to increase the light transmittance of the display screen.

2. The display screen according to claim 1, wherein the microlens layer includes microlens units distributed in an array, and each microlens unit respectively corresponds to each gap.

3. The display screen according to claim 2, wherein the microlens units of the microlens layer are integrally formed in the gaps between the pixels in the pixel layer (25), and the encapsulation layer (24) is integrally formed on the microlens layer and the pixel layer (25) to encapsulate the pixel layer (25) and the microlens layer.

4. The display screen according to claim 3, wherein the microlens layer is integrally formed on a top surface of the encapsulation layer (24) in a protruded manner or a recessed manner.

5. The display screen according to claim 2, wherein a height size of the microlens unit is smaller than or equal to that of the encapsulation layer (24).

6. The display screen according to claim 2, wherein a horizontal size of the microlens unit is larger than a size of the gap.

7. The display screen according to claim 2, wherein a longitudinal size of the microlens unit is larger than or equal to a size of a gap between adjacent pixels.

8. The display screen according to claim 2, wherein a refractive index of a material for forming the microlens layer is higher than that of a material for forming the encapsulation layer (24).

9. The display screen according to claim 1, wherein the material for forming the encapsulation layer (24) is a light-transmissive rigid material or a light-transmissive flexible material.

10. The display screen according to claim 1, further including a back plate layer (27) having an opening hole, wherein the opening hole corresponds to the gaps between the pixels in the pixel layer (25).

11. The display screen according to claim 2, wherein the microlens unit includes a film structure, and light is converged after passing through the film structure.

12. The display screen according to claim 11, wherein the film structure is formed on a recessed bottom surface of the encapsulation layer (24).

13. The display screen according to claim 11, wherein the film structure is formed on a recessed bottom surface of the polarizing layer (23).

14. A preparation method of a display screen, characterized by comprising:
forming a microlens layer on a pixel layer (25) of the display screen, wherein microlens units of the microlens layer correspond to gaps between various pixels in the pixel layer (25), wherein a circuit driving layer (26) is provided on a bottom side of the pixel layer (25), and the circuit driving layer (26) is electrically connected to the pixel layer (25) to drive the pixel layer (25) to operate; and
forming an encapsulation layer (24) on the microlens layer and the pixel layer (25) to encapsulate the microlens layer and the pixel layer (25) through the encapsulation layer (24), wherein the encapsulation layer (24) is further provided thereon with a polarizing layer (23), a touch layer (22) and a cover plate layer (21) in sequence,
wherein the pixel layer (25) includes a non-light transmitting area defined by the pixels and a light transmitting area defined by the gaps between the pixels, and the pixels, which have a low light resistance rate, are distributed in an array, and the gaps, which have a high light resistance rate and are filled with a completely different material than the material of the pixels, are reserved in spaces between various pixels to allow light passing through the cover plate layer (21), the touch layer (22), the polarizing layer (23) and the encapsulation layer (24) in sequence to pass through the pixel layer (25) via the gaps.

15. The preparation method of the display screen according to claim 14, wherein the microlens units of the microlens layer are integrally formed in the gaps between various pixels in the pixel layer (25).

16. The preparation method of the display screen according to claim 15, wherein the encapsulation layer (24) is integrally formed on the microlens layer and the pixel layer (25) by a deposition process.

17. The preparation method of the display screen according to claim 14, wherein a refractive index of a material for forming the microlens layer is higher than that of a material for forming the encapsulation layer (24).

18. A preparation method of a display screen, characterized by comprising:
integrally forming a microlens layer on an encapsulation layer (24);
providing the encapsulation layer (24) above a pixel layer (25), wherein microlens units of the microlens layer correspond to gaps between various pixels in the pixel layer (25), wherein a circuit driving layer (26) is provided on a bottom side of the pixel layer (25), and the circuit driving layer (26) is electrically connected to the pixel layer (25) to drive the pixel layer (25) to operate; and
providing a polarizing layer (23), a touch layer (22) and a cover plate layer (21) in sequence on the encapsulation layer (24),
wherein the pixel layer (25) includes a non-light transmitting area defined by the pixels and a light transmitting area defined by the gaps between the pixels, and the pixels, which have a low light resistance rate, are distributed in an array, and the gaps, which have a high light resistance rate and are filled with a completely different material than the material of the pixels, are reserved in spaces between various pixels to allow light passing through the cover plate layer (21), the touch layer (22), the polarizing layer (23) and the encapsulation layer (24) in sequence to pass through the pixel layer (25) via the gaps.

19. The preparation method of the display screen according to claim 18, wherein the microlens layer is integrally formed on a top surface of the encapsulation layer (24) in a protruded manner or a recessed manner.

20. The preparation method of the display screen according to claim 18, wherein a refractive index of a material for forming the microlens layer is higher than that of a material for forming the encapsulation layer (24).

* * * * *